United States Patent
Hodo et al.

(10) Patent No.: US 9,455,337 B2
(45) Date of Patent: Sep. 27, 2016

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Ryota Hodo, Kanagawa (JP); Motomu Kurata, Kanagawa (JP); Shinya Sasagawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/739,127

(22) Filed: Jun. 15, 2015

(65) Prior Publication Data

US 2015/0372122 A1 Dec. 24, 2015

(30) Foreign Application Priority Data

Jun. 18, 2014 (JP) ................. 2014-125329

(51) Int. Cl.
| | |
|---|---|
| *H01L 21/00* | (2006.01) |
| *H01L 29/66* | (2006.01) |
| *H01L 29/24* | (2006.01) |
| *H01L 29/786* | (2006.01) |
| *H01L 29/45* | (2006.01) |
| *H01L 29/49* | (2006.01) |
| *H01L 21/441* | (2006.01) |
| *H01L 21/4757* | (2006.01) |
| *H01L 21/033* | (2006.01) |
| *H01L 21/308* | (2006.01) |

(52) U.S. Cl.
CPC ....... *H01L 29/66969* (2013.01); *H01L 21/441* (2013.01); *H01L 21/47573* (2013.01); *H01L 29/24* (2013.01); *H01L 29/45* (2013.01); *H01L 29/4908* (2013.01); *H01L 29/7869* (2013.01); *H01L 21/0332* (2013.01); *H01L 21/3081* (2013.01)

(58) Field of Classification Search
None
See application file for complete search history.

(56) References Cited

U.S. PATENT DOCUMENTS

| 8,547,771 B2 | 10/2013 | Koyama | |
|---|---|---|---|
| 2010/0105213 A1* | 4/2010 | Ishikawa | ................ C23C 16/26 438/717 |
| 2013/0277852 A1* | 10/2013 | Chen | .................. H01L 21/6835 257/774 |
| 2014/0326992 A1 | 11/2014 | Hondo et al. | |
| 2014/0332800 A1 | 11/2014 | Hanaoka | |

(Continued)

FOREIGN PATENT DOCUMENTS

JP 2012-257187 12/2012

*Primary Examiner* — Angel Roman
(74) *Attorney, Agent, or Firm* — Fish & Richardson P.C.

(57) ABSTRACT

To provide a semiconductor device which occupies a small area and is highly integrated. A first conductive layer is formed; a first insulating layer is formed over the first conductive layer; a second conductive layer is formed over the first insulating layer using the same material as the first conductive layer; a third conductive layer is formed over the second conductive layer; a second insulating layer is formed over the third conductive layer; a resist mask is formed over the second insulating layer; etching is successively performed from the upper layer and an opening is formed in the first conductive layer and the diameter of the opening in the second conductive layer is increased in the same step; and a contact hole where an upper surface of the first conductive layer is exposed is formed by etching the first insulating layer.

27 Claims, 46 Drawing Sheets

(56) References Cited

U.S. PATENT DOCUMENTS

| | | |
|---|---|---|
| 2015/0187814 A1 | 7/2015 | Miyairi et al. |
| 2015/0187823 A1 | 7/2015 | Miyairi et al. |
| 2015/0270288 A1 | 9/2015 | Yamazaki et al. |
| 2015/0348909 A1 | 12/2015 | Yamazaki et al. |
| 2015/0348997 A1 | 12/2015 | Sasagawa et al. |
| 2015/0349127 A1 | 12/2015 | Kurata et al. |

\* cited by examiner

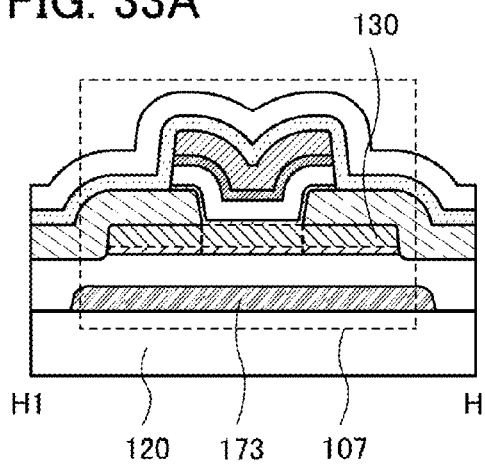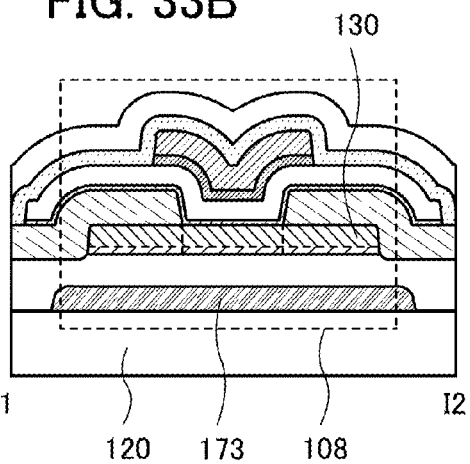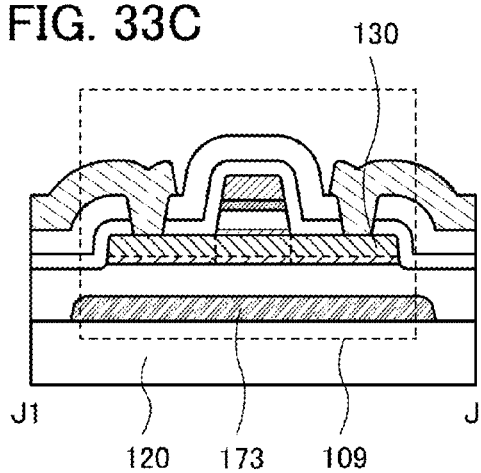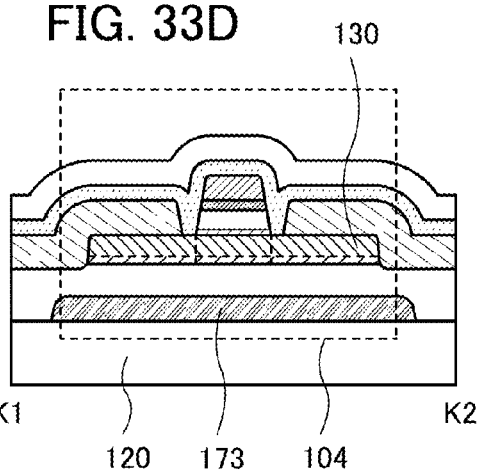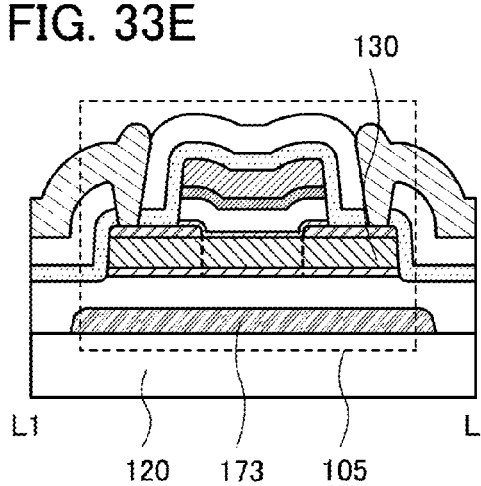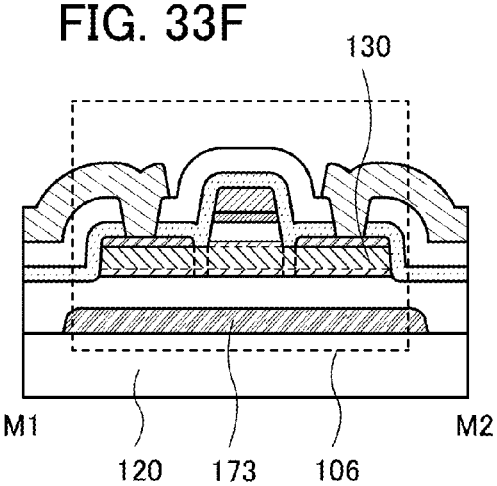

METHOD FOR MANUFACTURING SEMICONDUCTOR DEVICE

BACKGROUND OF THE INVENTION

1. Field of the Invention

One embodiment of the present invention relates to a method for manufacturing a semiconductor device.

Note that one embodiment of the present invention is not limited to the above technical field. The technical field of one embodiment of the present invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

A technique by which transistors are formed using semiconductor thin films formed over a substrate having an insulating surface has been attracting attention. The transistor is used in a wide range of electronic devices such as an integrated circuit (IC) or an image display device (also simply referred to as a display device). As semiconductor thin films that can be used for the transistors, silicon-based semiconductor materials have been widely known, but oxide semiconductors have been attracting attention as alternative materials.

It is known that a transistor including an oxide semiconductor has an extremely low leakage current in an off state. For example, a low-power-consumption CPU utilizing such a low leakage current of a transistor including an oxide semiconductor is disclosed in Patent Document 1.

REFERENCE

Patent Document

[Patent Document 1] Japanese Published Patent Application No. 2012-257187

SUMMARY OF THE INVENTION

An object of one embodiment of the present invention is to provide a semiconductor device that occupies a small area. Another object is to provide a highly integrated semiconductor device. Another object is to provide a semiconductor device which can operate at high speed. Another object is to provide a semiconductor device with low power consumption. Another object is to provide a semiconductor device with high productivity. Another object is to provide a semiconductor device with high manufacturing yield. Another object is to provide a novel semiconductor device. Another object is to provide a manufacturing method of the semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to a method for forming a contact plug for electrical connection to a transistor.

One embodiment of the present invention is a method for manufacturing a semiconductor device in which an opening is formed in a stack of a first conductive layer and a first insulating layer and a contact plug is provided in the opening. The method includes the following steps: providing a second conductive layer over the first insulating layer with the same material as the first conductive layer; providing a third conductive layer over the second conductive layer; providing a second insulating layer over the third conductive layer; providing a resist mask over the second insulating layer; providing an opening in the second insulating layer by selective etching using the resist mask as a mask; providing an opening in the third conductive layer and making the resist mask disappear by selective etching using the second insulating layer as a mask; providing an opening in the second conductive layer by selective etching using the third conductive layer as a mask; providing an opening in the first insulating layer and increasing the diameter of the opening in the third conductive layer to expose part of the second conductive layer by selective etching using the third conductive layer and the second conductive layer as a mask; providing an opening in the first conductive layer and increasing the diameter of the opening in the second conductive layer by selective etching using the first insulating layer and the third conductive layer as a mask; increasing the diameter of the opening in the first insulating layer by selective etching using the third conductive layer and the second conductive layer as a mask; filling, with a conductor, the opening penetrating the first conductive layer, the first insulating layer, the second conductive layer, and the third conductive layer which is provided through the above steps; and providing a contact plug which is electrically connected to one of surfaces of the first conductive layer and a side surface of the first conductive layer in the opening.

Another embodiment of the present invention is a method for manufacturing a semiconductor device which includes an oxide semiconductor layer, a first conductive layer, and a first insulating layer. The method includes the following steps: providing a second conductive layer over the first insulating layer with the same material as the first conductive layer; providing a third conductive layer over the second conductive layer; providing a second insulating layer over the third conductive layer; providing a resist mask over the second insulating layer; providing an opening in the second insulating layer by selective etching using the resist mask as a mask; providing an opening in the third conductive layer and making the resist mask disappear by selective etching using the second insulating layer as a mask; providing an opening in the second conductive layer by selective etching using the third conductive layer as a mask; providing an opening in the first insulating layer and increasing the diameter of the opening in the third conductive layer to expose part of the second conductive layer by selective etching using the third conductive layer and the second conductive layer as a mask; providing an opening in the first conductive layer and increasing the diameter of the opening in the second conductive layer by selective etching using the first insulating layer and the third conductive layer as a mask; providing an opening in the oxide semiconductor layer and increasing the diameter of the opening in the first insulating layer by selective etching using the third conductive layer, the second conductive layer, and the first conductive layer as a mask; filling, with a conductor, the opening penetrating the oxide semiconductor layer, the first conductive layer, the first insulating layer, the second conductive layer, and the third conductive layer which is provided through the above steps; and providing a contact plug which is electrically connected to one of surfaces of the first conductive layer and a side surface of the first conductive layer in the opening.

The first conductive layer and the second conductive layer are preferably formed using tungsten.

The third conductive layer is preferably formed using titanium or titanium nitride.

The oxide semiconductor layer preferably includes In, Zn, and M (M is Al, Ti, Sn, Ga, Y, Zr, La, Ce, Nd, or Hf).

The contact plug can penetrate an oxide semiconductor layer of the second transistor.

According to one embodiment of the present invention, a semiconductor device that occupies a small area can be provided. A highly integrated semiconductor device can be provided. A semiconductor device which can operate at high speed can be provided. A semiconductor device with low power consumption can be provided. A semiconductor device with high productivity can be provided. A semiconductor device with high manufacturing yield can be provided. A novel semiconductor device can be provided. A manufacturing method of the semiconductor device can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings:

FIGS. 33A to 33F each illustrate a cross section of a transistor in a channel length direction;

DETAILED DESCRIPTION OF THE INVENTION

Figure 1A:
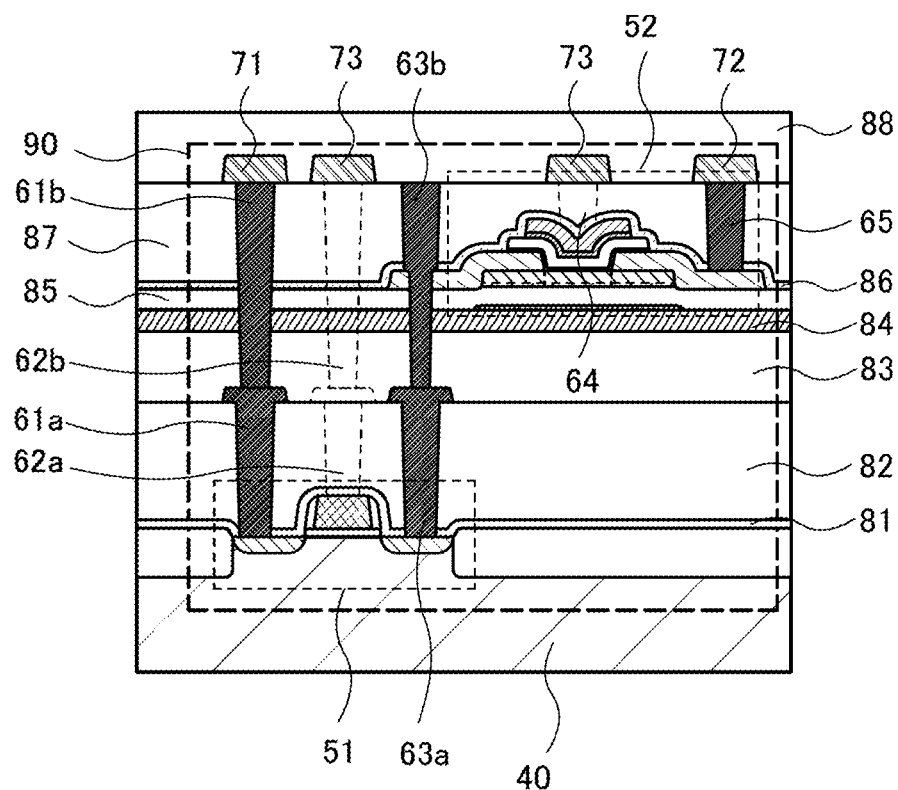
FIGS. 1A and 1B are a cross-sectional view and a circuit diagram illustrating a semiconductor device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be construed as being limited to the description of the embodiments below. Note that in the structures of the present invention described below, the same portions or portions having similar functions are denoted by the same reference numerals in different drawings, and the description thereof is not repeated in some cases. It is also to be noted that the same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or texts, another connection relation is included in the drawings or the texts.

Here, X and Y each denote an object (e.g., a device, an element, a circuit, a wiring, an electrode, a terminal, a conductive film, or a layer).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) interposed between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and X and Y are electrically connected.

Note that in this specification and the like, an explicit description "X and Y are connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth connection path, and a fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

(Embodiment 1)

In this embodiment, a semiconductor device of one embodiment of the present invention is described with reference to drawings.

Figure 1B:
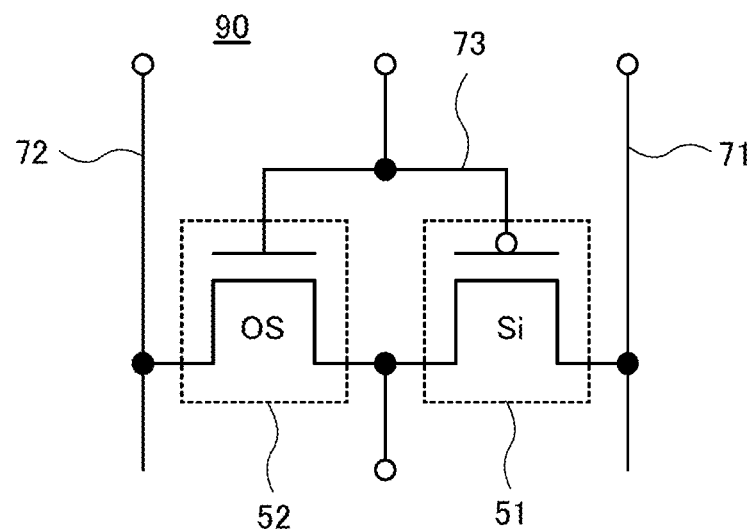

FIG. 1A is a cross-sectional view illustrating a structure of a semiconductor device of one embodiment of the present invention. The semiconductor device in FIG. 1A includes a transistor 51 including an active region in a silicon substrate 40 and a transistor 52 including an oxide semiconductor layer as an active layer. When the transistor 51 is a p-channel transistor and the transistor 52 is an n-channel transistor, a CMOS circuit can be formed. The transistors 51 and 52 in FIG. 1A form an inverter circuit 90 (see FIG. 1B).

Although the transistor 51 is included in the inverter circuit 90, one embodiment of the present invention is not limited thereto. Depending on circumstances or conditions, the transistor 51 may be included in another circuit. An element other than the transistor 51 may be formed on the silicon substrate 40. For example, a capacitor, a diode, a photodiode, a resistor, or the like may be formed on the silicon substrate 40. In the case where a photodiode is formed, a back-surface irradiation image sensor may be provided. That is, light may be incident on a back surface of the silicon substrate 40. In the case of forming an image sensor, a transistor connected to a photodiode may be formed on the silicon substrate 40. Note that one embodiment of the present invention is not limited thereto. A transistor connected to a photodiode is not necessarily formed on the silicon substrate 40. For example, a transistor connected to a photodiode may be formed over the silicon substrate 40 like the transistor 52.

The basic structure of the transistor 51 includes an active region where a channel is formed, a source region, a drain region, a gate insulating film, and a gate electrode. The basic structure of the transistor 52 includes an active layer where a channel is formed, a source electrode, a drain electrode, a gate insulating film, and a gate electrode. As shown in FIG. 1A, the above components of the transistor 51 and the above components of the transistor 52 partly overlap with each other, resulting in a reduction in the area occupied by the circuit.

Formation of the inverter circuit 90 does not require a process for forming an n-channel transistor including an active region in the silicon substrate 40; therefore, steps of forming a p-type well, an n-type impurity region, and the like can be omitted and the number of steps can be drastically reduced.

An insulating layer 81, an insulating layer 82, an insulating layer 83, an insulating layer 84, and an insulating layer 85 are provided over the transistor 51.

The transistor 52 is provided over the insulating layer 85, and an insulating layer 86, an insulating layer 87, and an insulating layer 88 are provided over the transistor 52.

Note that the insulating layers provided over the transistors 51 and 52 are not limited to the above mode. Some of the insulating layers may be omitted, or another insulating layer may be added.

One of the source region and the drain region of the transistor 51 is electrically connected to a contact plug 61a penetrating the insulating layer 82. Furthermore, the contact plug 61a is electrically connected to a contact plug 61b penetrating the insulating layers 83 to 87, and the contact plug 61b is electrically connected to a wiring 71 over the insulating layer 87.

The gate electrode of the transistor 51 is electrically connected to a contact plug 62a penetrating the insulating layer 82. Furthermore, the contact plug 62a is electrically connected to a contact plug 62b penetrating the insulating layers 83 to 87, and the contact plug 62b is electrically connected to a wiring 73 over the insulating layer 87.

The other of the source region and the drain region of the transistor 51 is electrically connected to a contact plug 63a penetrating the insulating layer 82. The contact plug 63a is electrically connected to a contact plug 63b penetrating one of the source electrode and the drain electrode of the transistor 52 and the insulating layers 83 to 87. Here, the other of the source region and the drain region of the transistor 51 and the one of the source electrode and the drain electrode of the transistor 52 are electrically connected to each other through the contact plug 63a and the contact plug 63b.

The gate electrode of the transistor 52 is electrically connected to a contact plug 64 penetrating the insulating layers 86 and 87. The contact plug 64 is electrically connected to the wiring 73 over the insulating layer 87. That is, the gate electrode of the transistor 51 and the gate electrode of the transistor 52 are electrically connected to each other through the contact plug 62a, the contact plug 62b, the wiring 73, and the contact plug 64.

Note that the contact plugs 62a, 62b, and 64 are indicated by dashed lines to show that their positions in the depth direction of the drawing are different from those of other contact plugs.

The other of the source electrode and the drain electrode of the transistor 52 is electrically connected to a contact plug 65 penetrating the insulating layers 86 and 87. The contact plug 65 is electrically connected to a wiring 72 over the insulating layer 87.

The semiconductor device of one embodiment of the present invention is characterized by the shape of the contact plug 63b penetrating the one of the source electrode and the drain electrode of the second transistor 52.

In the cross section in FIG. 1A, the diameter of the contact plug 63b is relatively large in a region penetrating the insulating layers 86 and 87 and relatively small in a region penetrating the one of the source electrode and the drain electrode of the second transistor 52. When the contact plug 63b has such a cross-sectional shape, an area where the contact plug 63b is in contact with the one of the source electrode and the drain electrode of the second transistor 52 can be increased, so that contact resistance can be reduced.

Figure 2A:
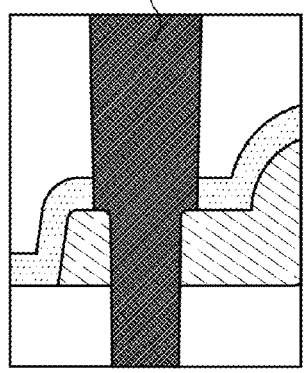
FIGS. 2A to 2F are enlarged cross-sectional views of semiconductor devices.
Figure 2B:
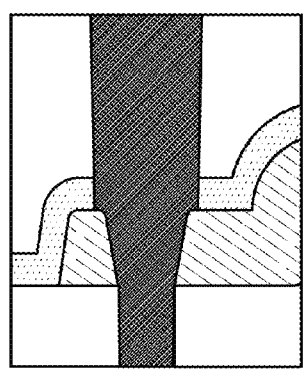
Figure 2C:
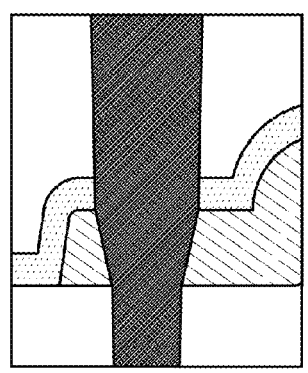
Figure 2D:
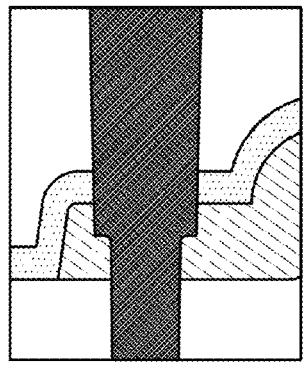
Figure 2E:
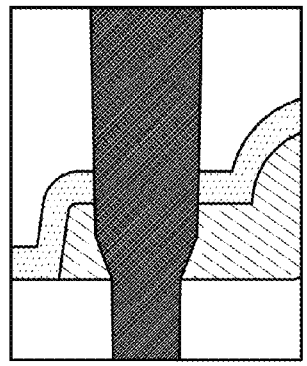
Figure 2F:
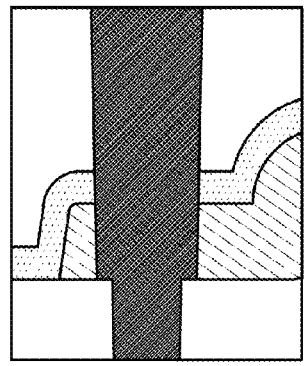

FIG. 2A is an enlarged view of the vicinity of a region where the one of the source electrode and the drain electrode of the second transistor 52 in FIG. 1A is in contact with the contact plug 63b. One embodiment of the present invention is not limited thereto, and may be modes illustrated in FIGS. 2B to 2F. By adjusting etching conditions, the shapes of the region where the one of the source electrode and the drain electrode of the second transistor 52 is in contact with the contact plug 63b and the periphery thereof can be changed variously.

Note that an inner wall of a contact hole formed in a contact plug has a slight taper angle; accordingly, it can be said that the diameter of a contact plug continuously changes in the depth direction. A feature of one embodiment of the present invention is that, regardless of this change in diameter, a contact plug has a region where the diameter significantly changes.

FIGS. 3A to 3C, FIGS. 4A to 4C, and FIGS. 5A to 5C illustrate a process for forming the contact plug 63b. Note that the description of a region below the insulating layer 85 is omitted.

The contact plug 63b is formed in such a manner that a contact hole is formed in a stack of the one of the source electrode and the drain electrode of the second transistor 52 and the plurality of insulating layers and filled with a conductor such as metal.

The stack has a structure in which the insulating layer 85, the one of the source electrode and the drain electrode of the second transistor 52 (hereinafter referred to as an electrode layer 31), the insulating layer 86, and the insulating layer 87 are stacked in this order from the bottom.

First, a metal layer 32, a metal layer 33, an insulating layer 34, and an organic film 35 are formed over the insulating layer 87 in this order. Then, a resist mask 36 having a desired shape is formed (see FIG. 3A). Note that the organic film 35 is used to improve the adhesion with the resist mask 36 and can be omitted. The thickness of the resist mask 36 is approximately 100 nm, for example.

Note that in the following description, all etching steps are preferably performed by a dry etching method. Furthermore, the etching conditions are changed as appropriate depending on a layer to be etched.

For example, Al, Cr, Cu, Ta, Ti, Mo, W, Ni, Mn, Nd, or Sc can be used for the electrode layer 31. The thickness of the electrode layer 31 is preferably greater than or equal to 10 nm and less than or equal to 40 nm, more preferably greater than or equal to 15 nm and less than or equal to 30 nm. Typically, a 20-nm-thick tungsten film can be used.

The metal layer 32 can be formed using the same material as the electrode layer 31. The thickness of the metal layer 32 is greater than or equal to 10 nm and less than or equal to 50 nm, more preferably greater than or equal to 20 nm and less than or equal to 40 nm. Typically, a 30-nm-thick tungsten film can be used.

The metal layer 33 can be formed using a material whose etching rate is lower than that of the electrode layer 31 under the etching conditions for etching the electrode layer 31. For example, in the case where a tungsten film is used as the electrode layer 31, a titanium film or a titanium nitride film can be used. The thickness of the metal layer 33 is preferably greater than or equal to 20 nm and less than or equal to 100 nm, more preferably greater than or equal to 40 nm and less than or equal to 80 nm. Typically, a 60-nm-thick titanium film can be used.

The insulating layer 34 can be formed using a material whose etching rate is lower than those of the metal layers 33 and 32 under the etching conditions for etching the metal layers 33 and 32. For example, in the case where a titanium film and a tungsten film are used as the metal layers 33 and 32, respectively, a silicon oxide film, a silicon oxynitride film, a silicon nitride film, or a silicon nitride oxide film can be used. The thickness of the insulating layer 34 is preferably greater than or equal to 20 nm and less than or equal to 150 nm, more preferably greater than or equal to 50 nm and less than or equal to 120 nm. Typically, a 100-nm-thick silicon nitride film can be used.

The metal layers 32 and 33 and the insulating layer 34 can be used as a hard mask for forming an opening with a precise shape. Since a resist mask formed using an organic material is changed in its shape in an etching step, the use of only a resist mask as a mask for forming an opening with a high aspect ratio is not suitable.

Figure 3A:
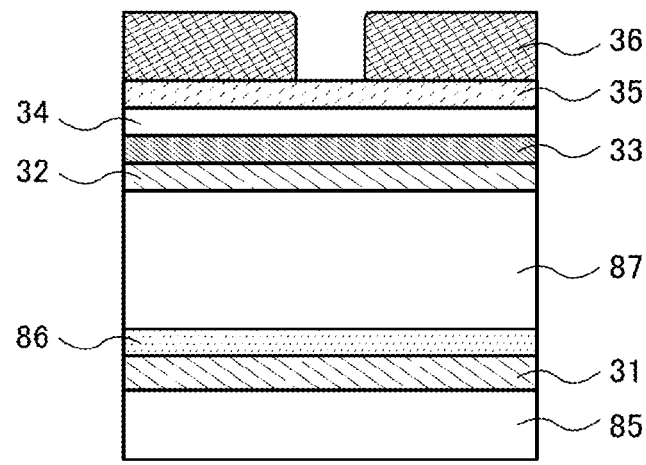
FIGS. 3A to 3C are cross-sectional views illustrating a method for forming a contact plug.
Figure 3B:
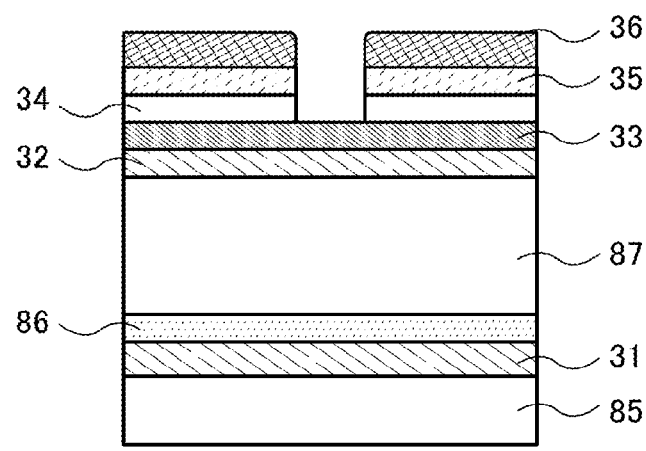

Next, an etching step is performed using the resist mask 36 as a mask, so that an opening is formed in the organic film 35 and the insulating layer 34 (see FIG. 3B). Here, when the thicknesses of the layers are set in the above ranges, the diameter of the opening in the organic film 35 and the insulating layer 34 can be substantially equal to the diameter of the opening in the resist mask 36.

Figure 3C:
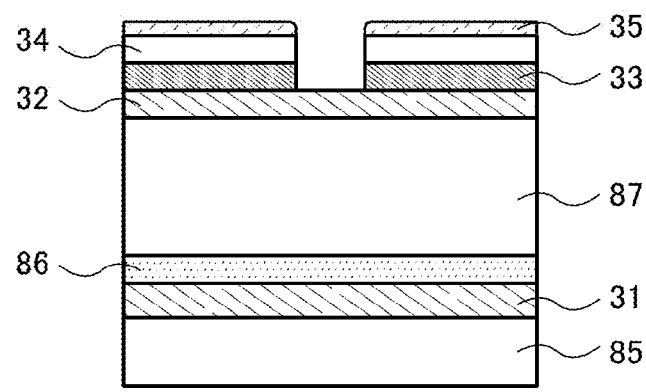

Next, an etching step is performed using the resist mask 36, the organic film 35, and the insulating layer 34 as a mask, so that an opening is formed in the metal layer 33 (see FIG. 3C). Although FIG. 3C illustrates a mode where the resist mask 36 is eliminated and part of the organic film 35 remains, the resist mask 36 does not necessarily disappear. The organic film 35 may disappear.

Figure 4A:
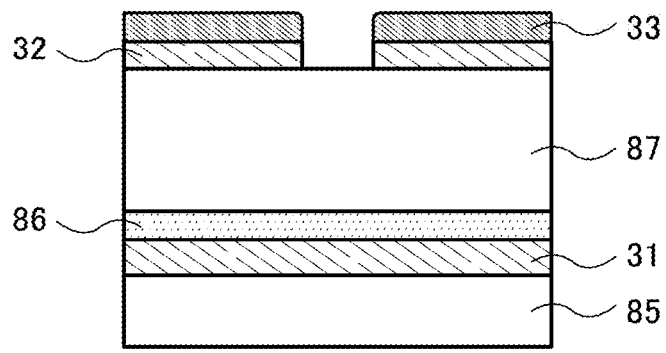
FIGS. 4A to 4C are cross-sectional views illustrating a method for forming a contact plug.

Next, an etching step is performed using the organic film 35 and the insulating layer 34 as a mask, so that an opening is formed in the metal layer 32 (see FIG. 4A). At this time, the organic film 35 and the insulating layer 34 may disappear.

Figure 4B:
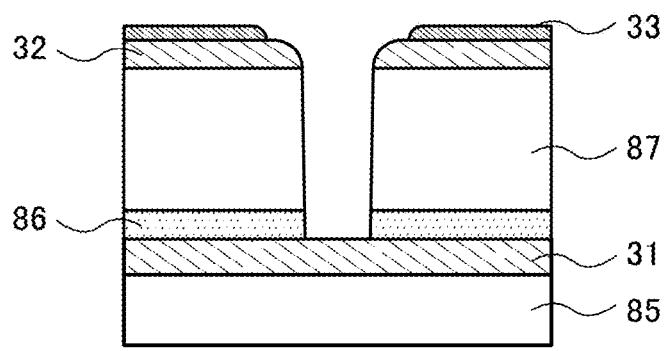

Next, an etching step is performed using the metal layers 33 and 32 as a mask, so that an opening is formed in the insulating layers 87 and 86 (see FIG. 4B). At this time, the etching proceeds so that the diameter of the opening in the metal layer 33 becomes large, whereby part of the metal layer 32 is exposed.

Figure 4C:
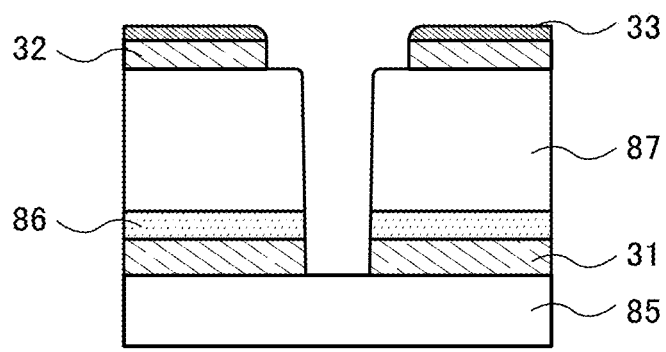

Next, an etching step is performed using the metal layers 33 and 32 as a mask, so that an opening is formed in the electrode layer 31 (see FIG. 4C). In the etching step, in the case where the electrode layer 31 and the metal layer 32 are formed using the same metal material, the etching of both of the layers proceeds. Therefore, an exposed region of the metal layer 32 in FIG. 4B is etched and the opening is formed in the electrode layer 31, so that part of an upper surface of the insulating layer 87 is exposed.

Figure 5A:
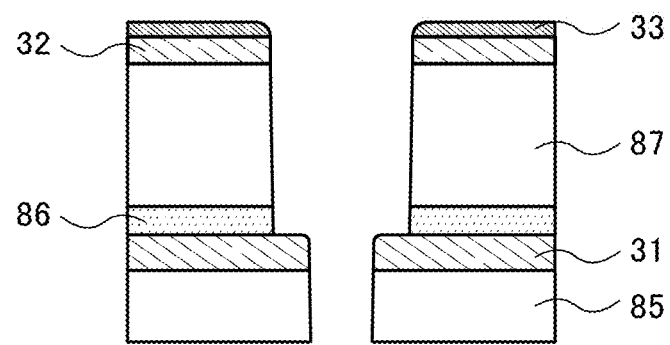
FIGS. 5A to 5C are cross-sectional views illustrating a method for forming a contact plug.

Next, an etching step is performed using the metal layers 33 and 32 and the electrode layer 31 as a mask, so that the diameter of the opening in the insulating layers 87 and 86 is increased and an opening is formed in the insulating layer 85 (see FIG. 5A).

Figure 5B:
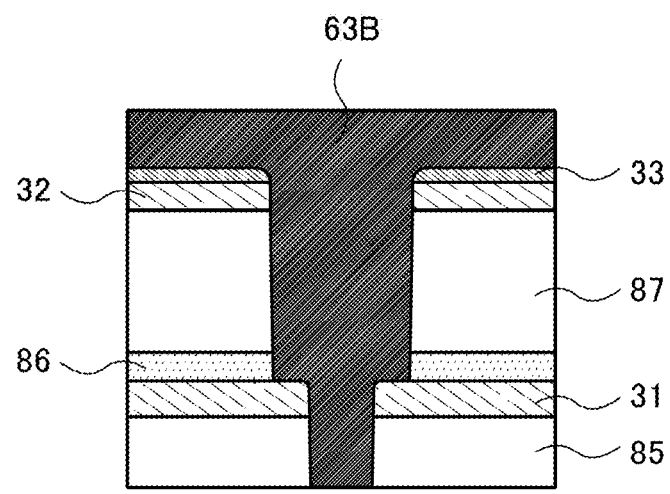
Figure 5C:
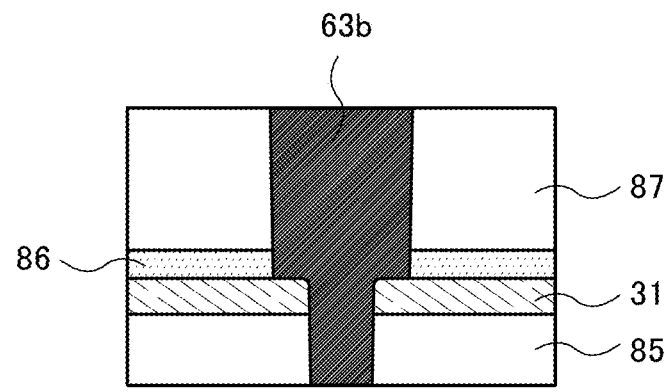

Next, the opening which penetrates the layers and is formed in the above steps is filled with a conductor 63B such as metal by a chemical vapor deposition (CVD) method or the like (see FIG. 5B).

Then, an unnecessary region of the conductor 63B over the insulating layer 87 and the metal layers 33 and 32 are removed by a chemical mechanical polishing (CMP) method, so that the contact plug 63b is formed.

The transistor 52 used for a semiconductor device of one embodiment of the present invention may have a structure in which a source electrode and a drain electrode are formed over an oxide semiconductor layer and the source electrode and the drain electrode are not in contact with the insulating layer 85. In such a structure, the insulating layer 85 is not deprived of oxygen by a metal layer forming the source electrode and the drain electrode. Thus, the oxygen can be efficiently supplied to the oxide semiconductor layer, resulting in improved electrical characteristics and reliability of the transistor 52.

Figure 6:
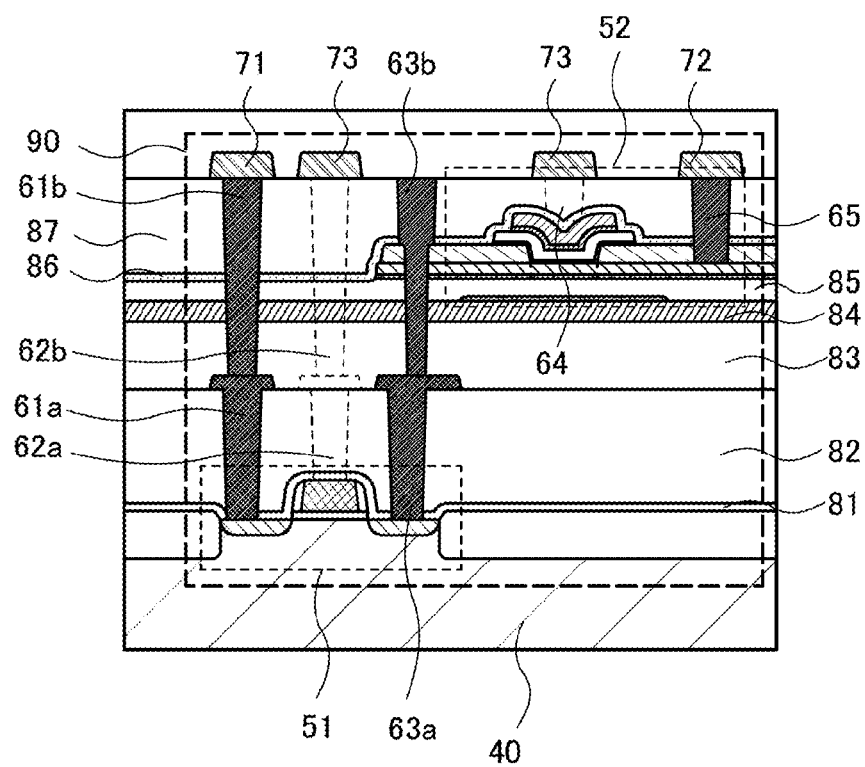
FIG. 6 is a cross-sectional view illustrating a semiconductor device.
Figure 7A:
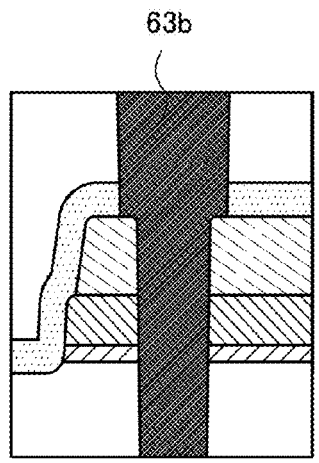
FIGS. 7A to 7F are enlarged cross-sectional views of semiconductor devices.
Figure 7B:
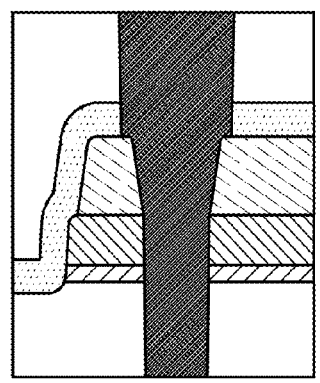
Figure 7C:
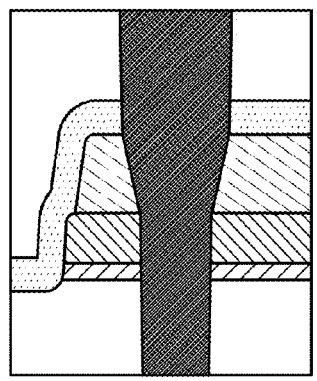
Figure 7D:
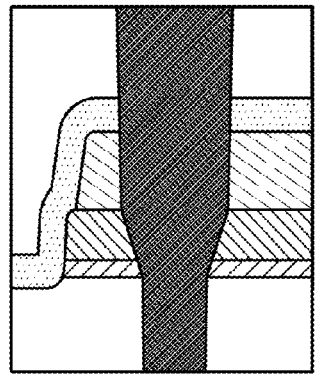
Figure 7E:
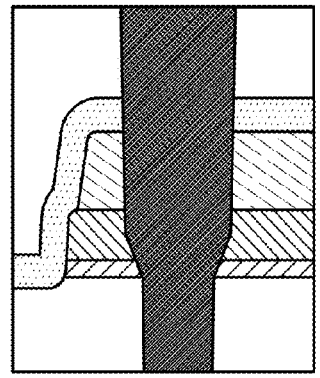
Figure 7F:
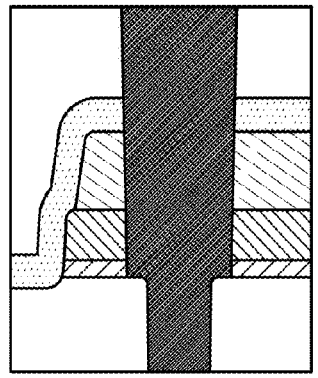

FIG. 6 illustrates a semiconductor device of one embodiment of the present invention including the above structure. FIG. 7A is an enlarged view of the vicinity of a region where one of the source electrode and the drain electrode of the second transistor 52 is in contact with the contact plug 63b in FIG. 6. One embodiment of the present invention is not limited thereto, and may be modes illustrated in FIGS. 7B to 7F.

FIGS. 8A to 8C, FIGS. 9A to 9C, and FIGS. 10A to 10C illustrate a process for forming the contact plug 63b. Note that the structure of a stack illustrated in FIGS. 8A to 10C is different from the structure of the stack illustrated in FIGS. 3A to 5C only in that the oxide semiconductor layer 30 is provided. An opening may be provided in the oxide semiconductor layer 30 by performing an etching step using the electrode layer 31 as a mask (see FIG. 10A). The above description of the steps in FIGS. 3A to 5C can be referred to for the other steps.

Figure 11A:
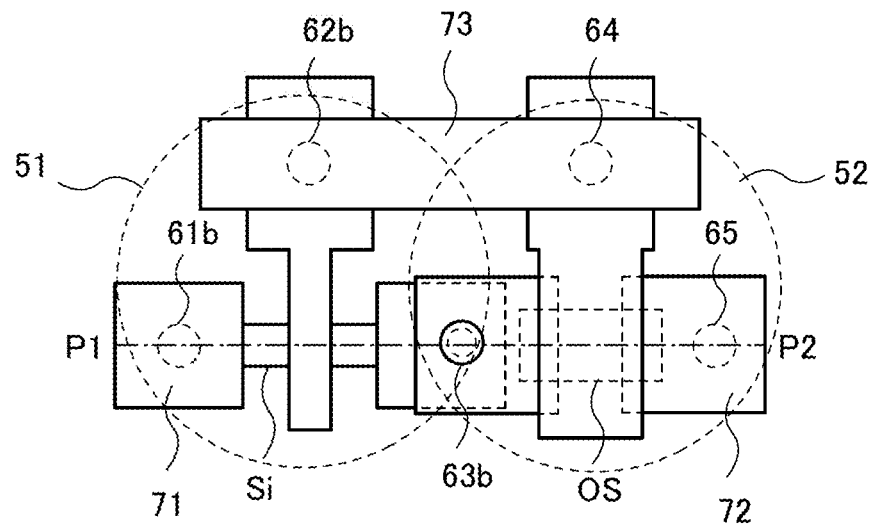
FIGS. 11A and 11B are top views each illustrating a semiconductor device.
Figure 11B:
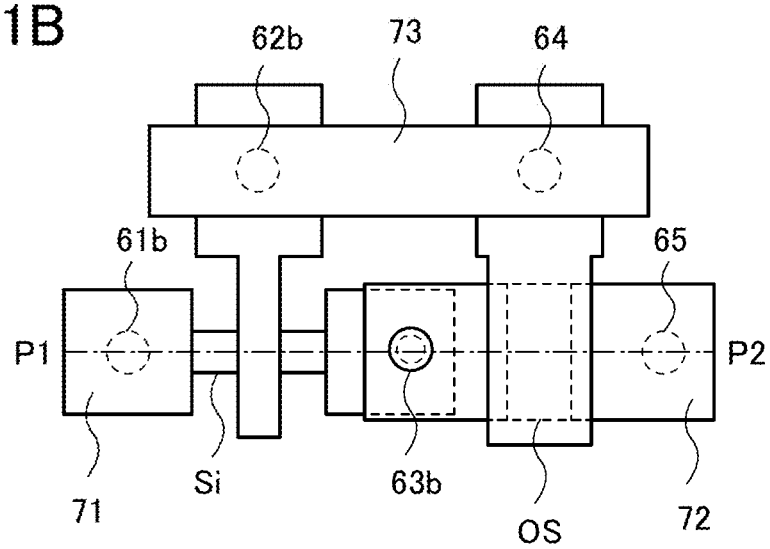

FIGS. 11A and 11B are each a top view of the semiconductor device of one embodiment of the present invention. FIG. 11A is a top view of the semiconductor device in FIG. 1A, and FIG. 11B is a top view of the semiconductor device in FIG. 6. Note that FIG. 1A and FIG. 6 correspond to cross-sections along P1-P2 in FIGS. 11A and 11B, respectively. In the drawings, "OS" represents an active layer formed using an oxide semiconductor, and "Si" represents an active region made of silicon.

Figure 12A:
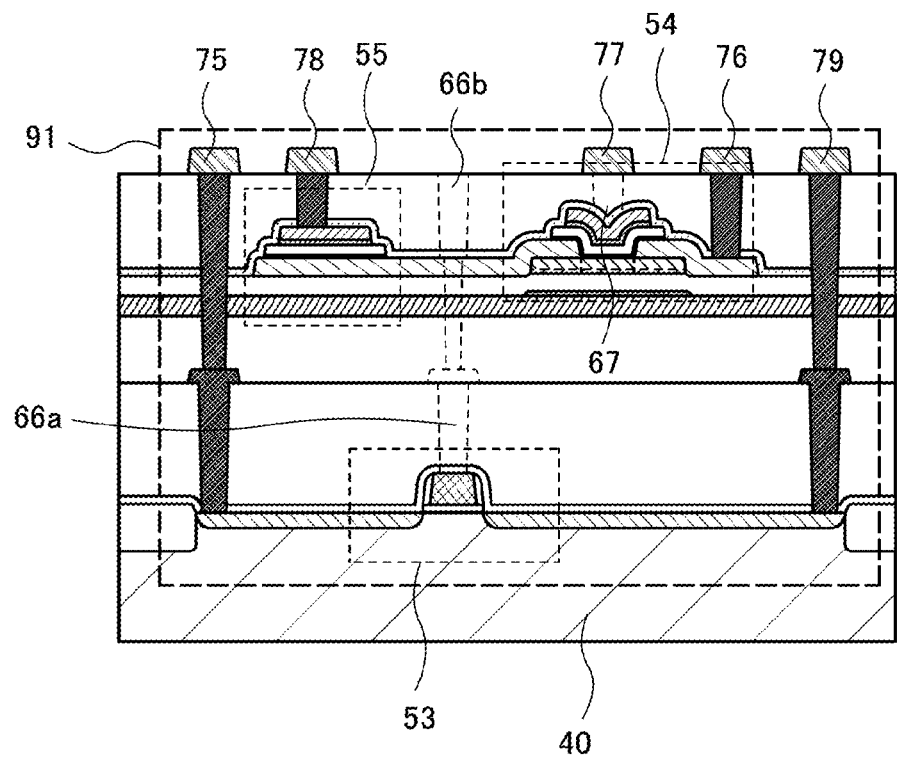
FIGS. 12A and 12B are a cross-sectional view and a circuit diagram illustrating a semiconductor device.

FIG. 12A illustrates another embodiment of the present invention. The semiconductor device in FIG. 12A includes a transistor 53 including an active region in the silicon substrate 40, a transistor 54 including an oxide semiconductor layer as an active layer, and a capacitor 55. The connection configuration of the transistors 53 and 54 and the capacitor 55 in FIG. 12A forms a circuit 91 shown in a circuit diagram in FIG. 12B. The semiconductor device in FIG. 12A can have the same structure as that in FIG. 1A except for the provision of the capacitor 55 and the connection configuration of the components.

Here, a contact plug 66a and a contact plug 66b are used to electrically connect a gate electrode layer of the transistor 53, one of a source electrode layer and a drain electrode layer of the transistor 54, and one electrode layer of the capacitor 55 to each other. The contact plug 66b is electrically connected to the contact plug 66a through the opening in the one of the source electrode layer and the drain electrode layer of the transistor 54 (serving also as the one electrode layer of the capacitor 55).

Note that the contact plugs 66a, 66b, and 67 are indicated by dashed lines to show that their positions in the depth direction of the drawing are different from those of other contact plugs.

Figure 13:
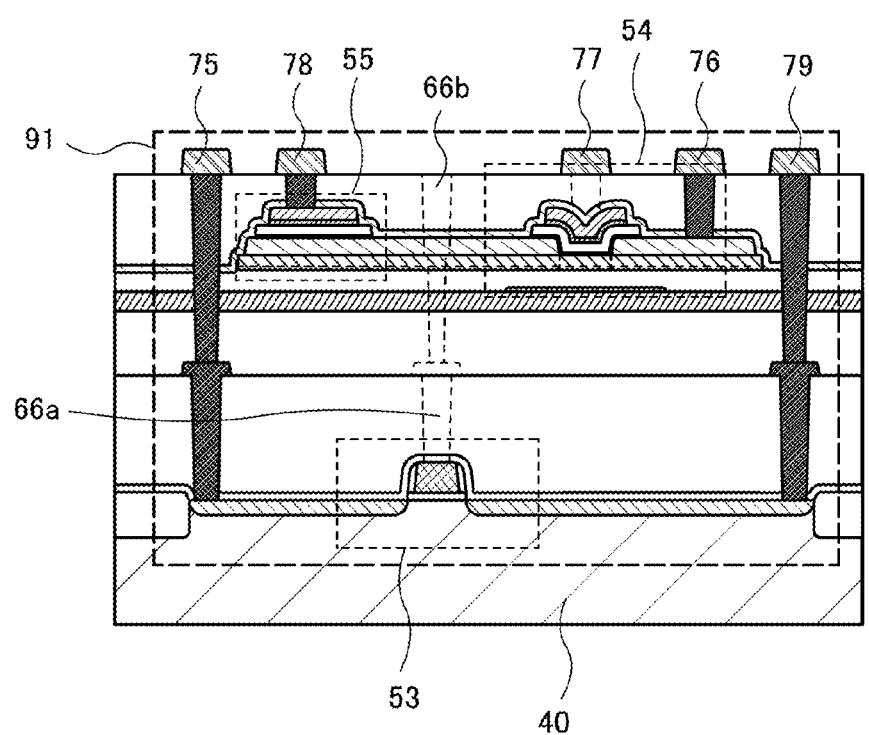
FIG. 13 is a cross-sectional view illustrating a semiconductor device.
Figure 14A:
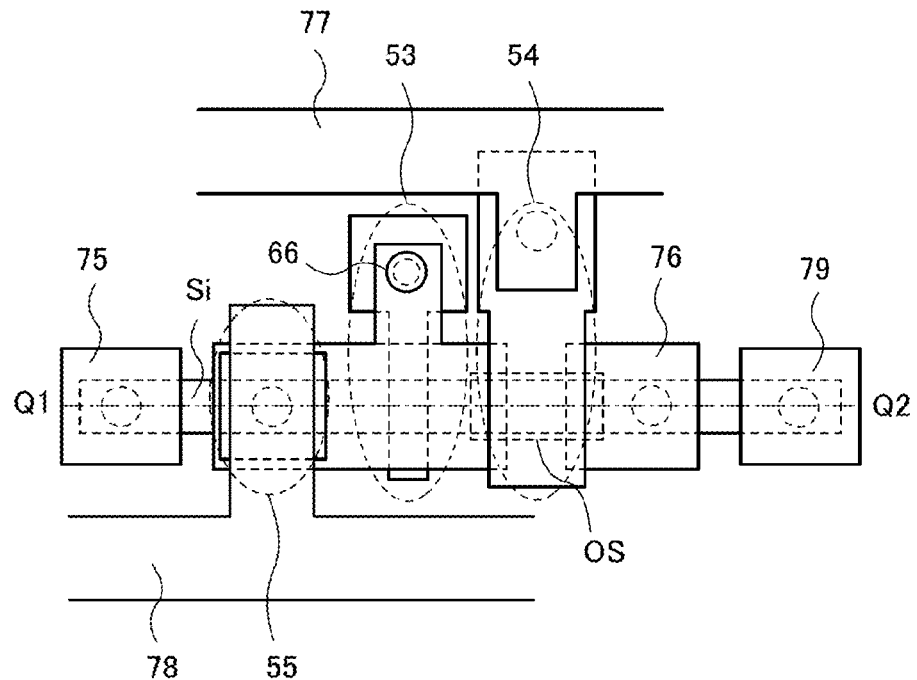
FIGS. 14A and 14B are top views each illustrating a semiconductor device.
Figure 14B:
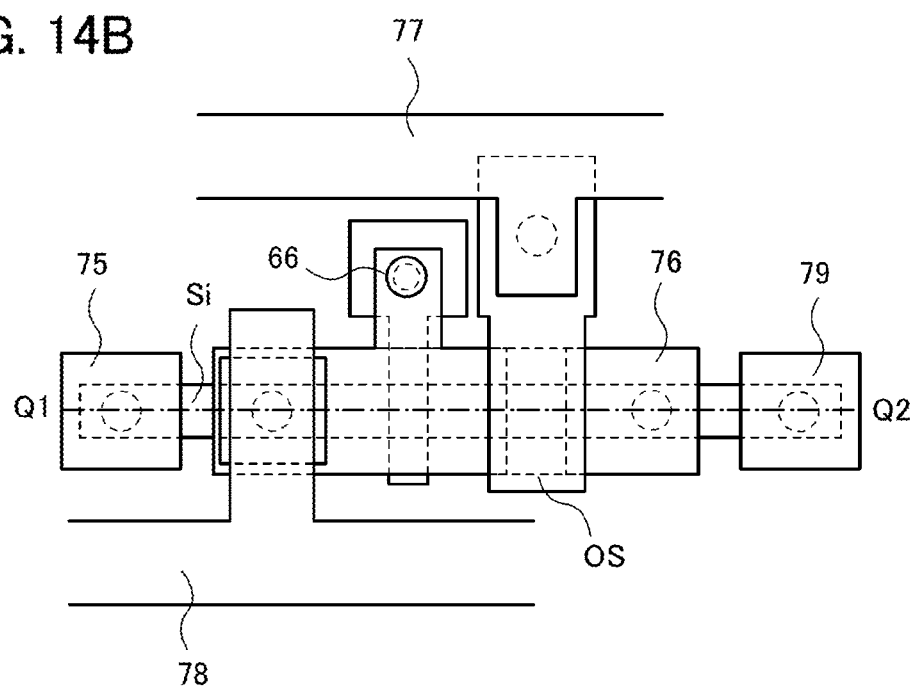

FIG. 13 illustrates the case where the structure of the transistor 52 shown in FIG. 6 is applied to the transistor 54. FIG. 14A is an example of a top view of the semiconductor device in FIG. 12A. FIG. 14B is an example of a top view of the semiconductor device in FIG. 13. Note that FIG. 12A and FIG. 13 correspond to cross-sections along Q1-Q2 in FIGS. 14A and 14B, respectively.

Figure 12B:
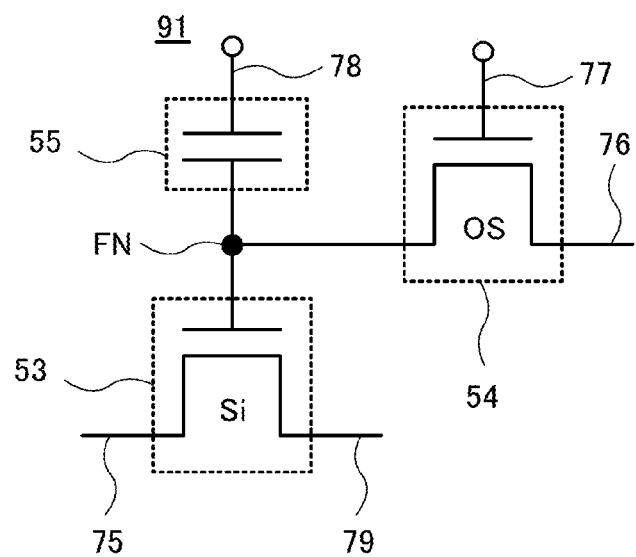

The circuit 91 shown in FIG. 12B is an example of a semiconductor device (memory device) that can hold stored data even when power is not supplied and that has no limitation on the number of times of writing.

The transistor 54 formed using an oxide semiconductor enables charge to be held for a long time owing to its electrical characteristics of a significantly low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer. On the other hand, a transistor including a material other than an oxide semiconductor, such as crystalline silicon, can operate at high speed easily. Thus, the use of both the transistors enables fabrication of a memory device that has a high capability of holding data and that operates at high speed.

The semiconductor device in FIG. 12B utilizes a feature that the potential of a gate electrode of the transistor 54 can be held, and thus enables writing, storing, and reading of data as follows.

Writing and holding of data will be described. First, the potential of a wiring 77 is set to a potential at which the transistor 54 is turned on, so that the transistor 54 is turned on.

By the above operation, the potential of a wiring 76 is supplied to the gate electrode of the transistor 53 and the capacitor 55. In other words, a predetermined charge is supplied to a node FN (data writing). Here, one of two kinds of charges providing different potential levels (hereinafter referred to as a low-level charge and a high-level charge) is supplied.

After that, the potential of the wiring 77 is set to a potential at which the transistor 54 is turned off, so that the transistor 54 is turned off. Thus, the charge supplied to the node FN is held (data holding). Since the off-state current of the transistor 54 is extremely low, the charge in the node FN is held for a long time.

Next, reading of data will be described. An appropriate potential (reading potential) is supplied to a wiring 78 while a predetermined potential (constant potential) is supplied to a wiring 75, whereby the potential of a wiring 79 varies depending on the amount of charge held in the node FN.

In general, when the transistor 53 is an n-channel transistor, an apparent threshold voltage $V_{th\_H}$ in the case where a high-level charge is supplied to the gate electrode (node FN) of the transistor 53 is lower than an apparent threshold voltage $V_{th\_L}$ in the case where a low-level charge is supplied to the gate electrode (node FN) of the transistor 53.

Here, an apparent threshold voltage refers to the potential of the wiring 78 which is needed to turn on the transistor 53. Thus, the potential of the wiring 78 is set to a potential $V_0$ that is between $V_{th\_H}$ and $V_{th\_L}$, whereby charge supplied to the gate electrode (node FN) of the transistor 53 can be determined.

For example, in the case where the high-level charge is supplied in writing, when the potential of the wiring 78 is set to $V_0$ ($>V_{th\_H}$), the transistor 53 is turned on. In the case where the low-level charge is supplied in writing, even when the potential of the wiring 78 is set to $V_0$ ($<V_{th\_L}$), the transistor 53 remains off Therefore, the held data can be read by determining the potential of the wiring 79.

Note that in the case where memory cells are arrayed to be used, it is necessary that only data of a desired memory cell be able to be read. The wirings 78 of memory cells from which data is not read are supplied with a potential at which the transistor 53 is turned off regardless of the potential supplied to the gate electrode, that is, a potential lower than $V_{th\_H}$. Alternatively, the wirings 78 are supplied with a potential at which the transistor 53 is turned on regardless of the potential supplied to the gate electrode, that is, a potential higher than $V_{th\_L}$.

The semiconductor device in FIG. 12B includes a transistor in which a channel formation region is formed using an oxide semiconductor and which has an extremely low off-state current; accordingly, the semiconductor device can hold stored data for an extremely long time. In other words, refresh operation becomes unnecessary or the frequency of the refresh operation can be extremely low, which leads to a sufficient reduction in power consumption. Moreover, stored data can be held for a long time even when power is not supplied (note that a potential is preferably fixed). Note that power may be supplied while the stored data is held.

In the above driving method, a high voltage is not needed to write data to the node FN, and a problem such as deterioration of the transistor 53 does not occur. For example, unlike in a conventional nonvolatile memory, it is not necessary to inject and extract electrons into and from a floating gate by application of a high voltage, and thus a problem such as deterioration of a gate insulating film of the transistor 53 does not occur. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

Components of the semiconductor device of one embodiment of the present invention will be described. Although components of the semiconductor device in FIG. 1A are described below, the description applies also to other semiconductor devices in this embodiment.

The silicon substrate 40 is not limited to a bulk silicon substrate and may be an SOI substrate. Furthermore, the silicon substrate 40 can be replaced with a substrate made of germanium, silicon germanium, silicon carbide, gallium arsenide, aluminum gallium arsenide, indium phosphide, gallium nitride, or an organic semiconductor.

Note that the transistor 51 can be a transistor of various types without being limited to a planar-type transistor. For example, the transistor 51 can be a fin-type transistor, a tri-gate transistor, or the like.

Similarly, the transistors 52 and 54 and the like each can be a transistor of any of various types. Depending on circumstances or conditions, the transistors each can be a planar-type transistor, a fin-type transistor, or a tri-gate transistor, for example.

The transistors 52 and 54 and the like each can include a semiconductor of any of various types depending on circumstances or conditions. Depending on circumstances or conditions, the transistors 52 and 54 and the like each can include silicon, germanium, silicon germanium, silicon carbide, gallium arsenide, aluminum gallium arsenide, indium phosphide, gallium nitride, or an organic semiconductor, for example.

The insulating layer 81 can function as a protective film, and typically, a silicon nitride film or an aluminum oxide film can be used as the insulating layer 81. The insulating layers 82, 83, 87, and 88 can function as planarization films, and typically, a silicon oxide film, a silicon oxynitride film, or the like can be used as each of the insulating layers 82, 83, 87, and 88.

The insulating layer 84 can function as a hydrogen-blocking film. Hydrogen in an insulating layer provided in the vicinity of the active region of the transistor 51 terminates dangling bonds of silicon; accordingly, the reliability of the transistor 51 can be improved. Meanwhile, hydrogen in an insulating layer provided in the vicinity of the oxide semiconductor layer, which is the active layer, of the transistor 52 provided in an upper portion becomes a factor of generating carriers in the oxide semiconductor; thus, the reliability of the transistor 52 might be decreased. Therefore, in the case where the transistor using an oxide semiconductor is provided over the transistor using a silicon-based semiconductor material, it is preferable that the insulating layer 84 having a function of preventing diffusion of hydrogen be provided between the transistors. The insulating layer 84 makes hydrogen remain in the lower portion, thereby improving the reliability of the transistor 51. In addition, since the insulating layer 84 suppresses diffusion of hydrogen from the lower portion to the upper portion, the reliability of the transistor 52 also can be improved.

The insulating layer 84 can be, for example, formed using silicon nitride, aluminum oxide, aluminum oxynitride, gallium oxide, gallium oxynitride, yttrium oxide, yttrium oxynitride, hafnium oxide, hafnium oxynitride, or yttria-stabilized zirconia (YSZ). Note that the insulating layer 85 can also be formed using any of these materials.

The insulating layer 85 functions as a supply source of oxygen to the oxide semiconductor layer of the transistor 52. For this reason, the insulating layer 85 preferably contains oxygen, and preferably contains oxygen more than that in the stoichiometric composition. The insulating layer 85 can also function as a gate insulating film on the back gate side of the transistor 52. For this reason, the insulating layer 85 is preferably a film in which defects are less likely to be generated at the interface with the oxide semiconductor layer.

As the insulating layer 85, typically, a silicon oxide film or a silicon oxynitride film can be used. Alternatively, a stack of the insulating layer and a silicon nitride film or a silicon nitride oxide film may be used. Note that the insulating layer 87 can also be formed using any of these materials.

The contact plugs 61a to 65 can be typically formed using a metal material. Specifically, tungsten can be used. It is also possible to provide titanium nitride on the inner wall of the contact hole and then provide tungsten to fill the remaining space in the contact hole. Note that a CMP method may be used for planarization of top surfaces of the insulating layers and the contact plugs.

In this embodiment, structures of an inverter circuit and a memory circuit are described as examples of one embodiment of the present invention; however, one embodiment of the present invention can be applied to other circuits. Moreover, one embodiment of the present invention is not limited to the example where two transistors overlap with each other and can be applied to a structure in which three or more components (e.g., transistors) are electrically connected to each other.

This embodiment shows an example where a transistor including silicon in an active region and a transistor including an oxide semiconductor in an active layer are stacked. Without being limited thereto, one embodiment of the present invention can also be applied to a structure in which a plurality of transistors including silicon are stacked or a structure in which a plurality of transistors including an oxide semiconductor are stacked.

One embodiment of the present invention can also be applied to electrical connection between wirings overlapping with each other with an insulating layer therebetween.

Figure 45:
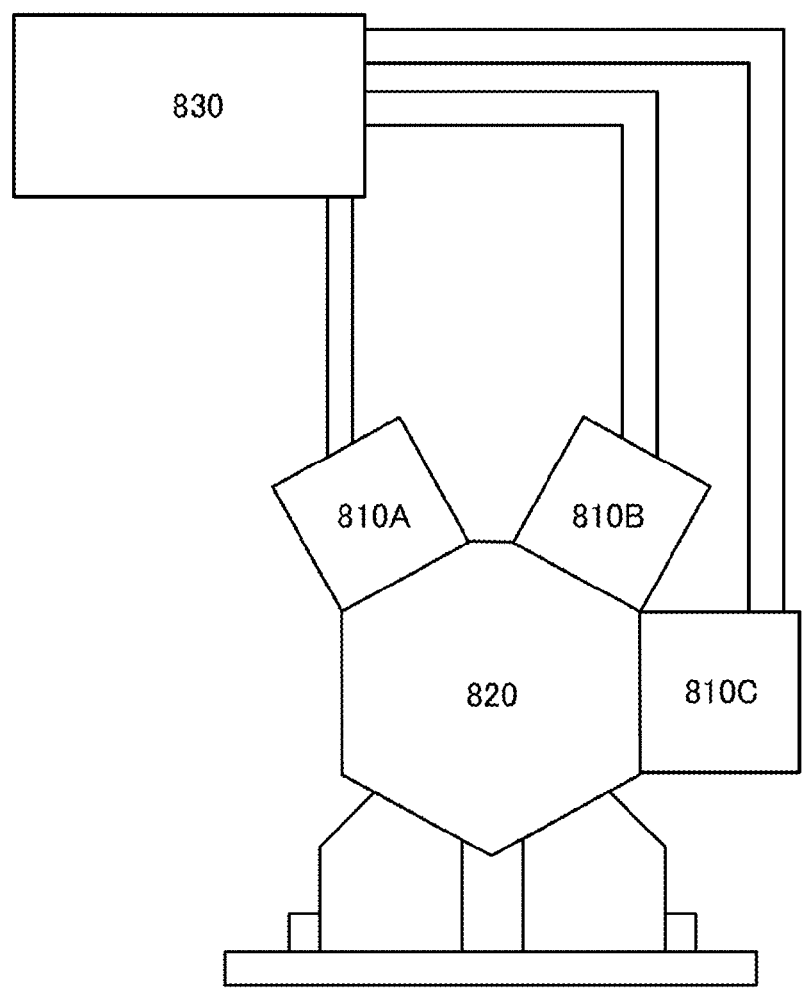
FIG. 45 illustrates an etching apparatus.

FIG. 45 illustrates an example of an etching apparatus for etching a multilayer film including a plurality of kinds of films. The etching apparatus in FIG. 45 includes etching chambers 810A, 810B, and 810C, a transfer chamber 820 intended for temporary standby of a substrate at the time of transferring the substrate to each etching chamber, and a gas supply system 830 that supplies an etching gas or the like to each etching chamber. The etching apparatus also includes power supply systems, pump systems, gas abatement systems, and the like, which are not shown.

To form a minute opening in a multilayer film including a plurality of kinds of films, it is preferable to use a parallel-plate etching apparatus, particularly an etching apparatus with a high-density plasma generation source or the like. Alternatively, it is preferable to provide the etching apparatus with a gas supply system that allows an optimal etching gas to be selected as appropriate for the etching of each layer, particularly a gas supply system that allows a plurality of gases to be used in combination.

For example, formation of a minute opening in a multilayer film including a plurality of kinds of films may be performed in one etching chamber. In this method, an optimal etching gas may be used for the etching of each layer. An etching apparatus with three etching chambers as shown in FIG. 45 can process a plurality of substrates concurrently and therefore can improve the production efficiency.

In the case where etching of a multilayer film including a plurality of kinds of films is performed in one etching chamber, the gas in the etching chamber is switched to an optimal gas in accordance with the kind of a film to be etched. Therefore, various etching products are deposited on the etching chamber wall in some cases. The deposited etching products peel off the etching chamber wall as particles in some cases. Attachment of the particles on a substrate might cause an etching defect.

One of methods for preventing generation of such particles is to etch different kinds of films in different etching chambers. An example of etching a multilayer film including a plurality of kinds of films using the etching apparatus in FIG. 45 is described below. Here, a stack in which a first insulating film, a second insulating film, a third insulating film, an oxide semiconductor film, a conductive film, a fourth insulating film, an organic resin film, and a photoresist are formed in this order over a substrate is to be etched. Note that the photoresist has been exposed to light and developed to have a predetermined shape.

First, the substrate is placed in the etching chamber 810A, and the organic resin film and the fourth insulating film are etched. Next, the substrate is transferred from the etching chamber 810A to the etching chamber 810B via the transfer chamber 820, and the conductive film is etched. Then, the substrate is transferred from the etching chamber 810B to the etching chamber 810A via the transfer chamber 820, and the oxide semiconductor film, the third insulating film, and the second insulating film are etched. Then, the substrate is transferred from the etching chamber 810A to the etching chamber 810C via the transfer chamber 820, and ashing is performed to remove the products generated in the previous etching. After that, the substrate is transferred from the etching chamber 810C to the etching chamber 810A via the transfer chamber 820, and the first insulating film is etched. Then, the substrate is transferred from the etching chamber 810A to the etching chamber 810C via the transfer chamber 820, and ashing is performed to remove the resist and the organic resin film.

In accordance with the above example, by repeating the above steps, it is possible to form a minute opening in a multilayer film including even more films.

In the above example, a plurality of etching chambers are used for etching of a multilayer film including a plurality of kinds of films. In this case, the substrate is transferred in vacuum and is not exposed to the air; therefore, stable etching can be performed. Furthermore, in each etching chamber, the etching gas is not switched in accordance with the kind of a film. Therefore, process time is shortened, resulting in higher production efficiency.

The structure described in this embodiment can be used as appropriate in combination with any of the structures described in the other embodiments and an example.

(Embodiment 2)

In this embodiment, a transistor including an oxide semiconductor that can be used in one embodiment of the present invention is described with reference to drawings. In the drawings in this embodiment, some components are enlarged, reduced in size, or omitted for easy understanding.

Figure 15A:
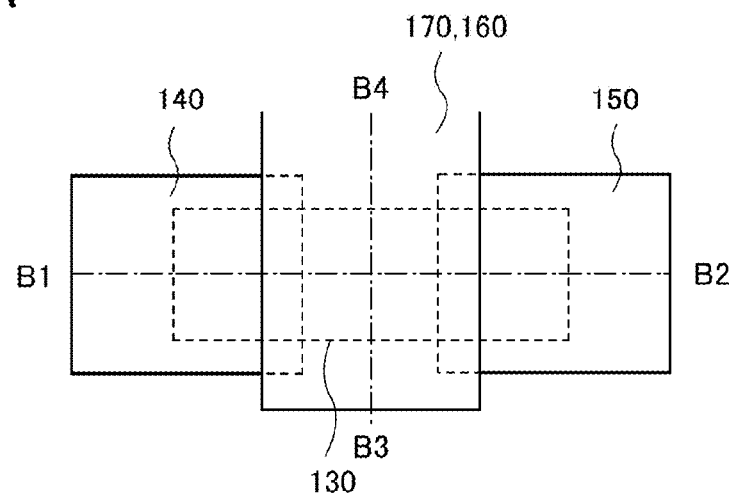
FIGS. 15A and 15B are a top view and a cross-sectional view illustrating a transistor.
Figure 15B:
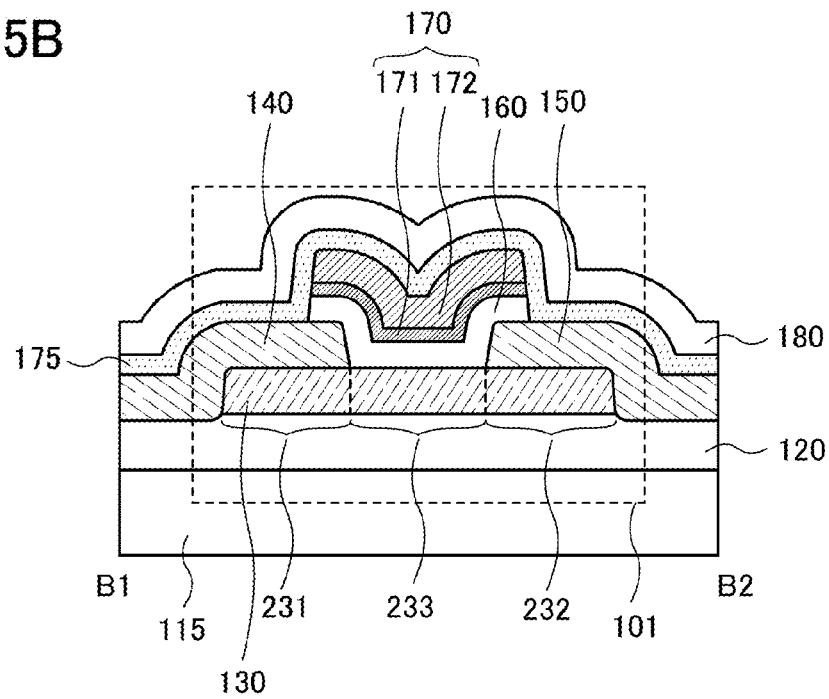
Figure 21A:
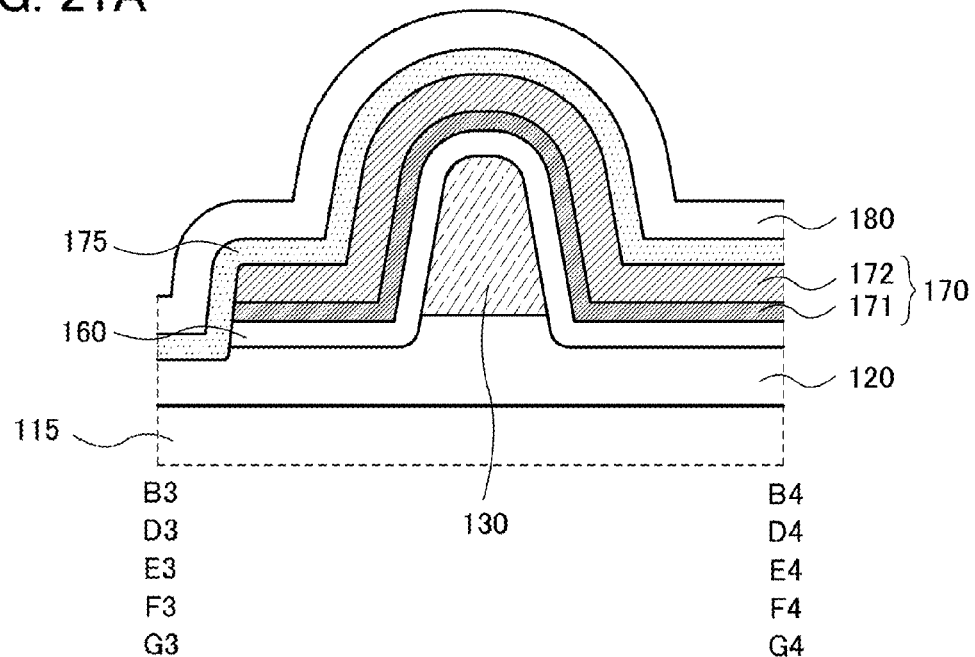
FIGS. 21A and 21B each illustrate a cross section of a transistor in a channel width direction.

FIGS. 15A and 15B are a top view and a cross-sectional view illustrating a transistor 101 of one embodiment of the present invention. FIG. 15A is a top view, and a cross section in the direction of a dashed-dotted line B1-B2 in FIG. 15A is illustrated in FIG. 15B. A cross section in the direction of a dashed-dotted line B3-B4 in FIG. 15A is illustrated in FIG. 21A. In some cases, the direction of the dashed-dotted line B1-B2 is referred to as a channel length direction, and the direction of the dashed-dotted line B3-B4 is referred to as a channel width direction.

The transistor 101 includes an insulating layer 120 in contact with a substrate 115; an oxide semiconductor layer 130 in contact with the insulating layer 120; a conductive layer 140 and a conductive layer 150 electrically connected to the oxide semiconductor layer 130; an insulating layer 160 in contact with the oxide semiconductor layer 130, the conductive layer 140, and the conductive layer 150; a conductive layer 170 in contact with the insulating layer 160; an insulating layer 175 in contact with the conductive layer 140, the conductive layer 150, the insulating layer 160, and the conductive layer 170; and an insulating layer 180 in contact with the insulating layer 175. The insulating layer 180 may function as a planarization film as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 15B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layer 140 and the conductive layer 150, the resistance of the region 231 and the region 232 can be reduced.

Specifically, since the oxide semiconductor layer 130 is in contact with the conductive layer 140 and the conductive layer 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the region 231 and the region 232 to n-type regions with low resistance.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification. In addition, the term "electrode layer" can be replaced with the term "wiring".

The conductive layer 170 includes two layers, a conductive layer 171 and a conductive layer 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

Figure 16A:
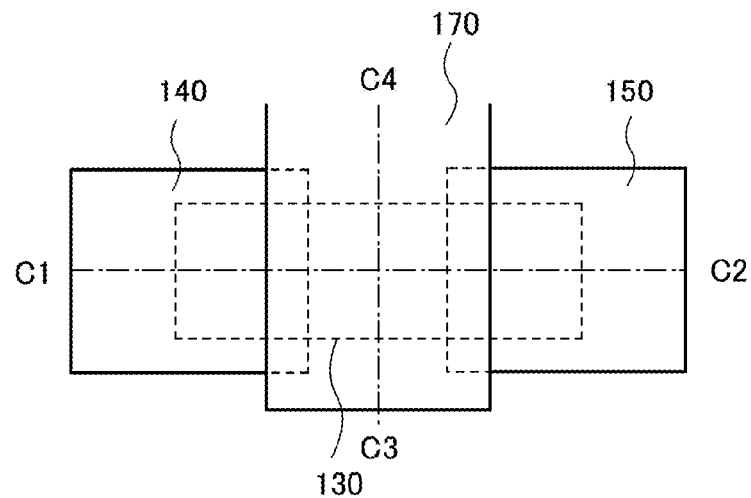
FIGS. 16A and 16B are a top view and a cross-sectional view illustrating a transistor.
Figure 16B:
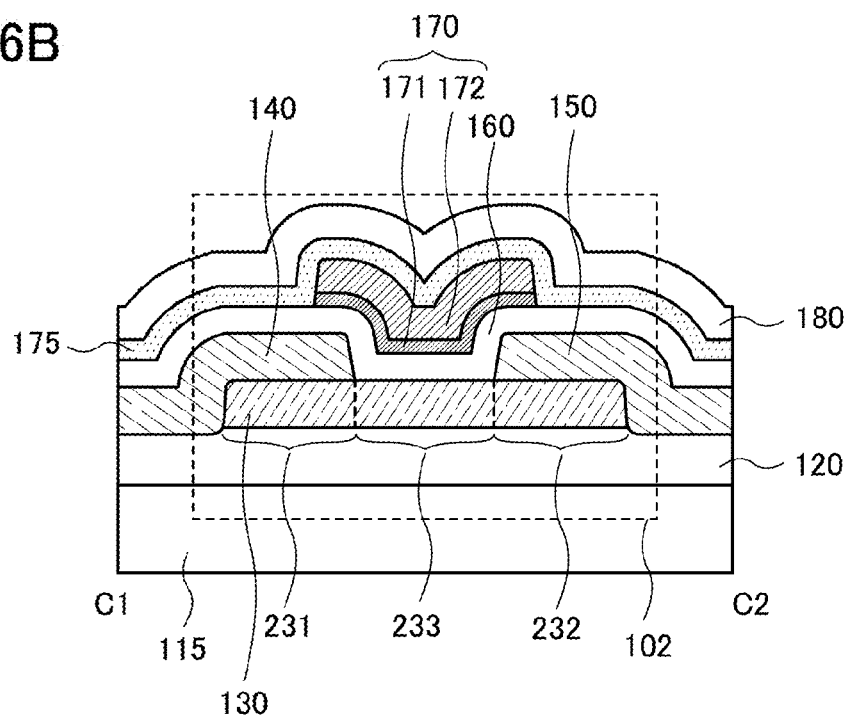
Figure 21B:
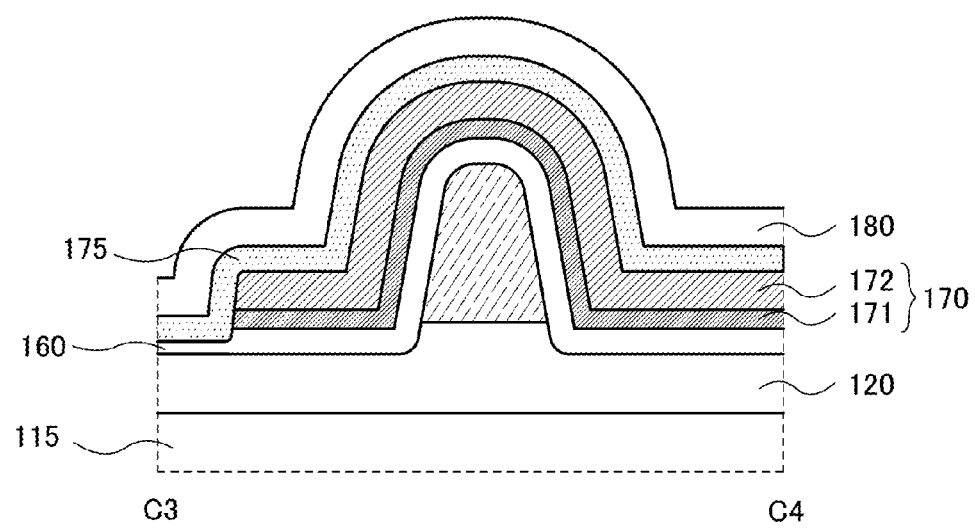
Figure 22A:
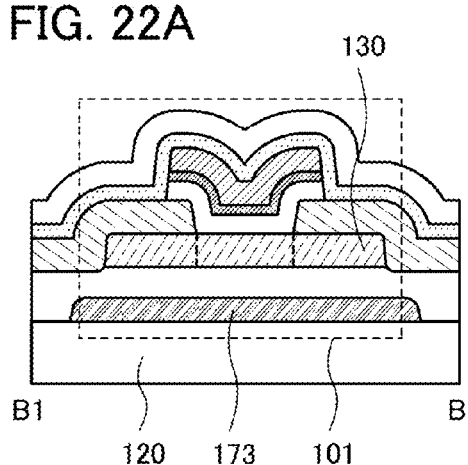
FIGS. 22A to 22F each illustrate a cross section of a transistor in a channel length direction.
Figure 22B:
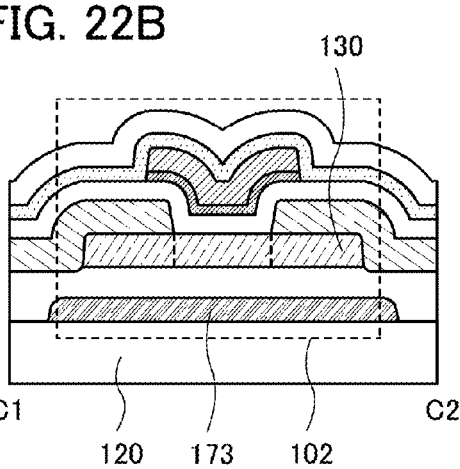
Figure 22C:
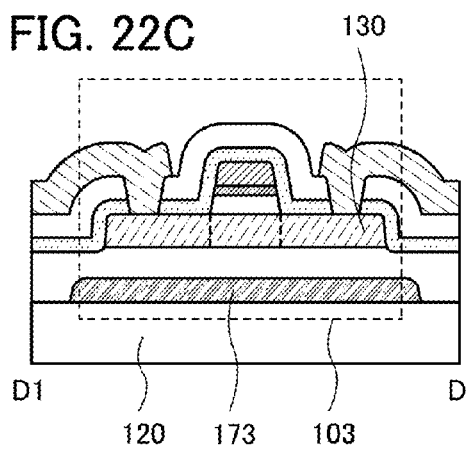
Figure 22D:
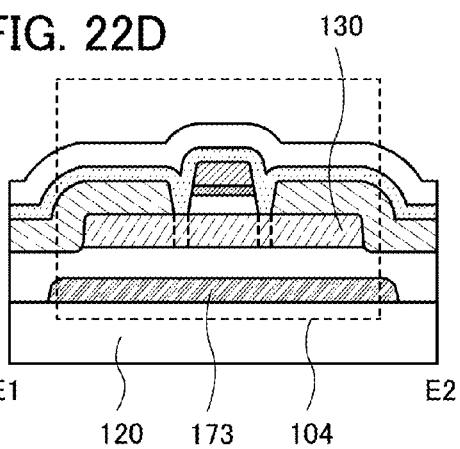
Figure 22E:
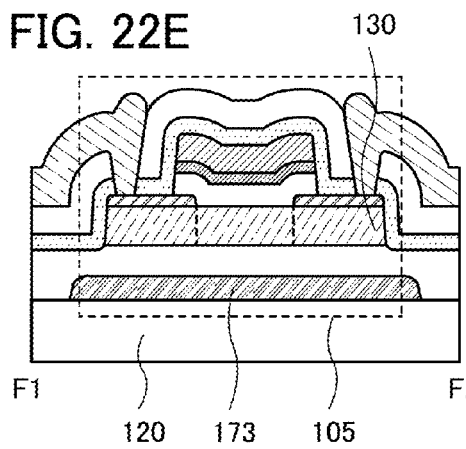
Figure 22F:
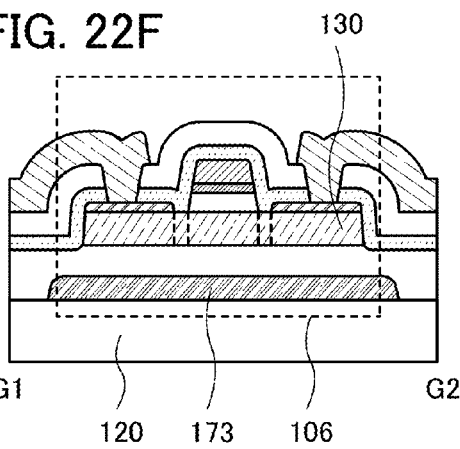

The transistor of one embodiment of the present invention may have a structure illustrated in FIGS. 16A and 16B. FIG. 16A is a top view of a transistor 102. A cross section in the direction of a dashed-dotted line C1-C2 in FIG. 16A is illustrated in FIG. 16B. A cross section in the direction of a dashed-dotted line C3-C4 in FIG. 16A is illustrated in FIG. 21B. In some cases, the direction of the dashed-dotted line C1-C2 is referred to as a channel length direction, and the direction of the dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layer 140 and the conductive layer 150 are covered with the insulating layer 160 and accordingly the resistance between the conductive layer 170 and the conductive layers 140 and 150 is high; therefore, the transistor 102 has a feature of low gate leakage current.

The transistor 101 and the transistor 102 each have a top-gate structure including a region where the conductive layer 170 overlaps with each of the conductive layers 140 and 150. To reduce parasitic capacitance, the width of the region in the channel length direction is preferably greater than or equal to 3 nm and less than 300 nm. Meanwhile, since an offset region is not formed in the oxide semiconductor layer 130, a transistor with high on-state current can be easily formed.

Figure 17A:
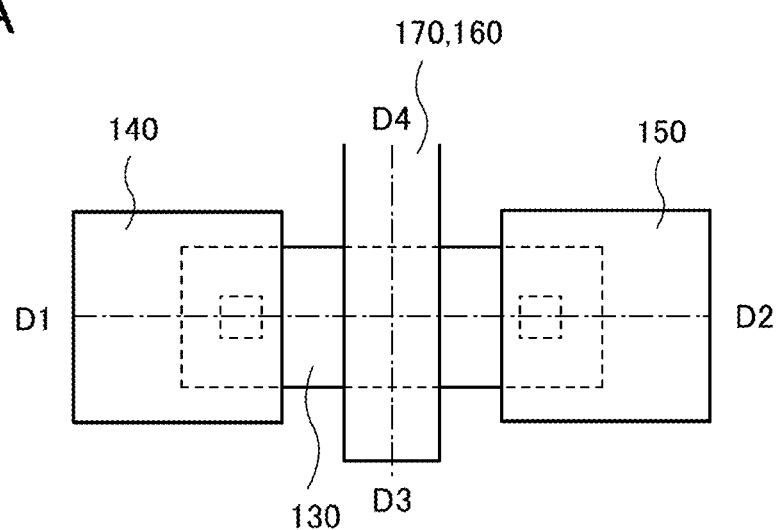
FIGS. 17A and 17B are a top view and a cross-sectional view illustrating a transistor.
Figure 17B:
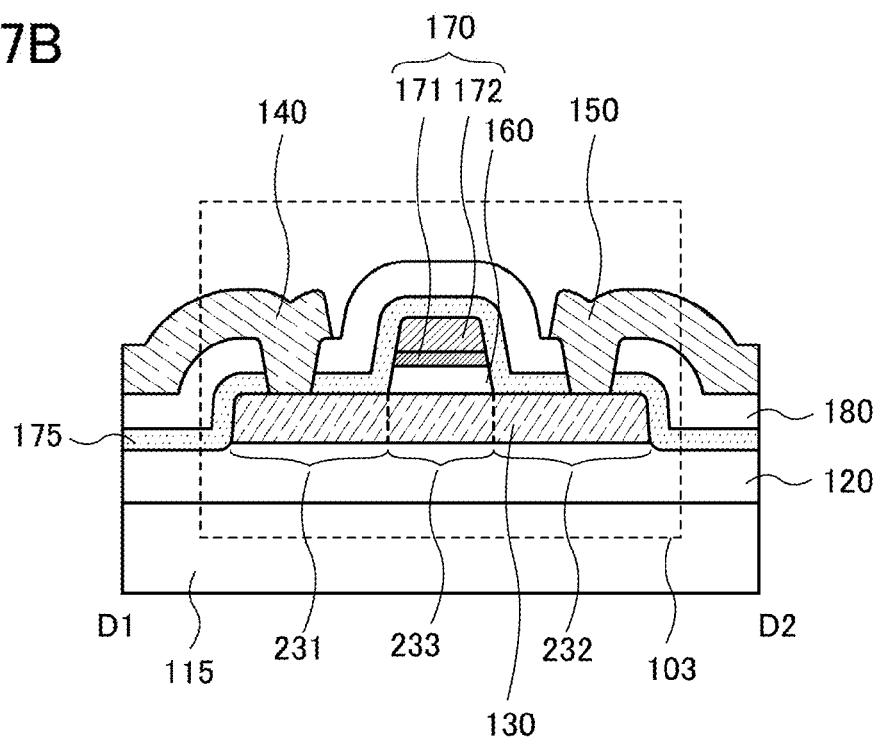

The transistor of one embodiment of the present invention may have a structure illustrated in FIGS. 17A and 17B. FIG. 17A is a top view of a transistor 103. A cross section in the direction of a dashed-dotted line D1-D2 in FIG. 17A is illustrated in FIG. 17B. A cross section in the direction of a dashed-dotted line D3-D4 in FIG. 17A is illustrated in FIG. 21A. In some cases, the direction of the dashed-dotted line D1-D2 is referred to as a channel length direction, and the direction of the dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layer 140 and the conductive layer 150 electrically connected to the oxide semiconductor layer 130 through openings provided in the insulating layer 175 and the insulating layer 180. The transistor 103 may also include, for example, an insulating layer (planarization film) in contact with the insulating layer 180, the conductive layer 140, and the conductive layer 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 17B can function as a source region, a drain region, and a channel formation region, respectively. The region 231 and the region 232 are in contact with the insulating layer 175. When an insulating material containing hydrogen is used for the insulating layer 175, for example, the resistance of the region 231 and the region 232 can be reduced.

Specifically, interaction between an oxygen vacancy generated in the region 231 and the region 232 by the steps up to the formation of the insulating layer 175 and hydrogen that diffuses into the region 231 and the region 232 from the insulating layer 175 changes the region 231 and the region 232 to n-type regions with low resistance. As the insulating material containing hydrogen, for example, a silicon nitride film, an aluminum nitride film, or the like can be used.

Figure 18A:
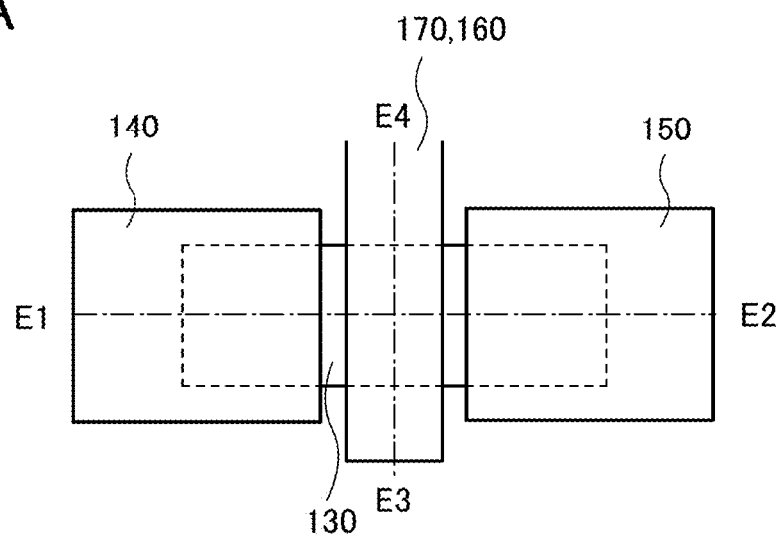
FIGS. 18A and 18B are a top view and a cross-sectional view illustrating a transistor.
Figure 18B:
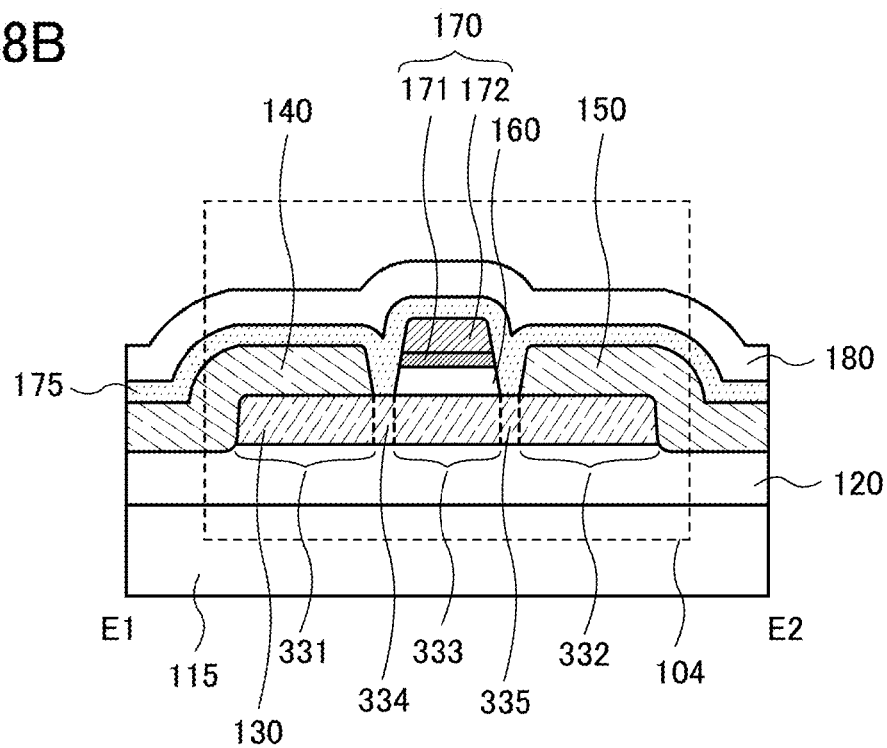

The transistor of one embodiment of the present invention may have a structure illustrated in FIGS. 18A and 18B. FIG. 18A is a top view of a transistor 104. A cross section in the direction of a dashed-dotted line E1-E2 in FIG. 18A is illustrated in FIG. 18B. A cross section in the direction of a dashed-dotted line E3-E4 in FIG. 18A is illustrated in FIG. 21A. In some cases, the direction of the dashed-dotted line E1-E2 is referred to as a channel length direction, and the direction of the dashed-dotted line E3-E4 is referred to as a channel width direction.

The transistor 104 has the same structure as the transistor 103 except that the conductive layer 140 and the conductive layer 150 in contact with the oxide semiconductor layer 130 cover end portions thereof.

In FIG. 18B, a region 331 and a region 334 can function as a source region, a region 332 and a region 335 can function as a drain region, and a region 333 can function as a channel formation region. The resistance of the region 331 and the region 332 can be reduced in a manner similar to that of the region 231 and the region 232 in the transistor 101. The resistance of the region 334 and the region 335 can be reduced in a manner similar to that of the region 231 and the region 232 in the transistor 103. In the case where the length of the region 334 and the region 335 in the channel length direction is less than or equal to 100 nm, preferably less than or equal to 50 nm, a gate electric field contributes to preventing a significant decrease in on-state current; therefore, a reduction in resistance of the region 334 and the region 335 as described above is not necessarily performed.

The transistor 103 and the transistor 104 each have a self-aligned structure not including a region where the conductive layer 170 overlaps with each of the conductive layers 140 and 150. A transistor with a self-aligned structure, which has extremely small parasitic capacitance between a gate electrode layer and source and drain electrode layers, is suitable for applications that require high-speed operation.

Figure 19A:
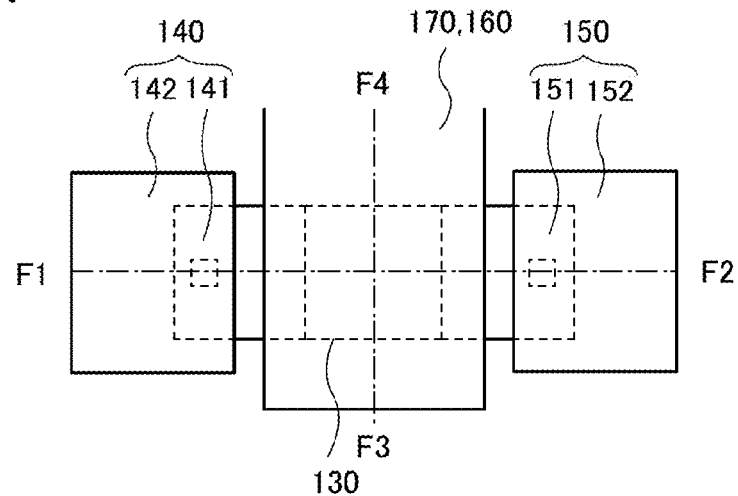
FIGS. 19A and 19B are a top view and a cross-sectional view illustrating a transistor.
Figure 19B:
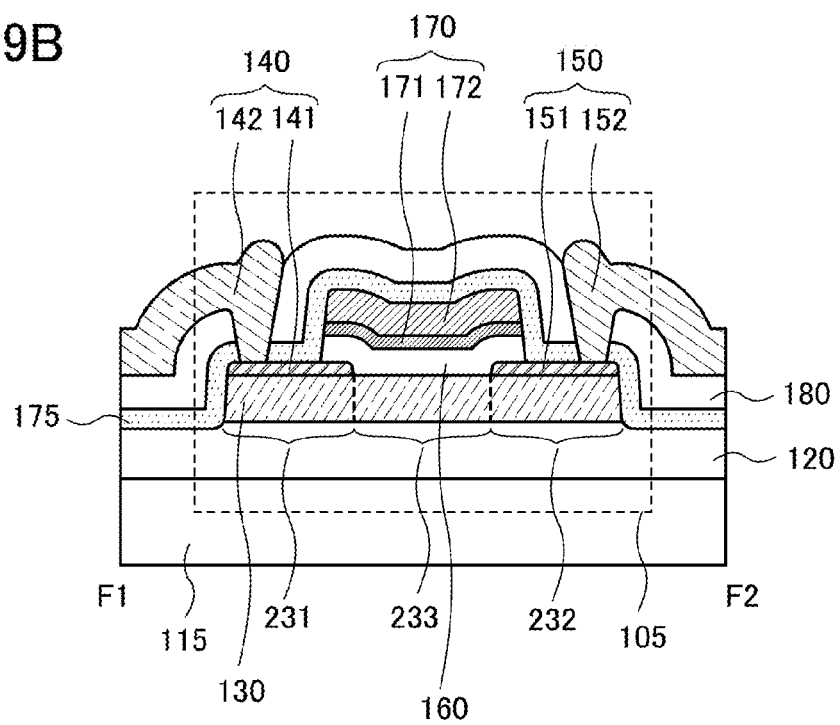

The transistor of one embodiment of the present invention may have a structure illustrated in FIGS. 19A and 19B. FIG. 19A is a top view of a transistor 105. A cross section in the direction of a dashed-dotted line F1-F2 in FIG. 19A is illustrated in FIG. 19B. A cross section in the direction of a dashed-dotted line F3-F4 in FIG. 19A is illustrated in FIG. 21A. In some cases, the direction of the dashed-dotted line F1-F2 is referred to as a channel length direction, and the direction of the dashed-dotted line F3-F4 is referred to as a channel width direction.

The transistor 105 includes the insulating layer 120 in contact with the substrate 115; the oxide semiconductor layer 130 in contact with the insulating layer 120; a conductive layer 141 and a conductive layer 151 electrically connected to the oxide semiconductor layer 130; the insulating layer 160 in contact with the oxide semiconductor layer 130, the conductive layer 141, and the conductive layer 151; the conductive layer 170 in contact with the insulating layer 160; the insulating layer 175 in contact with the oxide semiconductor layer 130, the conductive layer 141, the conductive layer 151, the insulating layer 160, and the conductive layer 170; the insulating layer 180 in contact with the insulating layer 175; and a conductive layer 142 and a conductive layer 152 electrically connected to the conductive layer 141 and the conductive layer 151, respectively, through openings provided in the insulating layer 175 and the insulating layer 180. The transistor 105 may also include, for example, an insulating layer in contact with the insulating layer 180, the conductive layer 142, and the conductive layer 152 as necessary.

Here, the conductive layer 141 and the conductive layer 151 are in contact with the top surface of the oxide semiconductor layer 130 and are not in contact with side surfaces of the oxide semiconductor layer 130.

The transistor 105 has the same structure as the transistor 101 except that the conductive layer 141 and the conductive layer 151 are provided, the openings are provided in the insulating layer 175 and the insulating layer 180, and that the conductive layer 142 and the conductive layer 152 electrically connected to the conductive layer 141 and the conductive layer 151, respectively, through the openings are provided. The conductive layer 140 (the conductive layer 141 and the conductive layer 142) can function as a source electrode layer, and the conductive layer 150 (the conductive layer 151 and the conductive layer 152) can function as a drain electrode layer.

Figure 20A:
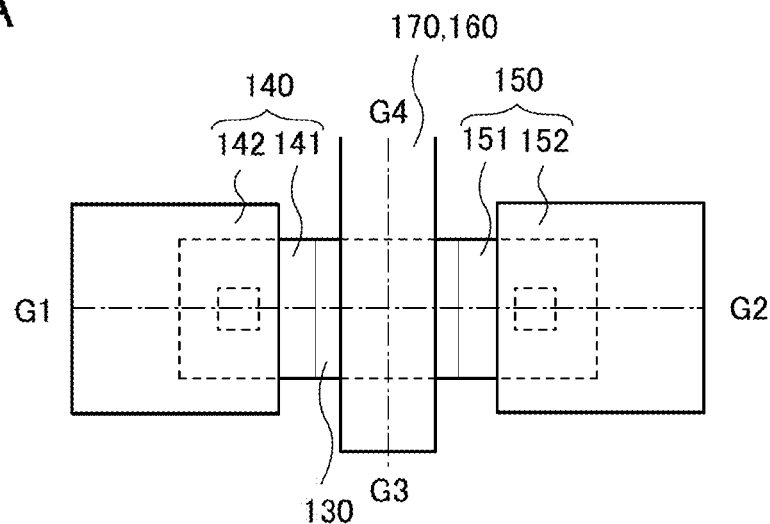
FIGS. 20A and 20B are a top view and a cross-sectional view illustrating a transistor.
Figure 20B:
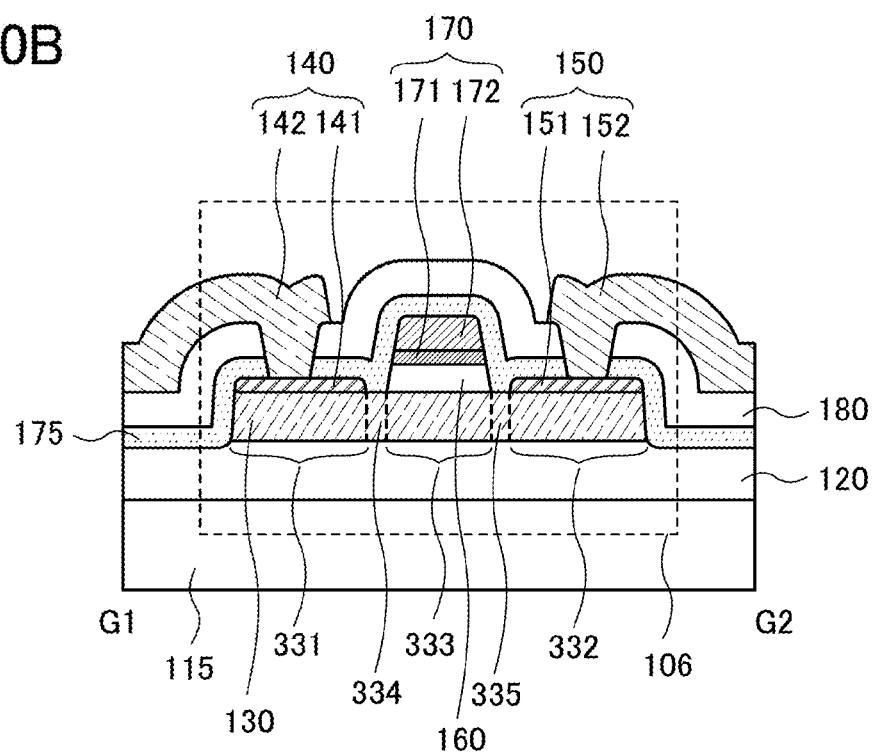

The transistor of one embodiment of the present invention may have a structure illustrated in FIGS. 20A and 20B. FIG. 20A is a top view of a transistor 106. A cross section in the direction of a dashed-dotted line G1-G2 in FIG. 20A is illustrated in FIG. 20B. A cross section in the direction of a dashed-dotted line G3-G4 in FIG. 20A is illustrated in FIG. 21A. In some cases, the direction of the dashed-dotted line G1-G2 is referred to as a channel length direction, and the direction of the dashed-dotted line G3-G4 is referred to as a channel width direction.

The transistor 106 includes the insulating layer 120 in contact with the substrate 115; the oxide semiconductor layer 130 in contact with the insulating layer 120; the conductive layer 141 and the conductive layer 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layer 141, the conductive layer 151, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. The transistor 106 may also include, for example, an insulating layer (planarization film) in contact with the insulating layer 180, the conductive layer 142, and the conductive layer 152 as necessary.

Here, the conductive layer 141 and the conductive layer 151 are in contact with the top surface of the oxide semiconductor layer 130 and are not in contact with side surfaces of the oxide semiconductor layer 130.

The transistor 106 has the same structure as the transistor 103 except that the conductive layer 141 and the conductive layer 151 are provided. The conductive layer 140 (the conductive layer 141 and the conductive layer 142) can function as a source electrode layer, and the conductive layer 150 (the conductive layer 151 and the conductive layer 152) can function as a drain electrode layer.

In the structures of the transistor 105 and the transistor 106, the conductive layer 140 and the conductive layer 150 are not in contact with the insulating layer 120. These structures make the insulating layer 120 less likely to be deprived of oxygen by the conductive layer 140 and the conductive layer 150 and facilitate oxygen supply from the insulating layer 120 to the oxide semiconductor layer 130.

Note that an impurity for forming an oxygen vacancy to increase conductivity may be added to the region 231 and the region 232 in the transistor 103 and the region 334 and the region 335 in the transistor 104 and the transistor 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, an ion implantation method, an ion doping method, a plasma immersion ion implantation method, or the like can be used.

When the above element is added as an impurity element to the oxide semiconductor layer, a bond between a metal element and oxygen in the oxide semiconductor layer is cut, whereby an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor.

The oxide conductor is a degenerate semiconductor and it is suggested that the conduction band edge equals to or substantially equals to the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 23A:
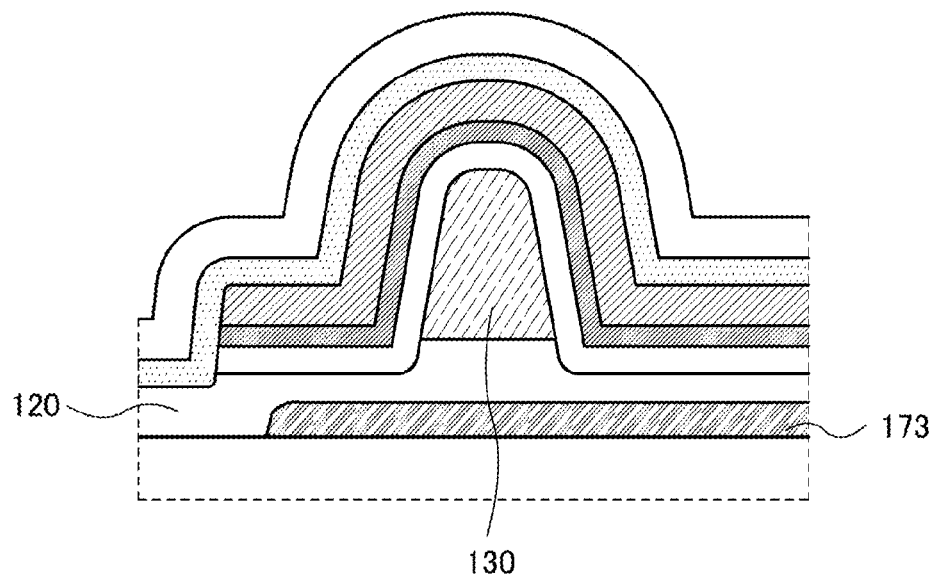
FIGS. 23A and 23B each illustrate a cross section of a transistor in a channel width direction.
Figure 23B:
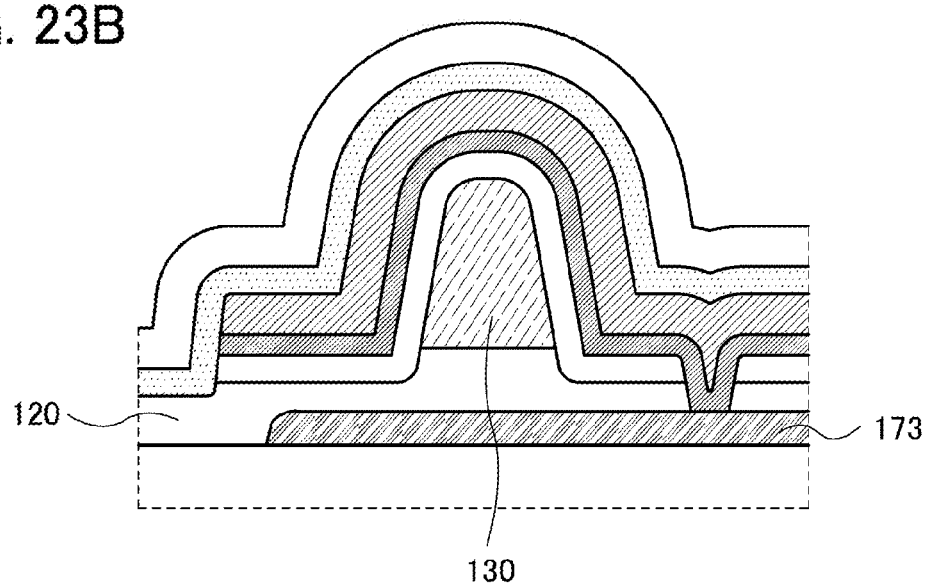

The transistor of one embodiment of the present invention may include a conductive layer 173 between the oxide semiconductor layer 130 and the substrate 115 as illustrated in the cross-sectional views in the channel length direction in FIGS. 22A to 22F and the cross-sectional views in the channel width direction in FIGS. 23A and 23B. When the conductive layer is used as a second gate electrode layer (back gate), the on-state current can be further increased or the threshold voltage can be controlled. In the cross-sectional views in FIGS. 22A to 22F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layer 170 and the conductive layer 173 are set to have the same potential, and the transistor is driven as a double-gate transistor. Furthermore, to control the threshold voltage, a fixed potential, which is different from a potential of the conductive layer 170, is supplied to the conductive layer 173. To set the conductive layer 170 and the conductive layer 173 at the same potential, for example, as shown in FIG. 23B, the conductive layer 170 and the conductive layer 173 may be electrically connected to each other through a contact hole.

The transistors 101 to 106 shown in FIGS. 15A and 15B, FIGS. 16A and 16B, FIGS. 17A and 17B, FIGS. 18A and 18B, FIGS. 19A and 19B, and FIGS. 20A and 20B are examples in which the oxide semiconductor layer 130 is a single layer; alternatively, the oxide semiconductor layer 130 may be a stacked layer. The oxide semiconductor layer 130 in the transistors 101 to 106 can be replaced with the oxide semiconductor layer 130 shown in FIGS. 24A to 24C or FIGS. 25A to 25C.

Figure 24A:
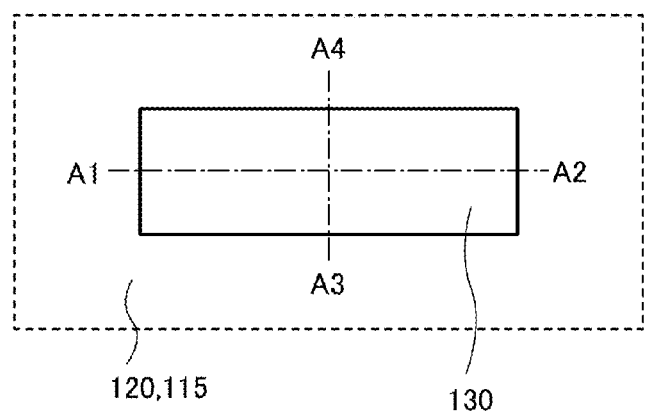
FIGS. 24A to 24C are a top view and cross-sectional views illustrating a semiconductor layer.
Figure 24B:
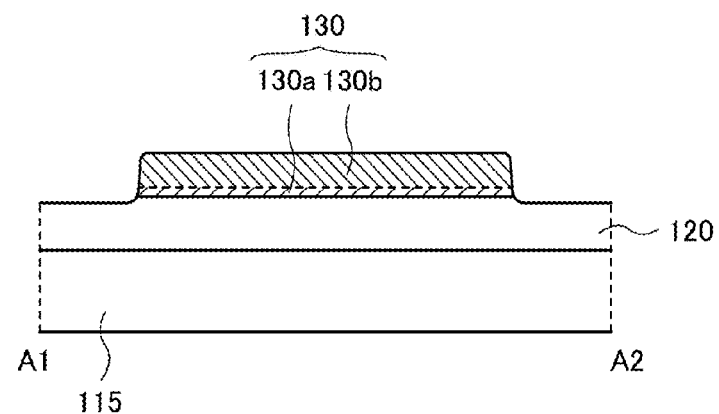
Figure 24C:
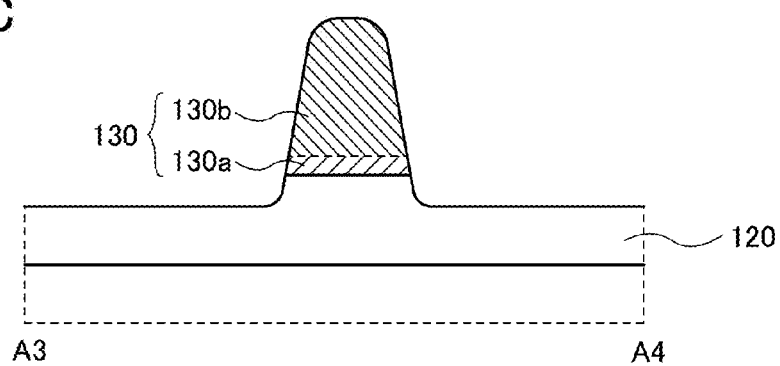

FIGS. 24A to 24C are a top view and cross-sectional views of the oxide semiconductor layer 130 with a two-layer structure. FIG. 24A is the top view. FIG. 24B illustrates a cross section in the direction of a dashed-dotted line A1-A2 in FIG. 24A. FIG. 24C illustrates a cross section in the direction of a dashed-dotted line A3-A4 in FIG. 24A.

Figure 25A:
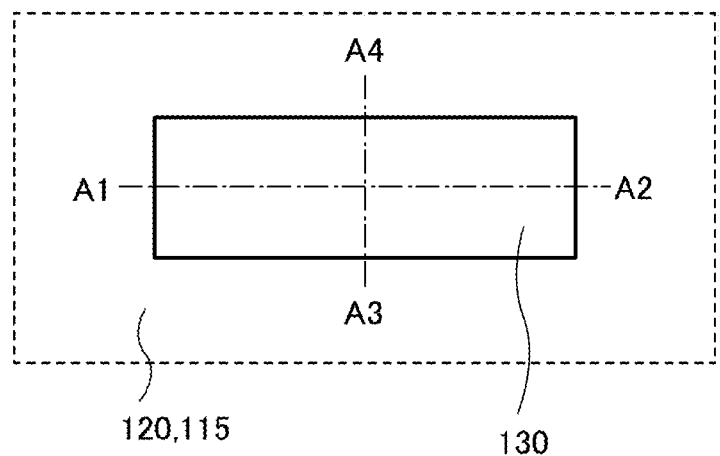
FIGS. 25A to 25C are a top view and cross-sectional views illustrating a semiconductor layer.
Figure 25B:
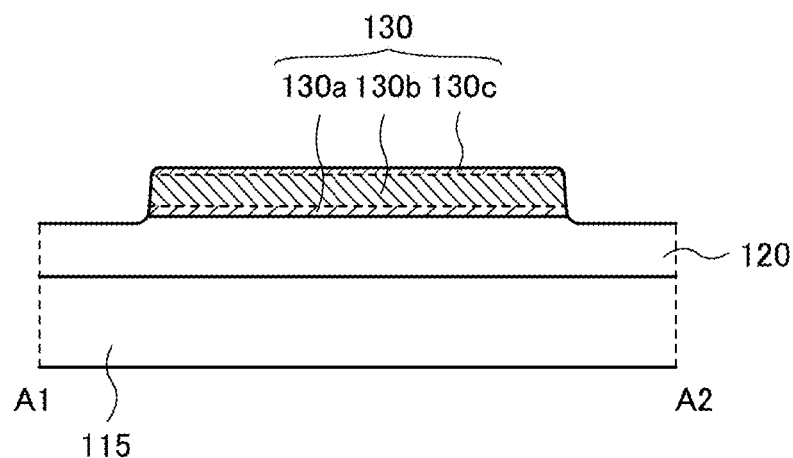
Figure 25C:
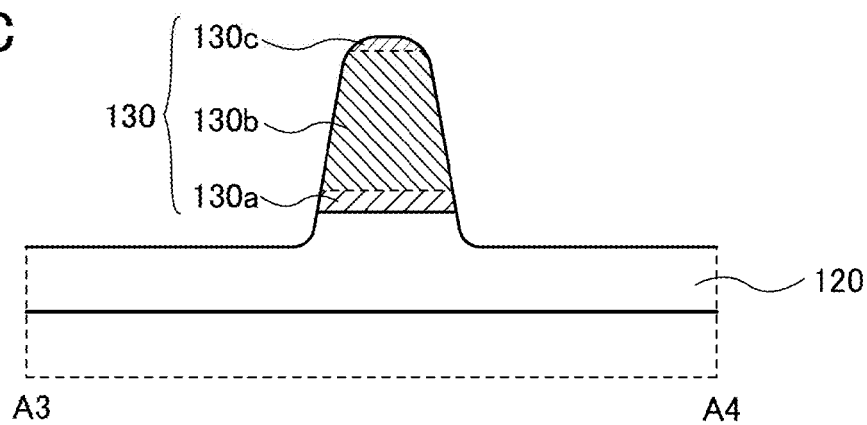

FIGS. 25A to 25C are a top view and cross-sectional views of the oxide semiconductor layer 130 with a three-layer structure. FIG. 25A is the top view. FIG. 25B illustrates a cross section in the direction of a dashed-dotted line A1-A2 in FIG. 25A. FIG. 25C illustrates a cross section in the direction of a dashed-dotted line A3-A4 in FIG. 25A.

Oxide semiconductor layers with different compositions, for example, can be used as an oxide semiconductor layer 130a, an oxide semiconductor layer 130b, and an oxide semiconductor layer 130c.

Figure 26A:
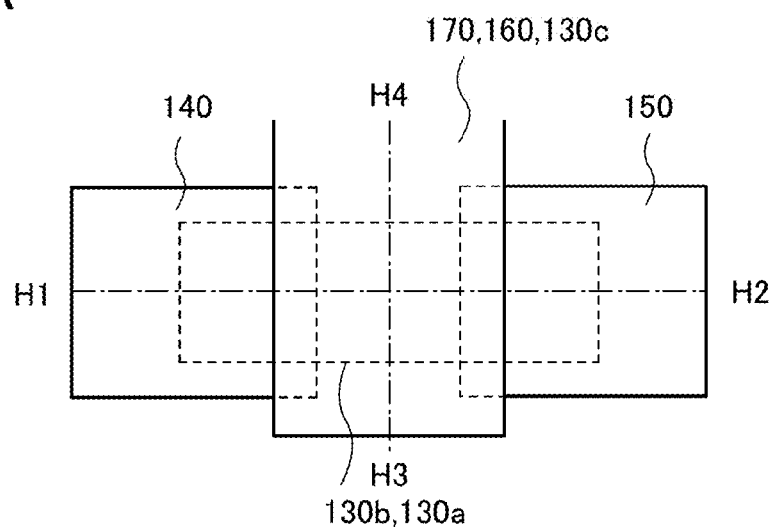
FIGS. 26A and 26B are a top view and a cross-sectional view illustrating a transistor.
Figure 26B:
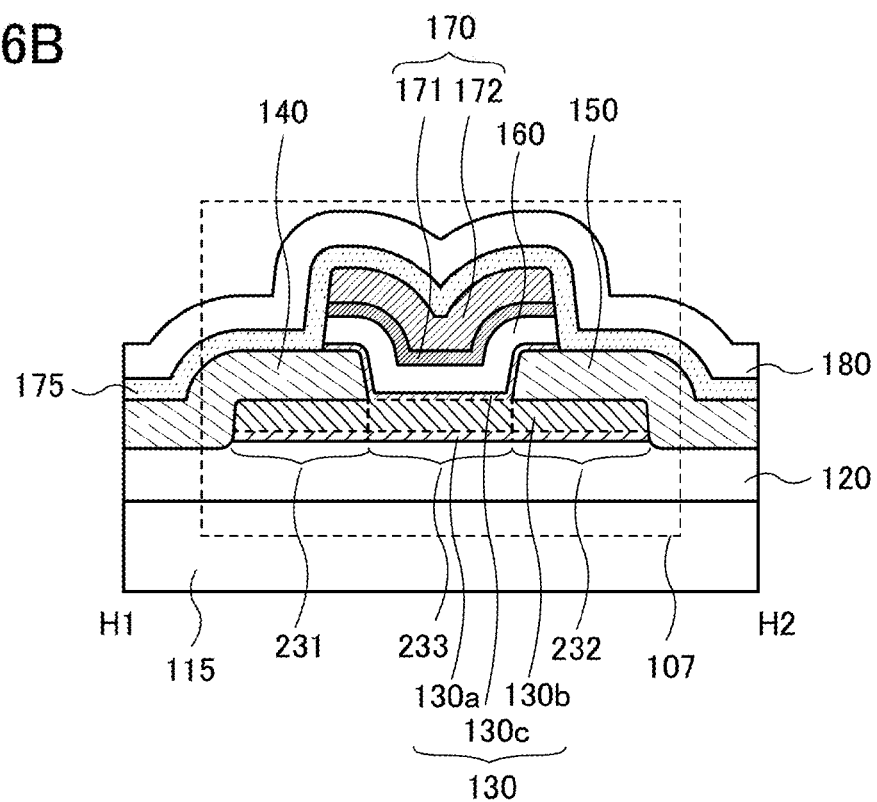
Figure 32A:
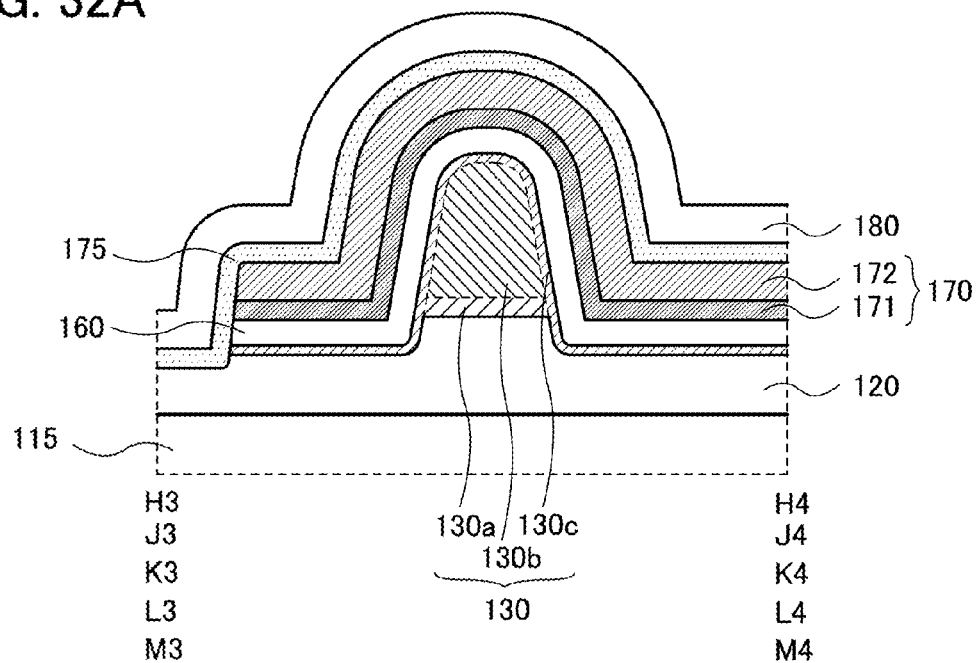
FIGS. 32A and 32B each illustrate a cross section of a transistor in a channel width direction.

The transistor of one embodiment of the present invention may have a structure illustrated in FIGS. 26A and 26B. FIG. 26A is a top view of a transistor 107. A cross section in the direction of a dashed-dotted line H1-H2 in FIG. 26A is illustrated in FIG. 26B. A cross section in the direction of a dashed-dotted line H3-H4 in FIG. 26A is illustrated in FIG. 32A. In some cases, the direction of the dashed-dotted line H1-H2 is referred to as a channel length direction, and the direction of the dashed-dotted line H3-H4 is referred to as a channel width direction.

The transistor 107 includes the insulating layer 120 in contact with the substrate 115; a stack of the oxide semiconductor layer 130a and the oxide semiconductor layer 130b, in contact with the insulating layer 120; the conductive layer 140 and the conductive layer 150 electrically connected to the stack; the oxide semiconductor layer 130c in contact with the stack, the conductive layer 140, and the conductive layer 150; the insulating layer 160 in contact with the oxide semiconductor layer 130c; the conductive layer 170 in contact with the insulating layer 160; the insulating layer 175 in contact with the conductive layer 140, the conductive layer 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layer 130a and the oxide semiconductor layer 130b) in the region 231 and the region 232, that the oxide semiconductor layer 130 includes three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the insulating layer 160 and the conductive layers 140 and 150.

Figure 27A:
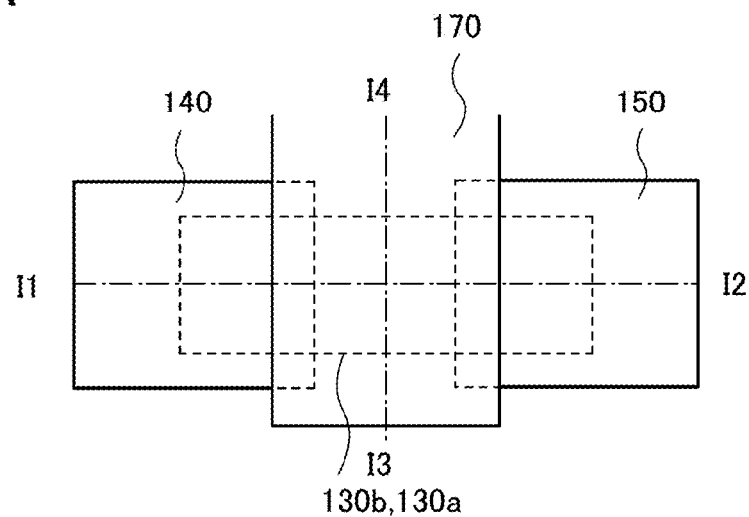
FIGS. 27A and 27B are a top view and a cross-sectional view illustrating a transistor.
Figure 27B:
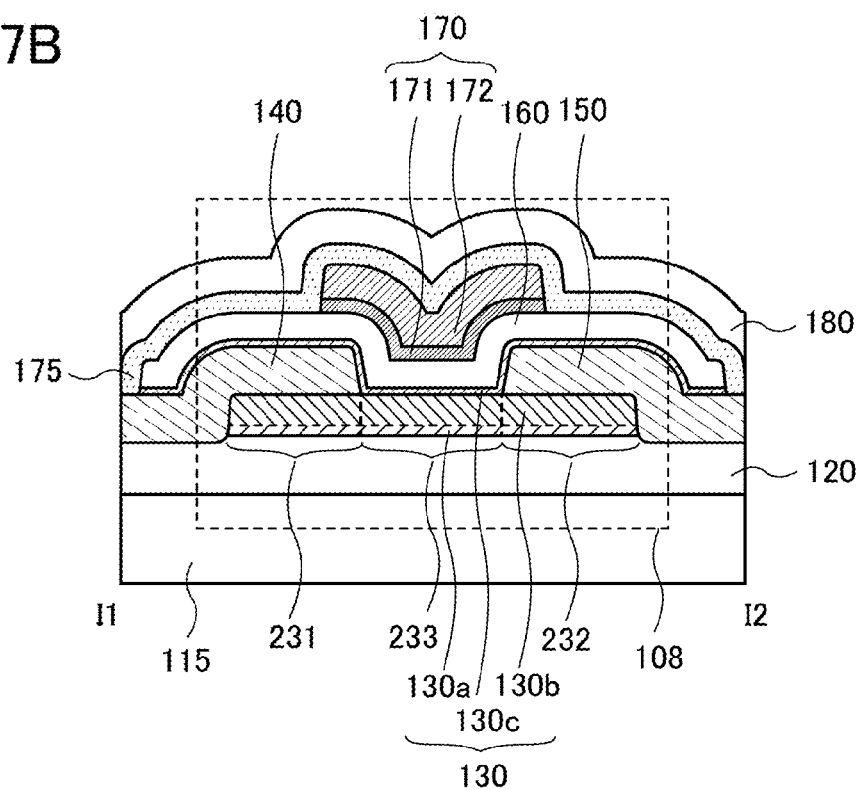
Figure 32B:
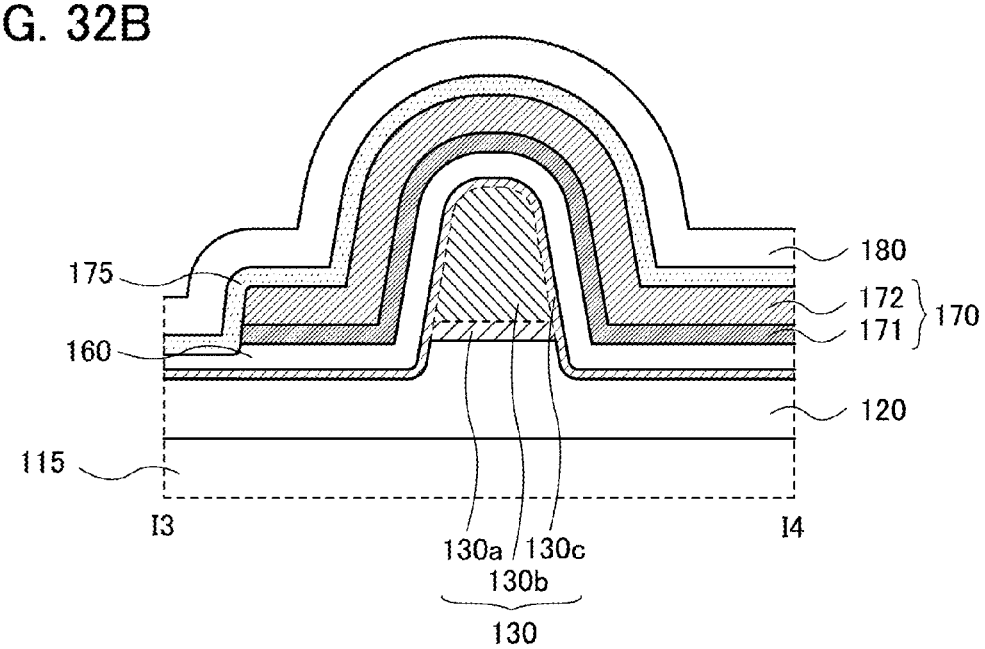

The transistor of one embodiment of the present invention may have a structure illustrated in FIGS. 27A and 27B. FIG. 27A is a top view of a transistor 108. A cross section in the direction of a dashed-dotted line 11-12 in FIG. 27A is illustrated in FIG. 27B. A cross section in the direction of a dashed-dotted line 13-14 in FIG. 27A is illustrated in FIG. 32B. In some cases, the direction of the dashed-dotted line 11-12 is referred to as a channel length direction, and the direction of the dashed-dotted line 13-14 is referred to as a channel width direction.

The transistor 108 is different from the transistor 107 in that end portions of the insulating layer 160 and the oxide semiconductor layer 130c are not aligned with an end portion of the conductive layer 170.

Figure 28A:
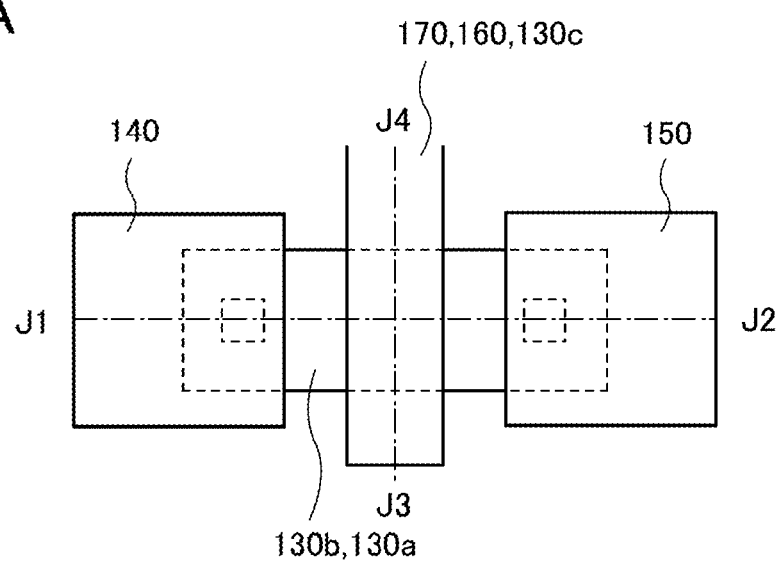
FIGS. 28A and 28B are a top view and a cross-sectional view illustrating a transistor.
Figure 28B:
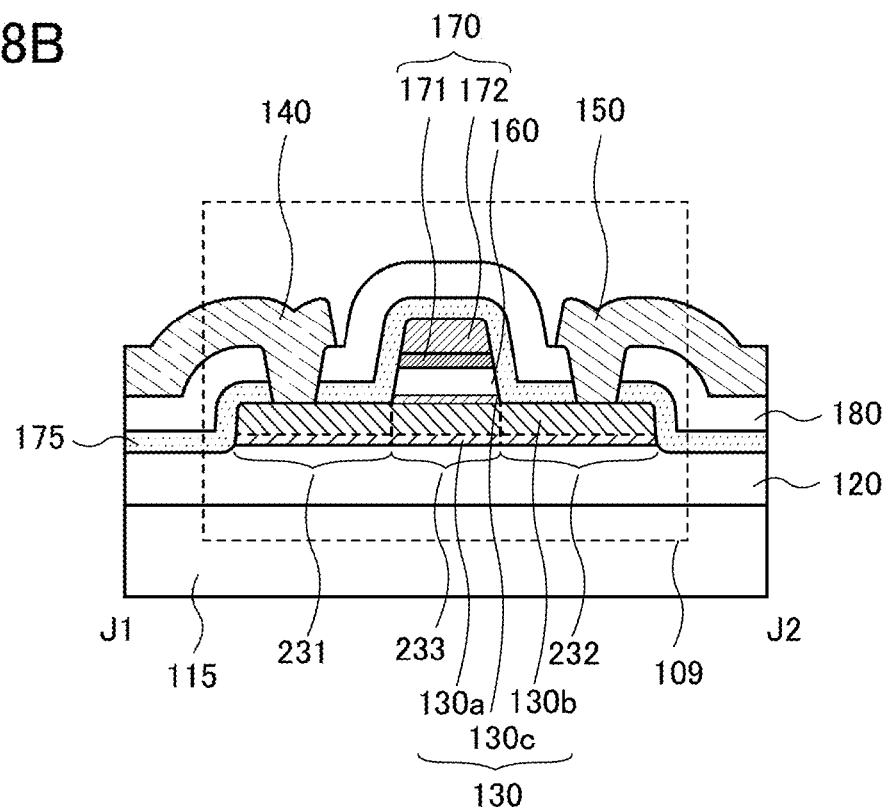

The transistor of one embodiment of the present invention may have a structure illustrated in FIGS. 28A and 28B. FIG. 28A is a top view of a transistor 109. A cross section in the direction of a dashed-dotted line J1-J2 in FIG. 28A is illustrated in FIG. 28B. A cross section in the direction of a dashed-dotted line J3-J4 in FIG. 28A is illustrated in FIG. 32A. In some cases, the direction of the dashed-dotted line J1-J2 is referred to as a channel length direction, and the direction of the dashed-dotted line J3-J4 is referred to as a channel width direction.

The transistor 109 includes the insulating layer 120 in contact with the substrate 115; a stack of the oxide semiconductor layer 130a and the oxide semiconductor layer 130b, in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layer 140 and the conductive layer 150 electrically connected to the stack through openings provided in the insulating layer 175 and the insulating layer 180. The transistor 109 may also include, for example, an insulating layer (planarization film) in contact with the insulating layer 180, the conductive layer 140, and the conductive layer 150 as necessary.

The transistor 109 has the same structure as the transistor 103 except that the oxide semiconductor layer 130 includes two layers (the oxide semiconductor layer 130a and the oxide semiconductor layer 130b) in the region 231 and the region 232 and that the oxide semiconductor layer 130 includes three layers (the oxide semiconductor layer 130a, the oxide semiconductor layer 130b, and the oxide semiconductor layer 130c) in the region 233.

Figure 29A:
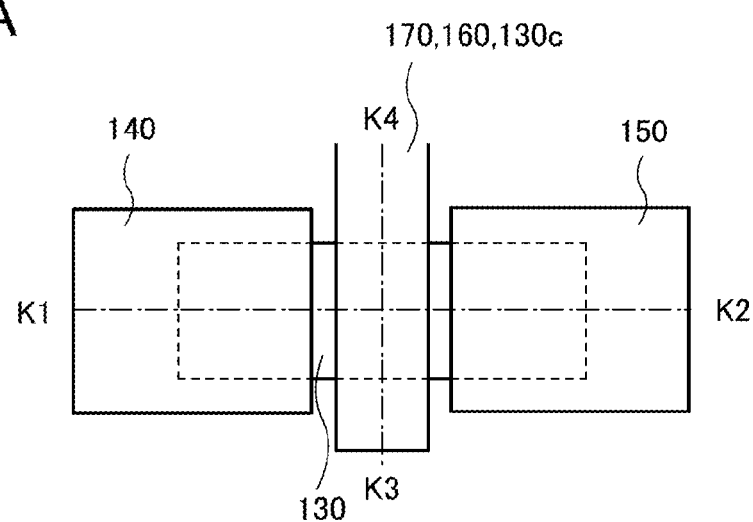
FIGS. 29A and 29B are a top view and a cross-sectional view illustrating a transistor.
Figure 29B:
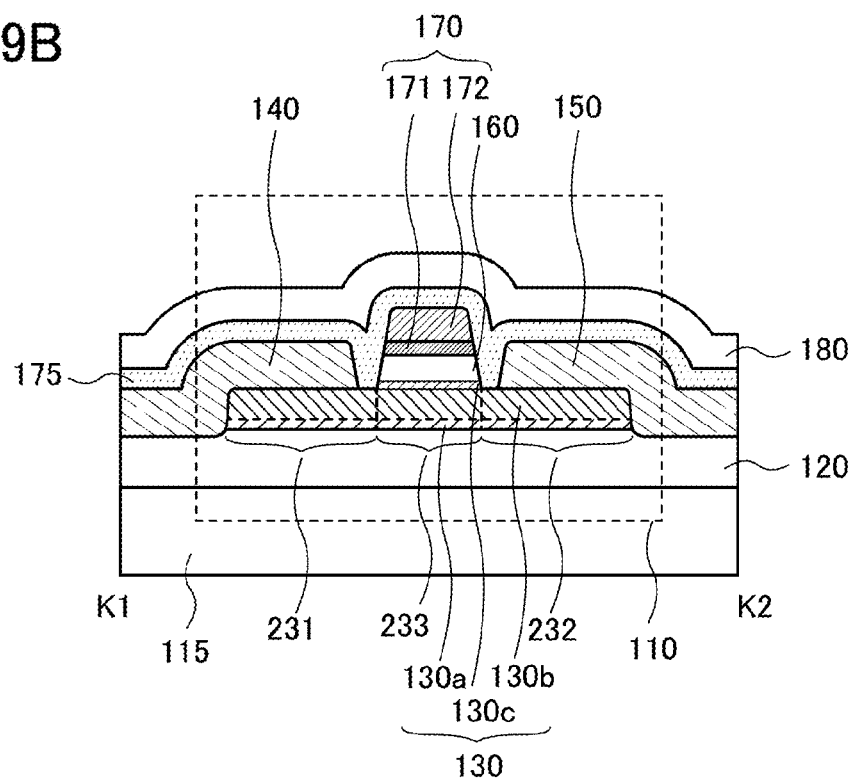

The transistor of one embodiment of the present invention may have a structure illustrated in FIGS. 29A and 29B. FIG. 29A is a top view of a transistor 110. A cross section in the direction of a dashed-dotted line K1-K2 in FIG. 29A is illustrated in FIG. 29B. A cross section in the direction of a dashed-dotted line K3-K4 in FIG. 29A is illustrated in FIG. 32A. In some cases, the direction of the dashed-dotted line K1-K2 is referred to as a channel length direction, and the direction of the dashed-dotted line K3-K4 is referred to as a channel width direction.

The transistor 110 has the same structure as the transistor 104 except that the oxide semiconductor layer 130 includes two layers (the oxide semiconductor layer 130a and the oxide semiconductor layer 130b) in the region 231 and the region 232 and that the oxide semiconductor layer 130 includes three layers (the oxide semiconductor layer 130a, the oxide semiconductor layer 130b, and the oxide semiconductor layer 130c) in the region 233.

Figure 30A:
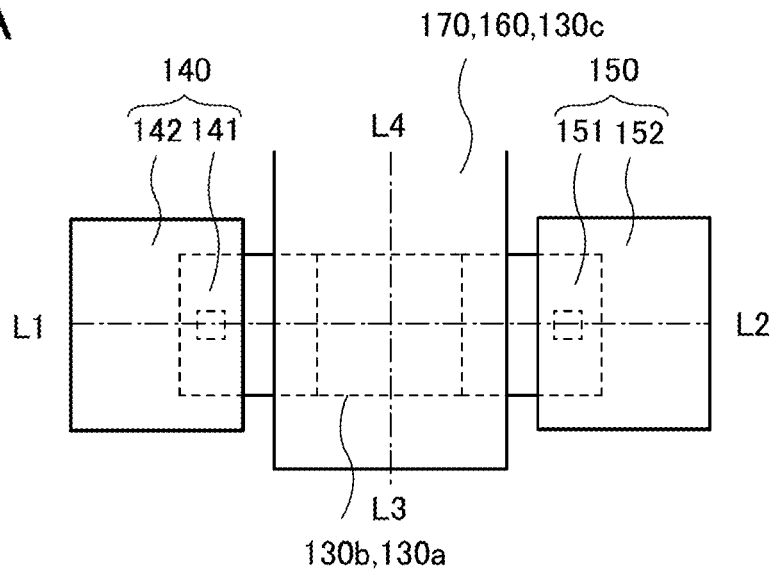
FIGS. 30A and 30B are a top view and a cross-sectional view illustrating a transistor.
Figure 30B:
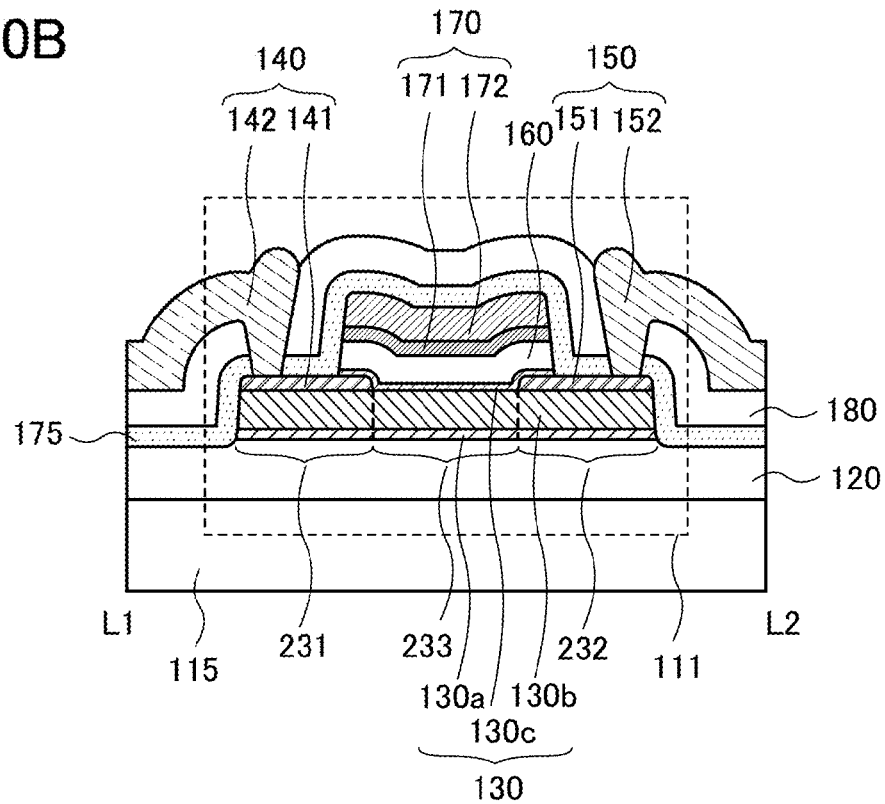

The transistor of one embodiment of the present invention may have a structure illustrated in FIGS. 30A and 30B. FIG. 30A is a top view of a transistor 111. A cross section in the direction of a dashed-dotted line L1-L2 in FIG. 30A is illustrated in FIG. 30B. A cross section in the direction of a dashed-dotted line L3-L4 in FIG. 30A is illustrated in FIG. 32A. In some cases, the direction of the dashed-dotted line L1-L2 is referred to as a channel length direction, and the direction of the dashed-dotted line L3-L4 is referred to as a channel width direction.

The transistor 111 includes the insulating layer 120 in contact with the substrate 115; a stack of the oxide semiconductor layer 130a and the oxide semiconductor layer 130b, in contact with the insulating layer 120; the conductive layer 141 and the conductive layer 151 electrically connected to the stack; the oxide semiconductor layer 130c in contact with the stack, the conductive layer 141, and the conductive layer 151; the insulating layer 160 in contact with the oxide semiconductor layer 130c; the conductive layer 170 in contact with the insulating layer 160; the insulating layer 175 in contact with the stack, the conductive layer 141, the conductive layer 151, the oxide semiconductor layer 130c, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. The transistor 111 may also include, for example, an insulating layer (planarization film) in contact with the insulating layer 180, the conductive layer 142, and the conductive layer 152 as necessary.

The transistor 111 has the same structure as the transistor 105 except that the oxide semiconductor layer 130 includes two layers (the oxide semiconductor layer 130a and the oxide semiconductor layer 130b) in the region 231 and the region 232, that the oxide semiconductor layer 130 includes three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the insulating layer 160 and the conductive layers 141 and 151.

Figure 31A:
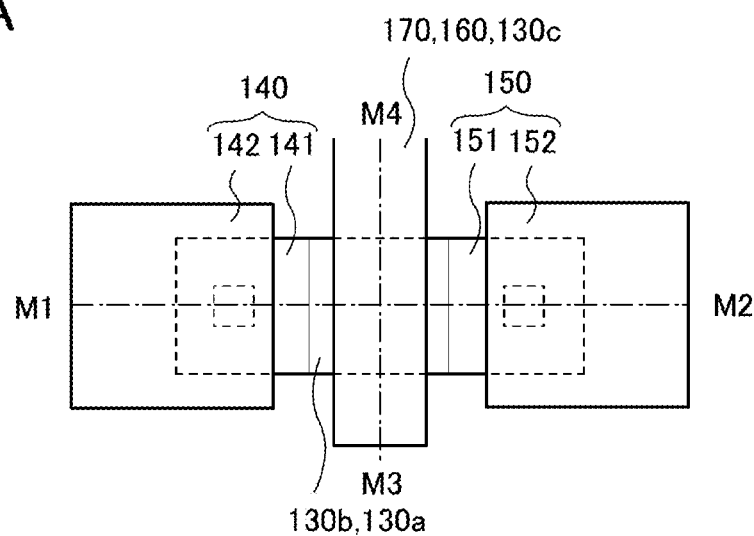
FIGS. 31A and 31B are a top view and a cross-sectional view illustrating a transistor.
Figure 31B:
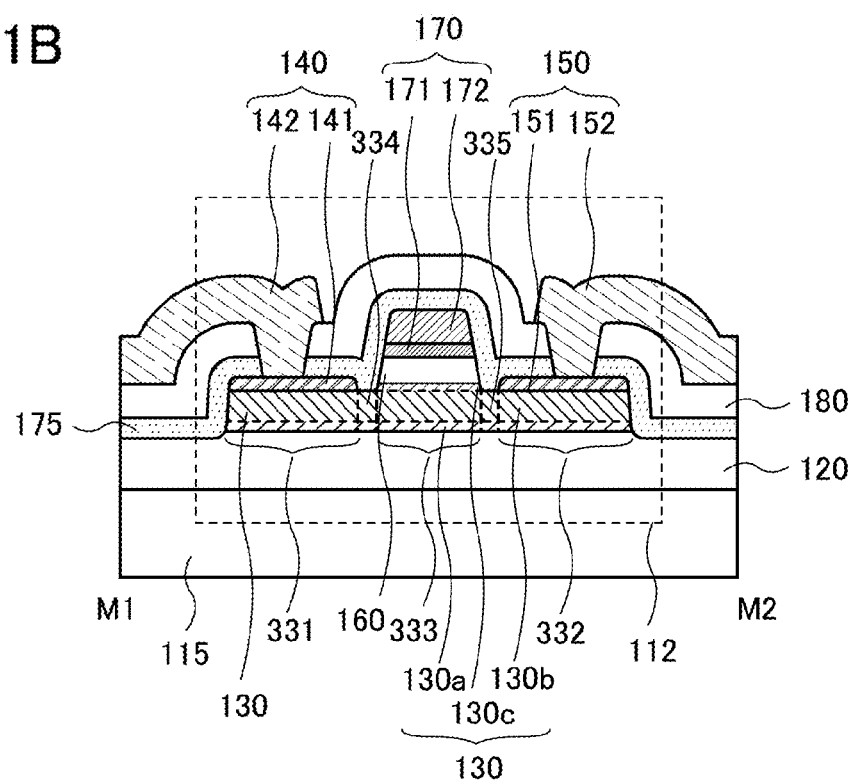

The transistor of one embodiment of the present invention may have a structure illustrated in FIGS. 31A and 31B. FIG. 31A is a top view of a transistor 112. A cross section in the direction of a dashed-dotted line M1-M2 in FIG. 31A is illustrated in FIG. 31B. A cross section in the direction of a dashed-dotted line M3-M4 in FIG. 31A is illustrated in FIG. 32A. In some cases, the direction of the dashed-dotted line M1-M2 is referred to as a channel length direction, and the direction of the dashed-dotted line M3-M4 is referred to as a channel width direction.

The transistor 112 has the same structure as the transistor 106 except that the oxide semiconductor layer 130 includes two layers (the oxide semiconductor layer 130a and the oxide semiconductor layer 130b) in the region 331, the region 332, the region 334, and the region 335 and that the oxide semiconductor layer 130 includes three layers (the oxide semiconductor layer 130a, the oxide semiconductor layer 130b, and the oxide semiconductor layer 130c) in the region 333.

Figure 34A:
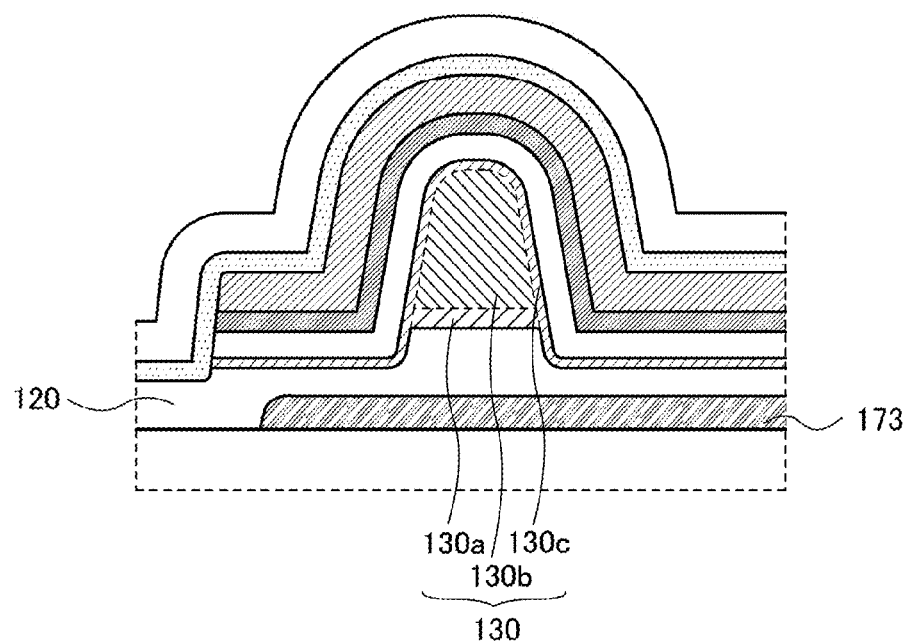
FIGS. 34A and 34B each illustrate a cross section of a transistor in a channel width direction.
Figure 34B:
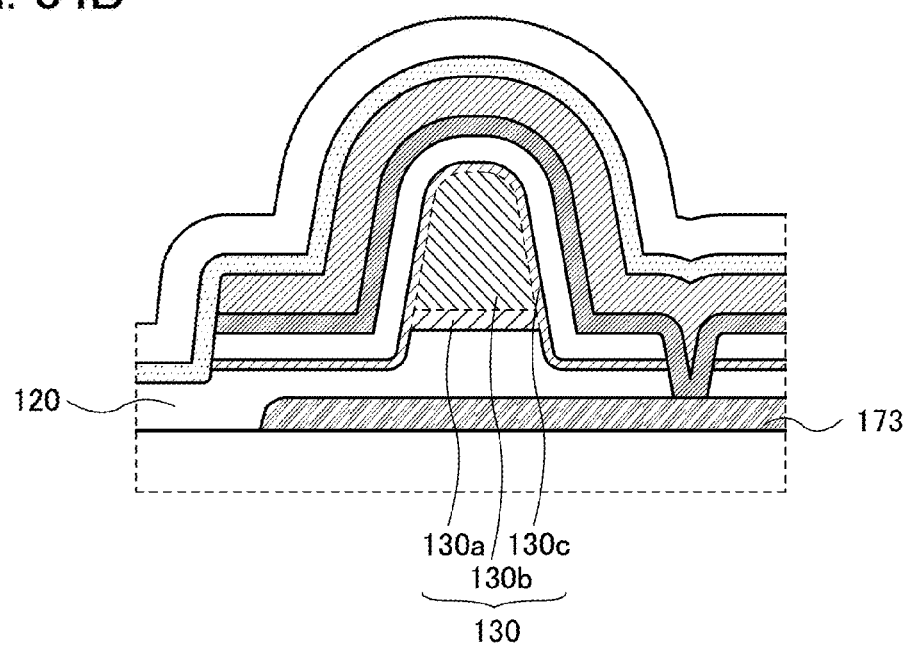

The transistor of one embodiment of the present invention may include the conductive layer 173 between the oxide semiconductor layer 130 and the substrate 115 as illustrated in the cross-sectional views in the channel length direction in FIGS. 33A to 33F and the cross-sectional views in the channel width direction in FIGS. 34A and 34B. When the conductive layer is used as a second gate electrode layer (back gate), the on-state current can be increased or the threshold voltage can be controlled. In the cross-sectional views in FIGS. 33A to 33F, the width of the conductive layer 173 may be shorter than that of the oxide semiconductor layer 130. Moreover, the width of the conductive layer 173 may be shorter than that of the conductive layer 170.

Figure 35A:
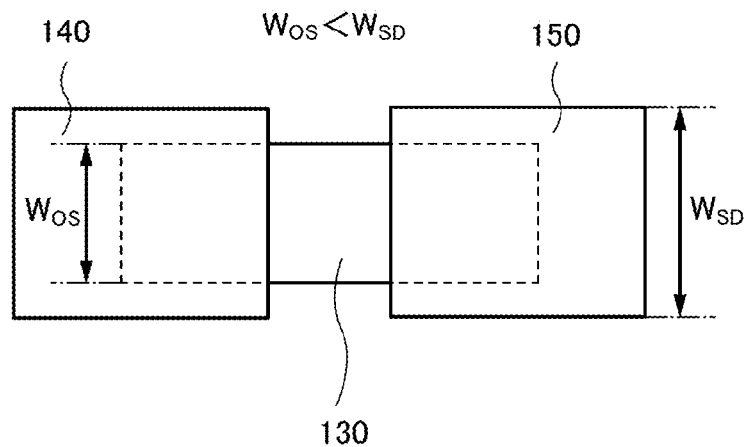
FIGS. 35A and 35B are top views each illustrating a transistor.
Figure 35B:
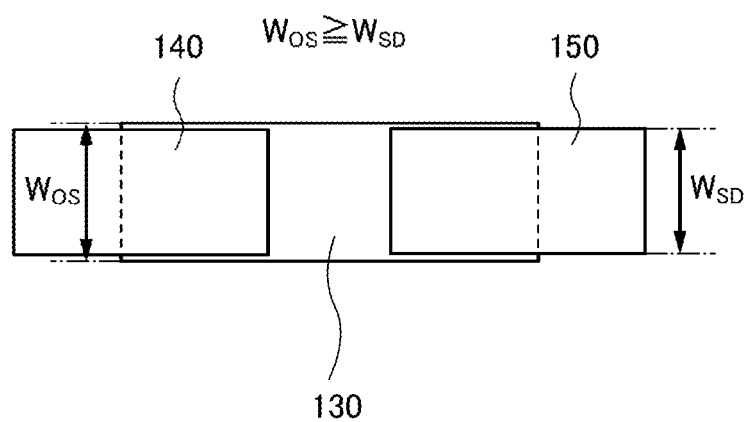

Furthermore, as shown in the top views in FIGS. 35A and 35B (showing only the oxide semiconductor layer 130, the conductive layer 140, and the conductive layer 150), the width ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved.

In the transistor of one embodiment of the present invention (any of the transistors 101 to 112), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layer 130b and the oxide semiconductor layer 130c and the transistor including the oxide semiconductor layer 130a, the oxide semiconductor layer 130b, and the oxide semiconductor layer 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering, leading to a high on-state current. Note that increasing the thickness of the oxide semiconductor layer 130b can increase the on-state current. The thickness of the oxide semiconductor layer 130b may be, for example, 100 nm to 200 nm.

A semiconductor device using a transistor with any of the above structures can have favorable electrical characteristics.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed. Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is higher than the proportion of a channel region formed in a top surface of a semiconductor in some cases. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

The structure described in this embodiment can be used in appropriate combination with any of the structures described in the other embodiments and the example.

(Embodiment 3)

In this embodiment, components of the transistors described in Embodiment 2 are described in detail.

The substrate 115 corresponds to the structure including the silicon substrate 40, the insulating layer 81, the insulating layer 82, the insulating layer 83, and the insulating layer 84 in FIG. 1A. Note that when p-channel transistors are formed using the silicon substrate, a silicon substrate with n$^-$-type conductivity is preferably used. It is also possible to use an SOI substrate including an n$^-$-type or i-type silicon layer. In the case where a p-channel transistor is formed on the silicon substrate, it is preferable to use a silicon substrate in which a plane where the transistor is formed is a (110) plane orientation. Forming a p-channel transistor with the (110) plane can increase the mobility.

The insulating layer 120 corresponds to the insulating layer 85 in FIG. 1A. The insulating layer 120 can have a function of supplying oxygen to the oxide semiconductor layer 130 as well as a function of preventing diffusion of impurities from the substrate 115. For this reason, the insulating layer 120 is preferably an insulating film containing oxygen and further preferably, the insulating layer 120 is an insulating film containing oxygen in which the oxygen content is higher than that in the stoichiometric composition. For example, the insulating layer 120 is a film of which the amount of released oxygen when converted into oxygen atoms is $1.0 \times 10^{19}$ atoms/cm$^3$ or more in TDS analysis performed such that the surface temperature is higher than or equal to 100° C. and lower than or equal to 700° C., preferably higher than or equal to 100° C. and lower than or equal to 500° C. In the case where the substrate 115 is provided with another device as described above, the insulating layer 120 also has a function as an interlayer insulating film and may be subjected to planarization treatment such as CMP treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film including silicon nitride, silicon nitride oxide, aluminum nitride, aluminum nitride oxide, or the like, or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layer 130a, the oxide semiconductor layer 130b, and the oxide semiconductor layer 130c are stacked in this order from the insulating layer 120 side.

Note that in the case where the oxide semiconductor layer 130 is a single layer, a layer corresponding to the oxide semiconductor layer 130b is used.

In the case where the oxide semiconductor layer 130 has a two-layer structure, a stack in which a layer corresponding to the oxide semiconductor layer 130b and a layer corresponding to the oxide semiconductor layer 130c are stacked in this order from the insulating layer 120 side is used. In such a case, the oxide semiconductor layer 130b and the oxide semiconductor layer 130c can be replaced with each other.

In the case where the oxide semiconductor layer 130 has a stacked-layer structure of four or more layers, for example, a structure in which another oxide semiconductor layer is stacked over the three-layer stack of the oxide semiconductor layer 130 described in this embodiment or a structure in which another oxide semiconductor layer is inserted in any one of the interfaces in the three-layer stack can be employed.

For the oxide semiconductor layer 130b, for example, an oxide semiconductor whose electron affinity (an energy difference between a vacuum level and the conduction band minimum) is higher than those of the oxide semiconductor layer 130a and the oxide semiconductor layer 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layer 130a and the oxide semiconductor layer 130c each contain one or more kinds of metal elements contained in the oxide semiconductor layer 130b. For example, the oxide semiconductor layer 130a and the oxide semiconductor layer 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130.

Since the oxide semiconductor layer 130a contains one or more kinds of metal elements contained in the oxide semiconductor layer 130b, an interface state is unlikely to be formed at the interface between the oxide semiconductor layer 130b and the oxide semiconductor layer 130a, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, fluctuations in electrical characteristics of the transistor, such as a threshold voltage, can be reduced. Furthermore, the reliability of the transistor can be improved.

Furthermore, since the oxide semiconductor layer 130c contains one or more kinds of metal elements contained in the oxide semiconductor layer 130b, scattering of carriers is unlikely to occur at the interface between the oxide semiconductor layer 130b and the oxide semiconductor layer 130c, compared with the interface between the oxide semiconductor layer 130b and the gate insulating film (insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layer 130a and the oxide semiconductor layer 130c, for example, a material containing Al, Ti, Ga, Ge, Y, Zr, Sn, La, Ce, or Hf with a higher atomic ratio than that used for the oxide semiconductor layer 130b can be used. Specifically, an atomic ratio of any of the above metal elements in the oxide semiconductor layer 130a and the oxide semiconductor layer 130c is 1.5 times or more, preferably 2 times or more, further preferably 3 times or more as much as that in the oxide semiconductor layer 130b. Any of the above metal elements is strongly bonded to oxygen and thus has a function of suppressing generation of an oxygen vacancy in the oxide semiconductor layer 130a and the oxide semiconductor layer 130c. That is, an oxygen vacancy is less likely to be generated in the oxide semiconductor layer 130a and the oxide semiconductor layer 130c than in the oxide semiconductor layer 130b.

An oxide semiconductor that can be used for each of the oxide semiconductor layers 130a, 130b, and 130c preferably contains at least In or Zn. Both In and Zn are preferably contained. In order to reduce fluctuations in electrical characteristics of the transistor including the oxide semiconductor, the oxide semiconductor preferably contains a stabilizer in addition to In and Zn.

As a stabilizer, Ga, Sn, Hf, Al, Zr, and the like can be given. As another stabilizer, lanthanoid such as La, Ce, Pr, Nd, Sm, Eu, Gd, Tb, Dy, Ho, Er, Tm, Yb, or Lu can be given.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a film containing the In—Ga—Zn oxide is also referred to as an IGZO film.

A material represented by $InMO_3(ZnO)_m$ (m>0 is satisfied, and m is not an integer) may be used. Note that M represents one or more metal elements selected from Ga, Y, Zr, La, Ce, and Nd. Alternatively, a material represented by $In_2SnO_5(ZnO)_n$ (n>0, n is an integer) may be used.

Note that when each of the oxide semiconductor layer 130a, the oxide semiconductor layer 130b, and the oxide semiconductor layer 130c is an In-M-Zn oxide containing at least indium, zinc, and M (M is a metal such as Al, Ti, Ga, Ge, Y, Zr, Sn, La, Ce, or Hf), and when the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layer 130a and the oxide semiconductor layer 130c are preferably less than 50 atomic % and greater than or equal to 50 atomic %, respectively, further preferably less than 25 atomic % and greater than or equal to 75 atomic %, respectively. In the case where Zn and O are not taken into consideration, the proportion of In and the proportion of M in the oxide semiconductor layer 130b are preferably greater than or equal to 25 atomic % and less than 75 atomic %, respectively, further preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of M has higher mobility than an oxide having a composition in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, further preferably greater than or equal to 5 nm and less than or equal to 25 nm. The thickness of the oxide semiconductor layer 130b is greater than or equal to 3 nm and less than or equal to 200 nm, preferably greater than or equal to 10 nm and less than or equal to 150 nm, further preferably greater than or equal to 15 nm and less than or equal to 100 nm. The thickness of the oxide semiconductor layer 130c is greater than or equal to 1 nm and less than or equal to 50 nm, preferably greater than or equal to 2 nm and less than or equal to 30 nm, further preferably greater than or equal to 3 nm and less than or equal to 15 nm. In addition, the oxide semiconductor layer 130b is preferably thicker than the oxide semiconductor layer 130a and the oxide semiconductor layer 130c.

Note that in order that a transistor in which an oxide semiconductor layer serves as a channel have stable electrical characteristics, it is effective to reduce the concentration of impurities in the oxide semiconductor layer to make the oxide semiconductor layer intrinsic (i-type) or substantially intrinsic. The term "substantially intrinsic" refers to the state where an oxide semiconductor layer has a carrier density which is lower than $1\times10^{15}/cm^3$, lower than $1\times10^{13}/cm^3$, lower than $8\times10^{11}/cm^3$, or lower than $1\times10^{8}/cm^3$, and is higher than or equal to $1\times10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level serves as a trap and might cause deterioration of electrical characteristics of the transistor. Accordingly, in the oxide semiconductor layer 130a, the oxide semiconductor layer 130b, and the oxide semiconductor layer 130c and at interfaces between these layers, the impurity concentration is preferably reduced.

In order to form an intrinsic or substantially intrinsic oxide semiconductor layer, the oxide semiconductor layer is arranged to have a region in which the concentration of silicon estimated by secondary ion mass spectrometry (SIMS) is lower than $1\times10^{19}$ atoms/cm$^3$, preferably lower than $5\times10^{18}$ atoms/cm$^3$, further preferably lower than $1\times10^{18}$ atoms/cm$^3$. Furthermore, the oxide semiconductor layer is arranged to have a region in which the concentration of hydrogen is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Furthermore, the concentration of nitrogen is controlled to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Increase in concentration of silicon or carbon might reduce the crystallinity of the oxide semiconductor layer. In order to avoid the reduction of the crystallinity of the oxide semiconductor layer, for example, the oxide semiconductor layer is arranged to have a region in which the concentration of silicon is lower than $1\times10^{19}$ atoms/cm$^3$, preferably lower than $5\times10^{18}$ atoms/cm$^3$, further preferably lower than $1\times10^{18}$ atoms/cm$^3$. Furthermore, the oxide semiconductor layer is arranged to have a region in which the concentration of carbon is lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which a highly purified oxide semiconductor film is used for a channel formation region as described above has an extremely low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the oxide semiconductor layer, which serves as a channel, not be in contact with the gate insulating film for the above-described reason. In the case where a channel is formed at the interface between the gate insulating film and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating film.

Accordingly, with the oxide semiconductor layer 130 having a stacked-layer structure including the oxide semiconductor layer 130a, the oxide semiconductor layer 130b, and the oxide semiconductor layer 130c, a channel can be formed in the oxide semiconductor layer 130b; thus, the transistor can have high field-effect mobility and stable electrical characteristics.

In a band structure, the conduction band minimums of the oxide semiconductor layer 130a, the oxide semiconductor layer 130b, and the oxide semiconductor layer 130c are continuous. This can be understood also from the fact that the compositions of the oxide semiconductor layer 130a, the oxide semiconductor layer 130b, and the oxide semiconductor layer 130c are close to one another and oxygen is easily diffused among the oxide semiconductor layer 130a, the oxide semiconductor layer 130b, and the oxide semiconductor layer 130c. Thus, the oxide semiconductor layer 130a, the oxide semiconductor layer 130b, and the oxide semiconductor layer 130c have a continuous physical property although they have different compositions and form a stack. In the drawings, interfaces between the oxide semiconductor layers of the stack are indicated by dashed lines.

The oxide semiconductor layer 130 in which layers containing the same main components are stacked is formed to have not only a simple stacked-layer structure of the layers but also a continuous energy band (here, in particular, a well structure having a U shape in which the conduction band minimums are continuous (U-shape well)). In other words, the stacked-layer structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layer 130a and the oxide semiconductor layer 130c, and an In—Ga—Zn oxide whose atomic ratio of In to Ga and Zn is 1:1:1, 2:1:3, 5:5:6, or 3:1:2 can be used for the oxide semiconductor layer 130b. In each of the oxide semiconductor layers 130a, 130b, and 130c, the proportion of each atom in the atomic ratio varies within a range of ±20% as an error.

The oxide semiconductor layer 130b of the oxide semiconductor layer 130 serves as a well, so that a channel is formed in the oxide semiconductor layer 130b. Note that since the conduction band minimums are continuous, the oxide semiconductor layer 130 can also be referred to as a U-shape well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layer 130a and the oxide semiconductor layer 130c. The oxide semiconductor layer 130b can be distanced away from the trap levels owing to existence of the oxide semiconductor layer 130a and the oxide semiconductor layer 130c.

However, when the energy differences between the conduction band minimum of the oxide semiconductor layer 130b and the conduction band minimum of each of the oxide semiconductor layer 130a and the oxide semiconductor layer 130c are small, an electron in the oxide semiconductor layer 130b might reach the trap level by passing over the energy differences. When the electron is trapped in the trap level, a negative charge is generated at the interface with the insulating layer, whereby the threshold voltage of the transistor is shifted in the positive direction.

The oxide semiconductor layer 130a, the oxide semiconductor layer 130b, and the oxide semiconductor layer 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus allows subsequent process temperatures to be relatively high. It is also possible to use a stack of any of the above materials and Cu or an alloy such as Cu—Mn, which has low resistance. Note that in the transistors 105, 106, 111, and 112, for example, it is possible to use W for the conductive layer 141 and the conductive layer 151 and use a stack of Ti and Al for the conductive layer 142 and the conductive layer 152.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, whereby the region is changed to an n-type region. Accordingly, the n-type region can serve as a source or a drain of the transistor.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, nitrogen, or Zr as an impurity.

An example of a stacked-layer structure of the insulating layer 160 will be described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constant than silicon oxide and silicon oxynitride. Therefore, by using hafnium oxide or aluminum oxide, the thickness of the insulating layer 160 can be larger than silicon oxide; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

A surface over which the hafnium oxide having a crystal structure is formed might have interface states due to defects. The interface states might function as trap centers. Therefore, in the case where the hafnium oxide is provided close to the channel region of the transistor, the electrical characteristics of the transistor might deteriorate owing to the interface states. In order to reduce the influence of the interface state, it is preferable to separate the channel region of the transistor and the hafnium oxide from each other by providing another film therebetween. The film has a buffer function. The film having a buffer function may be included in the insulating layer 160 or included in the oxide semiconductor film. That is, the film having a buffer function can be formed using silicon oxide, silicon oxynitride, an oxide semiconductor, or the like. Note that the film having a buffer function is formed using, for example, a semiconductor or an insulator having a larger energy gap than a semiconductor to be the channel region. Alternatively, the film having a buffer function is formed using, for example, a semiconductor or an insulator having lower electron affinity than a semiconductor to be the channel region. Further alternatively, the film having a buffer function is formed using, for example, a semiconductor or an insulator having higher ionization energy than a semiconductor to be the channel region.

Meanwhile, charge is trapped by the interface states (trap centers) of the hafnium oxide having a crystal structure, whereby the threshold voltage of the transistor may be controlled. In order to make the electric charge exist stably, for example, a semiconductor or an insulator having a larger energy gap than hafnium oxide may be provided between the channel region and the hafnium oxide. Alternatively, a semiconductor or an insulator having smaller electron affinity than the hafnium oxide is provided. The film having a buffer function may be formed using a semiconductor or an insulator having higher ionization energy than hafnium oxide. Use of such a semiconductor or an insulator inhibits discharge of the charge trapped by the interface states, so that the charge can be retained for a long time.

Examples of such an insulator include silicon oxide and silicon oxynitride. An electric charge can be trapped at the interface state in the insulating layer 160 by transferring an electron from the oxide semiconductor layer 130 toward the gate electrode layer (conductive layer 170). As a specific example, the potential of the gate electrode layer (conductive layer 170) is kept higher than the potential of the source electrode or the drain electrode under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons is trapped in interface states in the insulating layer 160 or the like shifts in the positive direction. The amount of electrons to be trapped (the amount of change in threshold voltage) can be controlled by adjusting a voltage of the gate electrode layer (conductive layer 170) or time in which the voltage is applied. Note that a location in which charge is trapped is not necessarily limited to the inside of the insulating layer 160 as long as charge can be trapped therein. A stacked-layer film having a similar structure may be used for another insulating layer.

The insulating layer 120 and the insulating layer 160 in contact with the oxide semiconductor layer 130 may include a region with a low density of states caused by nitrogen oxide. The density of states due to nitrogen oxide can be formed in the energy gap of the oxide semiconductor. As the oxide insulating layer, a silicon oxynitride film that releases less nitrogen oxide, an aluminum oxynitride film that releases less nitrogen oxide, or the like can be used.

Note that a silicon oxynitride film that releases less nitrogen oxide is a film which releases ammonia more than nitrogen oxide in thermal desorption spectroscopy (TDS) analysis; the amount of released ammonia is typically greater than or equal to $1 \times 10^{18}/cm^3$ and less than or equal to $5 \times 10^{19}/cm^3$. Note that the amount of released ammonia is the amount of ammonia released by heat treatment at the film surface temperature higher than or equal to 50° C. and lower than or equal to 650° C., preferably higher than or equal to 50° C. and lower than or equal to 550° C.

By using the above oxide insulating layer for the insulating layer 120 and the insulating layer 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. It is also possible to use an alloy or a conductive nitride of any of these materials. It is also possible to use a stack of a plurality of materials selected from these materials, alloys of these materials, and conductive nitrides of these materials. Typically, tungsten, a stack of tungsten and titanium nitride, a stack of tungsten and tantalum nitride, or the like can be used. It is also possible to use Cu or an alloy such as Cu—Mn, which has low resistance, or a stack of any of the above materials and Cu or an alloy such as Cu—Mn. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 2, using an insulating film containing hydrogen as the insulating layer 175 allows the oxide semiconductor layer to be partly changed to n-type. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. A decrease in channel width causes a reduction in on-state current.

In the transistors 107 to 112 of embodiments of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor of one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in the on-state current.

Furthermore, in the transistor of one embodiment of the present invention in which the oxide semiconductor layer 130 has a two-layer structure or a three-layer structure, since the oxide semiconductor layer 130b where a channel is formed is provided over the oxide semiconductor layer 130a, an effect of making an interface state less likely to be formed is obtained. In the transistor of one embodiment of the present invention in which the oxide semiconductor layer 130 has a three-layer structure, since the oxide semiconductor layer 130b is positioned at the middle of the three-layer structure, an effect of eliminating the influence of an impurity that enters from upper and lower layers on the oxide semiconductor layer 130b is obtained as well. Therefore, the transistor can achieve not only the increase in the on-state current of the transistor but also stabilization of the threshold voltage and a reduction in the S value (subthreshold value). Thus, current when gate voltage VG is 0 V can be reduced and power consumption can be reduced. Furthermore, since the threshold voltage of the transistor becomes stable, long-term reliability of the semiconductor device can be improved. In addition, the transistor of one embodiment of the present invention is suitable for a highly integrated semiconductor device because deterioration of electrical characteristics due to miniaturization is reduced.

The structure described in this embodiment can be used in appropriate combination with any of the structures described in the other embodiments and the example.

(Embodiment 4)

In this embodiment, methods for manufacturing the transistors 102 and 107 described in Embodiment 2 are described.

First, an example of a method for manufacturing a p-channel silicon transistor included in the substrate 115 is described. An n⁻-type single crystal silicon substrate is used as a silicon substrate, and an element formation region isolated with an insulating layer (also referred to as a field oxide film) is formed in the surface. The element formation region can be formed by a local oxidation of silicon (LOCOS) method, a shallow trench isolation (STI) method, or the like.

Here, the substrate is not limited to the single crystal silicon substrate. A silicon on insulator (SOI) substrate or the like can be used as well.

Next, a gate insulating film is formed so as to cover the element formation region. For example, a silicon oxide film is formed by oxidation of a surface of the element formation region by heat treatment. Furthermore, after the silicon oxide film is formed, a surface of the silicon oxide film may be nitrided by nitriding treatment.

Next, a conductive film is formed so as to cover the gate insulating film. The conductive film can be formed using an element selected from Ta, W, Ti, Mo, Al, Cu, Cr, Nb, and the like, or an alloy material or a compound material containing such an element as a main component. Alternatively, a metal nitride film obtained by nitridation of any of these elements can be used. Alternatively, a semiconductor material typified by polycrystalline silicon doped with an impurity element such as phosphorus can be used.

Then, the conductive film is selectively etched, whereby a gate electrode layer is formed over the gate insulating film.

Next, an insulating film such as a silicon oxide film or a silicon nitride film is formed to cover the gate electrode layer and etch back is performed, whereby sidewalls are formed on side surfaces of the gate electrode layer.

Next, a resist mask is selectively formed so as to cover regions except the element formation region, and an impurity element is added with the use of the resist mask and the gate electrode layer as a mask, whereby pt-type impurity regions are formed. Here, in order to form a p-channel transistor, an impurity element imparting p-type conductivity such as B or Ga can be used as the impurity element.

Through the above steps, a p-channel transistor including an active region in the silicon substrate is completed. Note that a passivation film such as a silicon nitride film or an aluminum oxide film is preferably formed over the transistor.

Next, an interlayer insulating film is formed over the silicon substrate where the transistor is formed, and contact plugs and wirings are formed. In addition, as described in Embodiment 1, an insulating layer made of aluminum oxide or the like for preventing diffusion of hydrogen is formed. The substrate 115 includes the silicon substrate where the transistor is formed and the interlayer insulating film and the like formed over the silicon substrate.

A method for manufacturing the transistor 102 is described with reference to FIGS. 36A to 36C and FIGS. 37A to 37C. A cross section of the transistor in the channel length direction is shown on the left side, and a cross section of the transistor in the channel width direction is shown on the right side. The cross-sectional views in the channel width direction are enlarged views; therefore, components on the left side and those on the right side differ in apparent thickness.

The case where the oxide semiconductor layer 130 has a three-layer structure of the oxide semiconductor layer 130a, the oxide semiconductor layer 130b, and the oxide semiconductor layer 130c is described as an example. In the case where the oxide semiconductor layer 130 has a two-layer structure, the oxide semiconductor layer 130a and the oxide semiconductor layer 130b are used. In the case where the oxide semiconductor layer 130 has a single-layer structure, the oxide semiconductor layer 130b is used.

First, the insulating layer 120 is formed over the substrate 115. Embodiment 3 can be referred to for description of the kinds of the substrate 115 and a material used for the insulating layer 120. The insulating layer 120 can be formed by a sputtering method, a CVD method, a molecular beam epitaxy (MBE) method, or the like.

Oxygen may be added to the insulating layer 120 by an ion implantation method, an ion doping method, a plasma immersion ion implantation method, plasma treatment, or the like. Adding oxygen enables the insulating layer 120 to supply oxygen much easily to the oxide semiconductor layer 130.

In the case where a surface of the substrate 115 is made of an insulator and there is no influence of impurity diffusion to the oxide semiconductor layer 130 to be formed later, the insulating layer 120 is not necessarily provided.

Figure 36A:
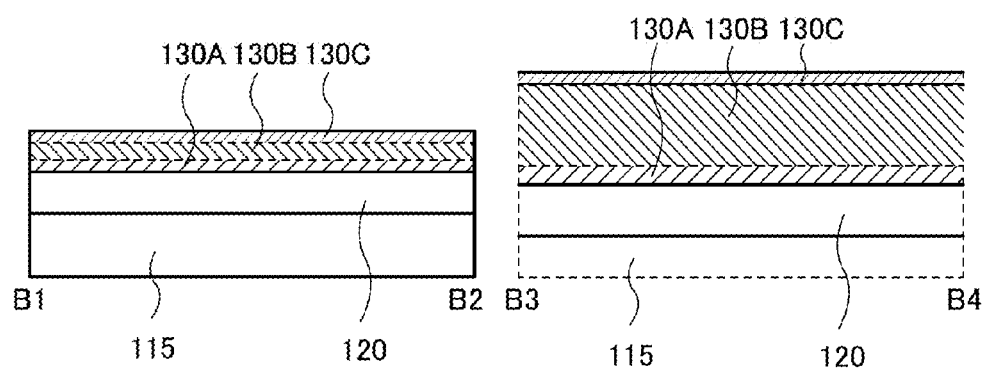
FIGS. 36A to 36C illustrate a method for manufacturing a transistor.

Next, an oxide semiconductor film 130A to be the oxide semiconductor layer 130a, an oxide semiconductor film 130B to be the oxide semiconductor layer 130b, and an oxide semiconductor film 130C to be the oxide semiconductor layer 130c are formed over the insulating layer 120 by a sputtering method, a CVD method, an MBE method, or the like (see FIG. 36A).

In the case where the oxide semiconductor layer 130 has a stacked-layer structure, oxide semiconductor films are preferably formed successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $5\times10^{-7}$ Pa to $1\times10^{-4}$ Pa) by an adsorption vacuum evacuation pump such as a cryopump and that the chamber be able to heat a substrate to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an exhaust system into the chamber. Alternatively, a combination of a turbo molecular pump and a cryopump may be used as an exhaust system.

Not only high vacuum evacuation of the chamber but also high purity of a sputtering gas is preferred to obtain a highly purified intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor film can be prevented as much as possible.

For the oxide semiconductor film 130A, the oxide semiconductor film 130B, and the oxide semiconductor film 130C, any of the materials described in Embodiment 3 can be used. In the case where a sputtering method is used for deposition, the above materials described in Embodiment 3 can be used as a target. In each of the oxide semiconductor films 130A, 130B, and 130C, the proportion of each atom in the atomic ratio varies within a range of ±40% as an error. For example, the atomic ratio of In to Ga and Zn of a film that is formed by sputtering using a material whose atomic ratio of In to Ga and Zn is 4:2:4.1 as a target might be 4:2:3.

Note that as described in detail in Embodiment 3, a material that has an electron affinity higher than that of the oxide semiconductor film 130A and that of the oxide semiconductor film 130C is used for the oxide semiconductor film 130B.

Note that the oxide semiconductor films are preferably formed by a sputtering method. As a sputtering method, an RF sputtering method, a DC sputtering method, an AC sputtering method, or the like can be used.

After the oxide semiconductor film 130C is formed, first heat treatment may be performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate released oxygen. The first heat treatment can increase the crystallinity of the oxide semiconductor film 130A, the oxide semiconductor film 130B, and the oxide semiconductor film 130C and remove impurities such as water and hydrogen from the insulating layer 120, the oxide semiconductor film 130A, the oxide semiconductor film 130B, and the oxide semiconductor film 130C. Note that the first heat treatment may be performed after etching for forming the oxide semiconductor layer 130a, the oxide semiconductor layer 130b, and the oxide semiconductor layer 130c described later.

Next, a first conductive layer is formed over the oxide semiconductor film 130A. The first conductive layer can be, for example, formed by the following method.

First, a first conductive film is formed over the oxide semiconductor film 130A. As the first conductive film, a single layer or a stacked layer can be formed using a material selected from Al, Cr, Cu, Ta, Ti, Mo, W, Ni, Mn, Nd, and Sc and alloys of any of these metal materials.

Next, a resist film is formed over the first conductive film and the resist film is exposed to light by electron beam exposure, liquid immersion exposure, or EUV exposure and developed, so that a first resist mask is formed. An organic coating film is preferably formed as an adherence agent between the first conductive film and the resist film. Alternatively, the first resist mask may be formed by nanoimprint lithography.

Then, the first conductive film is selectively etched using the first resist mask and the first resist mask is subjected to ashing; thus, the conductive layer is formed.

Figure 36B:
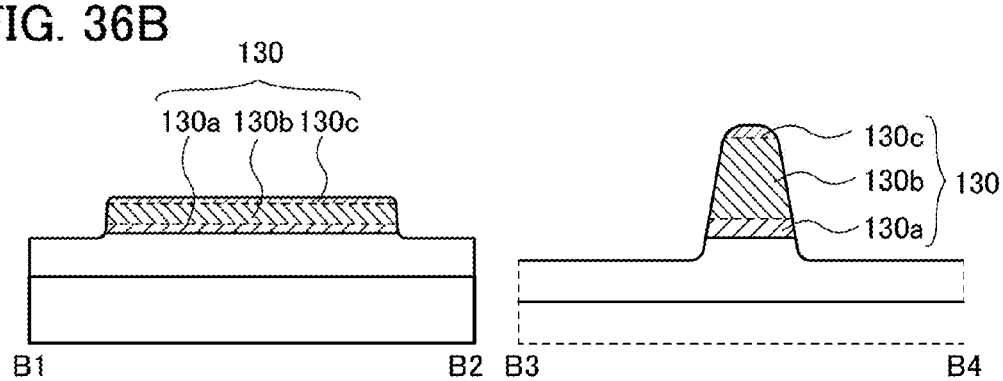
Figure 36C:
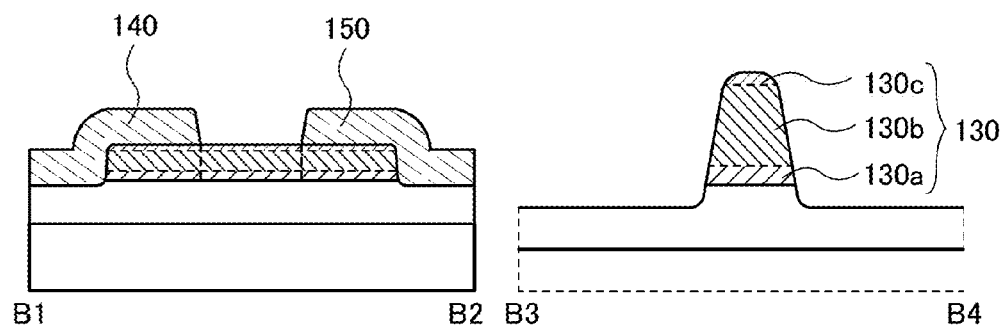

Next, the oxide semiconductor film 130A, the oxide semiconductor film 130B, and the oxide semiconductor film 130C are selectively etched using the conductive layer as a hard mask and the conductive layer is removed; thus, the oxide semiconductor layer 130 including a stack of the oxide semiconductor layer 130a, the oxide semiconductor layer 130b, and the oxide semiconductor layer 130c is formed (see FIG. 36B). It is also possible to form the oxide semiconductor layer 130 using the first resist mask, without forming the conductive layer. Here, oxygen ions may be implanted into the oxide semiconductor layer 130.

Next, a second conductive film is formed to cover the oxide semiconductor layer 130. The second conductive film can be formed using a material that can be used for the conductive layer 140 and the conductive layer 150 described in Embodiment 6. A sputtering method, a CVD method, an MBE method, or the like can be used for the formation of the second conductive film.

Then, a second resist mask is formed over portions to be a source region and a drain region. Then, part of the second conductive film is etched, whereby the conductive layer 140 and the conductive layer 150 are formed (see FIG. 36C).

Next, an insulating film 160A is formed over the oxide semiconductor layer 130, the conductive layer 140, and the conductive layer 150. The insulating film 160A can be formed using a material that can be used for the insulating layer 160 described in Embodiment 3. A sputtering method, a CVD method, an MBE method, or the like can be used for the formation of the insulating film 160A.

After that, second heat treatment may be performed. The second heat treatment can be performed in a condition similar to that of the first heat treatment. The second heat treatment enables oxygen implanted into the oxide semiconductor layer 130 to diffuse into the entire oxide semiconductor layer 130. Note that it is possible to obtain this effect by third heat treatment, without performing the second heat treatment.

Then, a third conductive film 171A and a fourth conductive film 172A to be the conductive layer 170 are formed over the insulating film 160A. The third conductive film 171A and the fourth conductive film 172A can be formed using materials that can be used for the conductive layer 171 and the conductive layer 172 described in Embodiment 3. A sputtering method, a CVD method, an MBE method, or the like can be used for the formation of the third conductive film 171A and the fourth conductive film 172A.

Figure 37A:
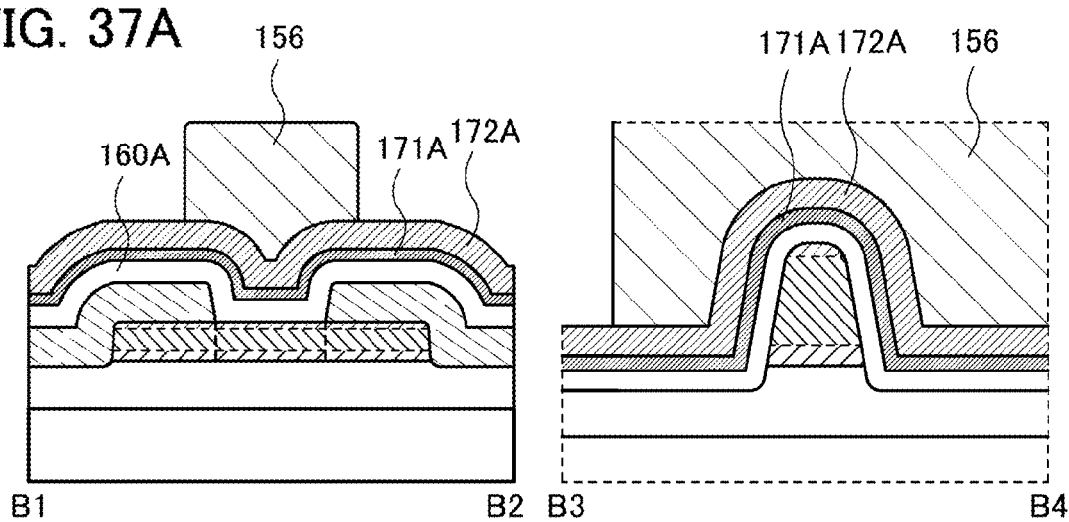
FIGS. 37A to 37C illustrate a method for manufacturing a transistor.
Figure 37B:
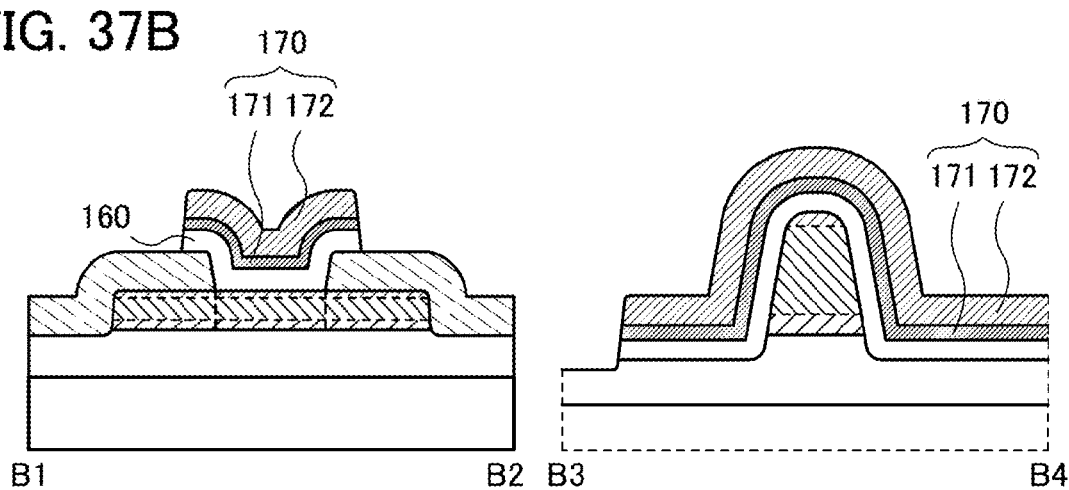

Next, a third resist mask 156 is formed over the fourth conductive film 172A (see FIG. 37A). The third conductive film 171A, the fourth conductive film 172A, and the insulating film 160A are selectively etched using the resist mask, whereby the conductive layer 170 including the conductive layer 171 and the conductive layer 172 and the insulating layer 160 are formed (see FIG. 37B). Note that if the insulating film 160A is not etched, the transistor 102 can be manufactured.

After that, the insulating layer 175 is formed over the oxide semiconductor layer 130, the conductive layer 140, the conductive layer 150, the insulating layer 160, and the conductive layer 170. Embodiment 3 can be referred to for description of a material used for the insulating layer 175. In the transistor 101, an aluminum oxide film is preferably used. The insulating layer 175 can be formed by a sputtering method, a CVD method, an MBE method, or the like.

Figure 37C:
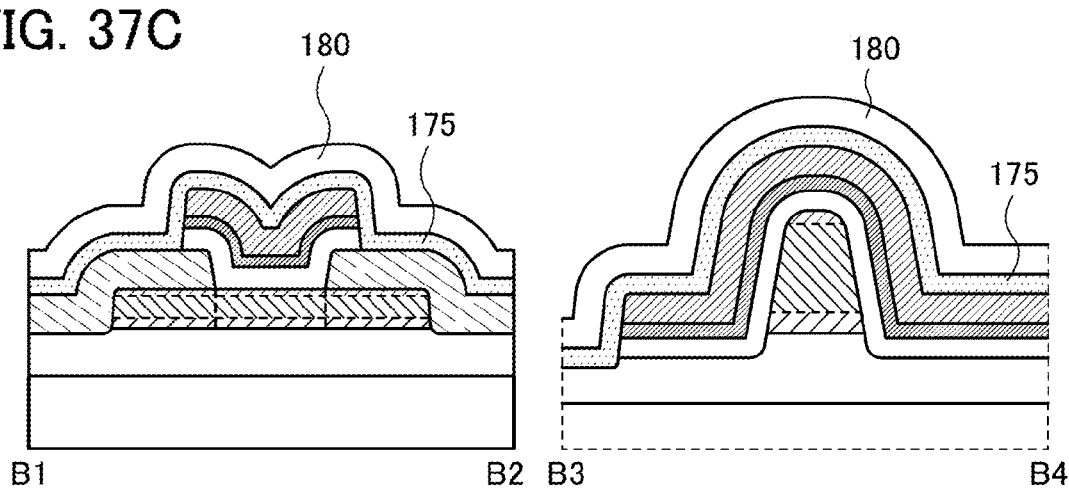

Next, the insulating layer 180 is formed over the insulating layer 175 (see FIG. 37C). Embodiment 3 can be referred to for description of a material used for the insulating layer 180. The insulating layer 180 can be formed by a sputtering method, a CVD method, an MBE method, or the like.

Oxygen may be added to the insulating layer 175 and/or the insulating layer 180 by an ion implantation method, an ion doping method, a plasma immersion ion implantation method, plasma treatment, or the like. Adding oxygen enables the insulating layer 175 and/or the insulating layer 180 to supply oxygen much easily to the oxide semiconductor layer 130.

Next, third heat treatment may be performed. The third heat treatment can be performed in a condition similar to that of the first heat treatment. By the third heat treatment, excess oxygen is easily released from the insulating layer 120, the insulating layer 175, and the insulating layer 180, so that oxygen vacancies in the oxide semiconductor layer 130 can be reduced.

Next, a method for manufacturing the transistor 107 is described. Note that detailed description of steps similar to those for manufacturing the transistor 102 described above is omitted.

Figure 38A:
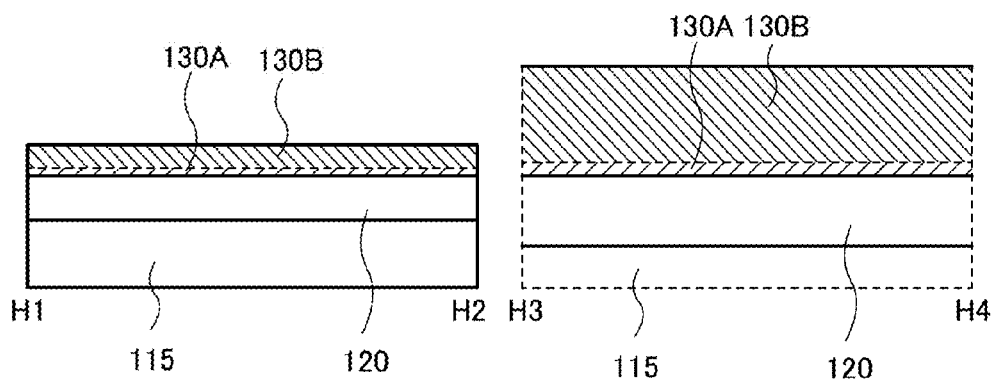
FIGS. 38A to 38C illustrate a method for manufacturing a transistor.

The insulating layer 120 is formed over the substrate 115, and the oxide semiconductor film 130A to be the oxide semiconductor layer 130a and the oxide semiconductor film 130B to be the oxide semiconductor layer 130b are formed over the insulating layer 120 by a sputtering method, a CVD method, an MBE method, or the like (see FIG. 38A).

Figure 38B:
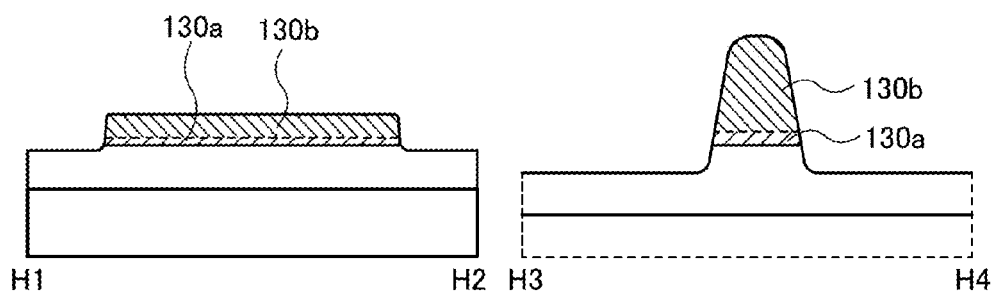

After that, a first conductive film is formed over the oxide semiconductor film 130B, and a conductive layer is formed using a first resist mask by a method similar to the above. Then, the oxide semiconductor film 130A and the oxide semiconductor film 130B are selectively etched using the conductive layer as a hard mask and the conductive layer is removed; thus, a stack of the oxide semiconductor layer 130a and the oxide semiconductor layer 130b is formed (see FIG. 38B). It is also possible to form the stack using the first resist mask, without forming the hard mask. Here, oxygen ions may be implanted into the oxide semiconductor layer 130a and the oxide semiconductor layer 130b.

Figure 38C:
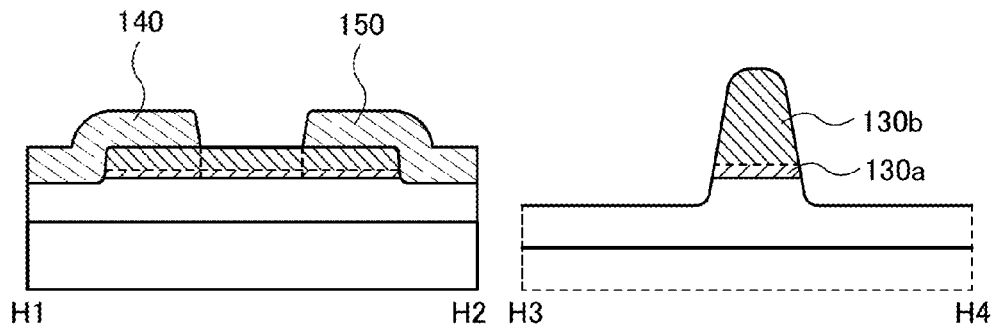

Next, a second conductive film is formed to cover the stack. Then, a second resist mask is formed over portions to be a source region and a drain region, and part of the second conductive film is etched using the second resist mask, whereby the conductive layer 140 and the conductive layer 150 are formed (see FIG. 38C).

After that, the oxide semiconductor film 130C to be the oxide semiconductor layer 130c is formed over the stack of the oxide semiconductor layer 130a and the oxide semiconductor layer 130b, the conductive layer 140, and the conductive layer 150. Furthermore, the insulating film 160A, the third conductive film 171A, and the fourth conductive film 172A are formed over the oxide semiconductor film 130C.

Figure 39A:
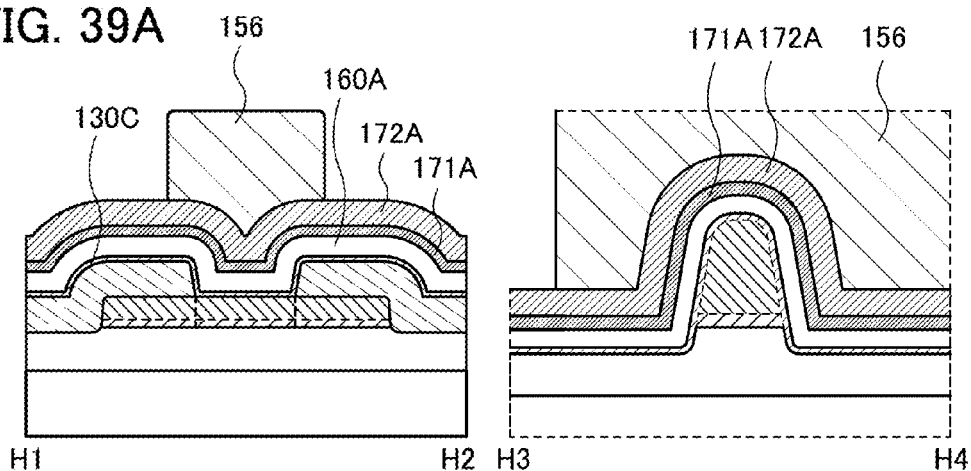
FIGS. 39A to 39C illustrate a method for manufacturing a transistor.
Figure 39B:
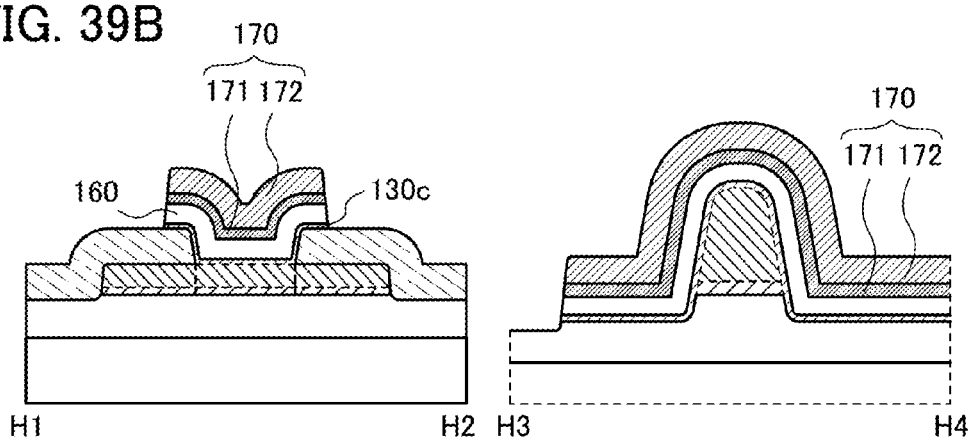

Then, the third resist mask 156 is formed over the fourth conductive film 172A (see FIG. 39A). The third conductive film 171A, the fourth conductive film 172A, the insulating film 160A, and the oxide semiconductor film 130C are selectively etched using the resist mask, whereby the conductive layer 170 including the conductive layer 171 and the conductive layer 172, the insulating layer 160, and the oxide semiconductor layer 130c are formed (see FIG. 39B). Note that if the insulating film 160A and the oxide semiconductor film 130C are etched using a fourth resist mask, the transistor 108 can be manufactured.

Figure 39C:
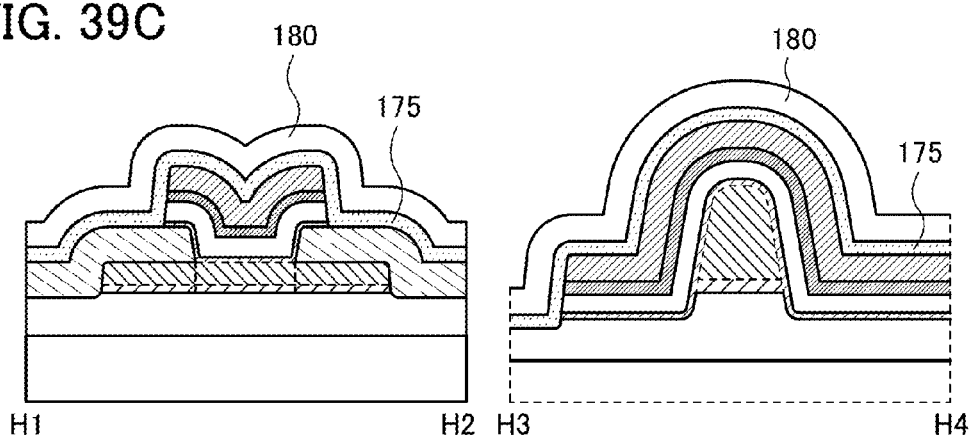

Next, the insulating layer 175 and the insulating layer 180 are formed over the insulating layer 120, the oxide semiconductor layer 130 (the oxide semiconductor layer 130a, the oxide semiconductor layer 130b, and the oxide semiconductor layer 130c), the conductive layer 140, the conductive layer 150, the insulating layer 160, and the conductive layer 170 (see FIG. 39C).

Through the above steps, the transistor 107 can be manufactured.

Next, a method for manufacturing the transistor 111 is described. Note that detailed description of steps similar to those for manufacturing the transistor 102 described above is omitted.

Figure 40A:
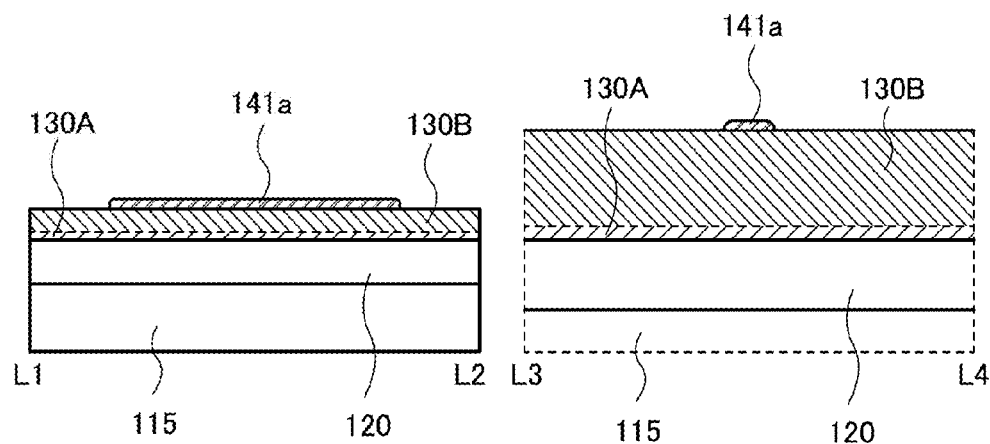
FIGS. 40A to 40C illustrate a method for manufacturing a transistor.

The insulating layer 120 is formed over the substrate 115, and the oxide semiconductor film 130A to be the oxide semiconductor layer 130a and the oxide semiconductor film 130B to be the oxide semiconductor layer 130b are formed over the insulating layer 120 by a sputtering method, a CVD method, an MBE method, or the like. Then, a first conductive film is formed over the oxide semiconductor film 130B, and a conductive layer 141a is formed using a first resist mask (see FIG. 40A).

Figure 40B:
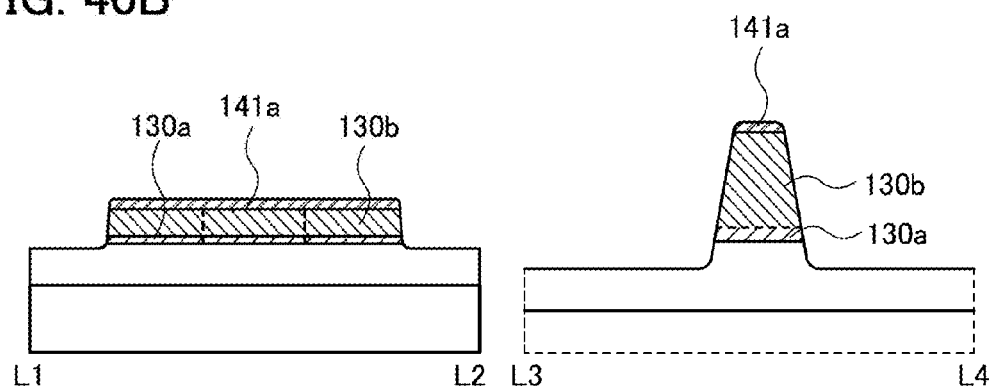

Then, the oxide semiconductor film 130A and the oxide semiconductor film 130B are selectively etched using the conductive layer 141a as a hard mask, whereby a stack of the oxide semiconductor layer 130a, the oxide semiconductor layer 130b, and the conductive layer 141a is formed (see FIG. 40B). Here, oxygen ions may be implanted into the oxide semiconductor layer 130a and the oxide semiconductor layer 130b.

Figure 40C:
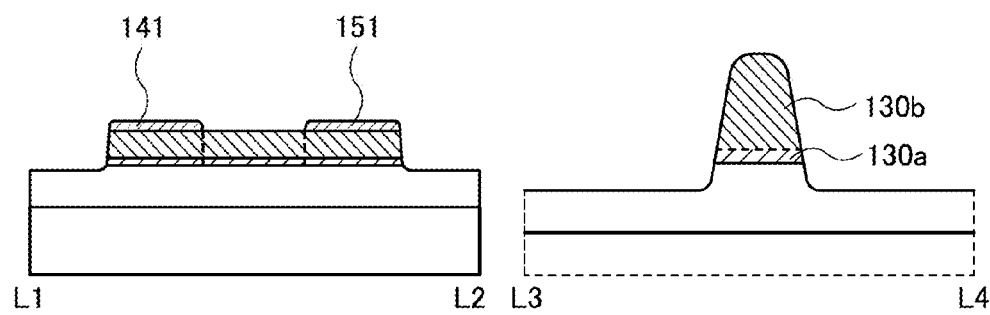

Then, a second resist mask is formed over portions to be a source region and a drain region, and part of the conductive layer 141a is etched using the second resist mask, whereby the conductive layer 141 and the conductive layer 151 are formed (see FIG. 40C).

After that, the oxide semiconductor film 130C to be the oxide semiconductor layer 130c is formed over the stack of the oxide semiconductor layer 130a and the oxide semiconductor layer 130b, the conductive layer 141, and the conductive layer 151. Furthermore, the insulating film 160A, the third conductive film 171A, and the fourth conductive film 172A are formed over the oxide semiconductor film 130C.

Figure 41A:
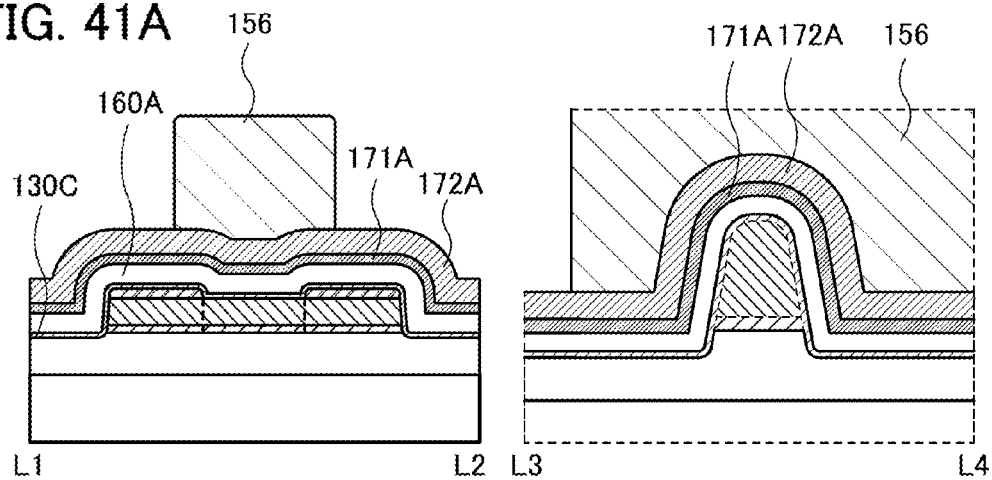
FIGS. 41A to 41C illustrate a method for manufacturing a transistor.
Figure 41B:
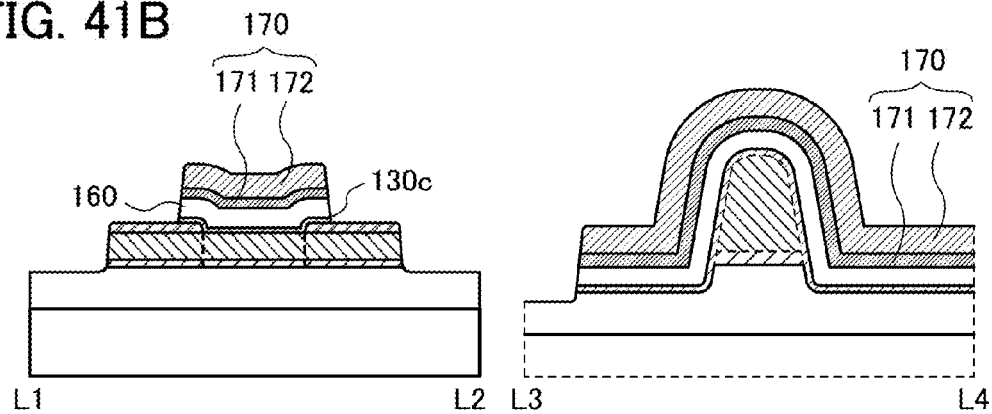

Then, the third resist mask 156 is formed over the fourth conductive film 172A (see FIG. 41A). The third conductive film 171A, the fourth conductive film 172A, the insulating film 160A, and the oxide semiconductor film 130C are selectively etched using the third resist mask, whereby the conductive layer 170 including the conductive layer 171 and the conductive layer 172, the insulating layer 160, and the oxide semiconductor layer 130c are formed (see FIG. 41B).

Next, the insulating layer 175 and the insulating layer 180 are formed over the insulating layer 120, the oxide semiconductor layer 130 (the oxide semiconductor layer 130a, the oxide semiconductor layer 130b, and the oxide semiconductor layer 130c), the conductive layer 141, the conductive layer 151, the insulating layer 160, and the conductive layer 170.

Figure 41C:
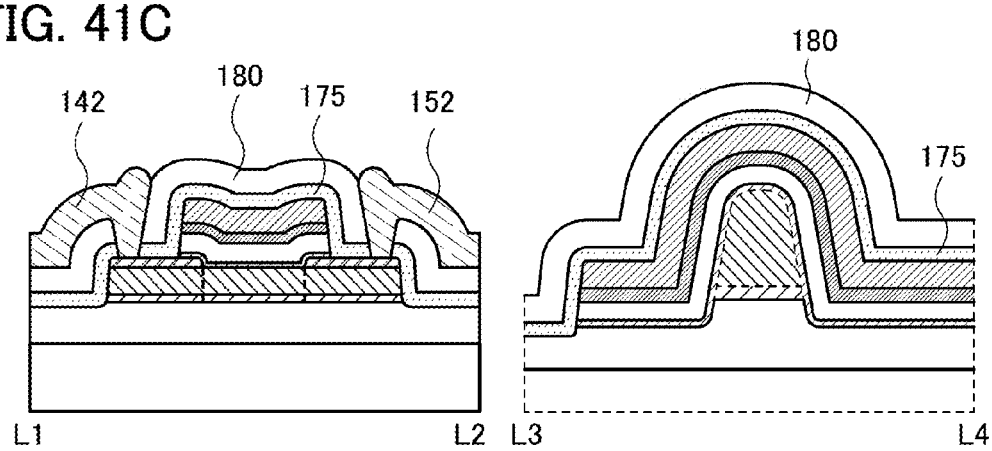

Next, openings reaching the conductive layer 141 and the conductive layer 151 are provided in the insulating layer 175 and the insulating layer 180, and a fifth conductive film is formed to cover the openings. Then, a fourth resist mask is provided over the fifth conductive film and the fifth conductive film is selectively etched using the fourth resist mask, whereby the conductive layer 142 and the conductive layer 152 are formed (see FIG. 41C).

Through the above steps, the transistor 111 can be manufactured.

Although the variety of films such as the metal films, the semiconductor films, and the inorganic insulating films which are described in this embodiment typically can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method is performed in such a manner that the pressure in a chamber is set to an atmospheric pressure or a reduced pressure, source gases for reaction are introduced into the chamber and reacted, and then the sequence of the gas introduction is repeated. An inert gas (e.g., argon or nitrogen) may be introduced as a carrier gas with the source gases. For example, two or more kinds of source gases may be sequentially supplied to the chamber. In this case, after the reaction of a first source gas, an inert gas is introduced, and then a second source gas is introduced so that the source gases are not mixed. Alternatively, the first source gas may be exhausted by vacuum evacuation instead of the introduction of the inert gas, and then the second source gas may be introduced. The first source gas is adsorbed on the surface of the substrate and reacted to form a first layer; then the second source gas introduced thereafter is absorbed and reacted; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the gas introduction; therefore, an ALD method makes it possible to accurately adjust a thickness and thus is suitable for manufacturing a minute FET.

The variety of films such as the metal film, the semiconductor film, and the inorganic insulating film which have been disclosed in the embodiments can be formed by a thermal CVD method such as a MOCVD method or an ALD method. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source gas which is obtained by vaporizing liquid containing a solvent and a hafnium precursor (hafnium alkoxide and a hafnium amide such as hafnium tetrakis(dimethylamide) hafnium (TDMAH, $Hf[N(CH_3)_2]_4$) and tetrakis(ethylmethylamide)hafnium) are used For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA, $Al(CH_3)_3$)) are used. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are sequentially introduced to form a GaO layer, and then a $Zn(CH_3)_2$ gas and an $O_3$ gas are sequentially introduced to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H.

The structure described in this embodiment can be used in appropriate combination with any of the structures described in the other embodiments and the example.

(Embodiment 5)

A structure of an oxide semiconductor film which can be used for one embodiment of the present invention is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

An oxide semiconductor film is classified roughly into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, that is, a grain boundary is not observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a morphology reflecting unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancy in the oxide semiconductor film serves as a carrier trap or serves as a carrier generation source when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary is not always found clearly in the nc-OS film.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., 50 nm or larger) larger than the diameter of a crystal part. Meanwhile, spots are shown in a nanobeam electron diffraction pattern of the nc-OS film obtained by using an electron beam having a probe diameter close to, or smaller than the diameter of a crystal part.

Furthermore, in a nanobeam electron diffraction pattern of the nc-OS film, circumferentially distributed spots can be observed. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void can be observed. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is scarcely observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Note that an oxide semiconductor film may be a stacked film including two or more films of an amorphous oxide semiconductor film, an a-like OS film, a microcrystalline oxide semiconductor film, and a CAAC-OS film, for example.

The structure described in this embodiment can be used as appropriate in combination with any of the structures described in the other embodiments and the example.

(Embodiment 6)

In this embodiment, a CPU that includes the memory device described in the above embodiment is described.

Figure 42:
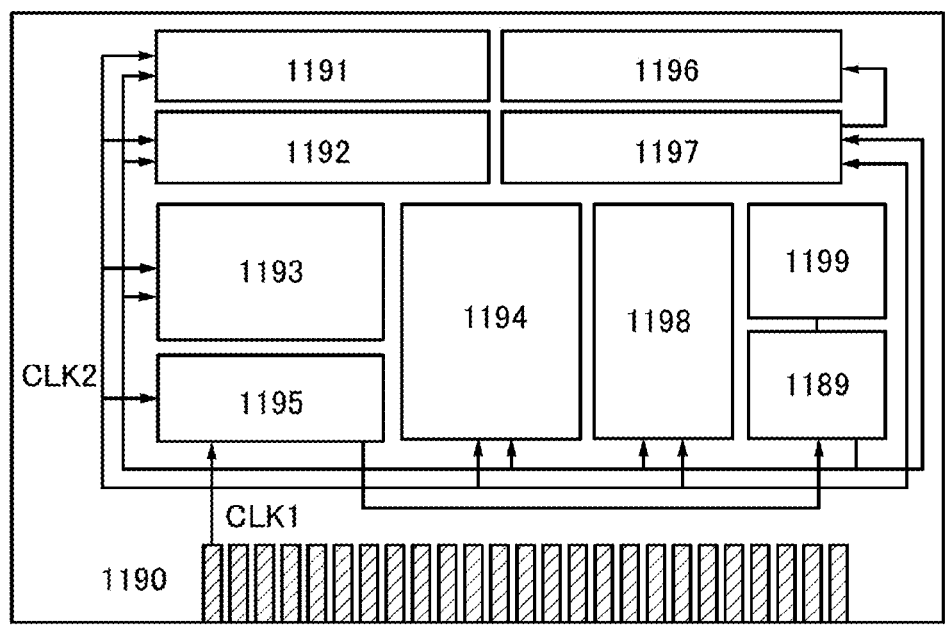
FIG. 42 illustrates a configuration example of a CPU.

FIG. 42 is a block diagram illustrating a configuration example of a CPU at least partly including any of the transistors described in the above embodiments as a component.

The CPU illustrated in FIG. 42 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 42 is just an example in which the configuration is simplified, and an actual CPU may have a variety of configurations depending on the application. For example, the CPU may have the following configuration: a structure including the CPU illustrated in FIG. 42 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 42, a memory cell is provided in the register 1196. For the memory cell of the register 1196, any of the transistors described in the above embodiments can be used.

In the CPU illustrated in FIG. 42, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 43:
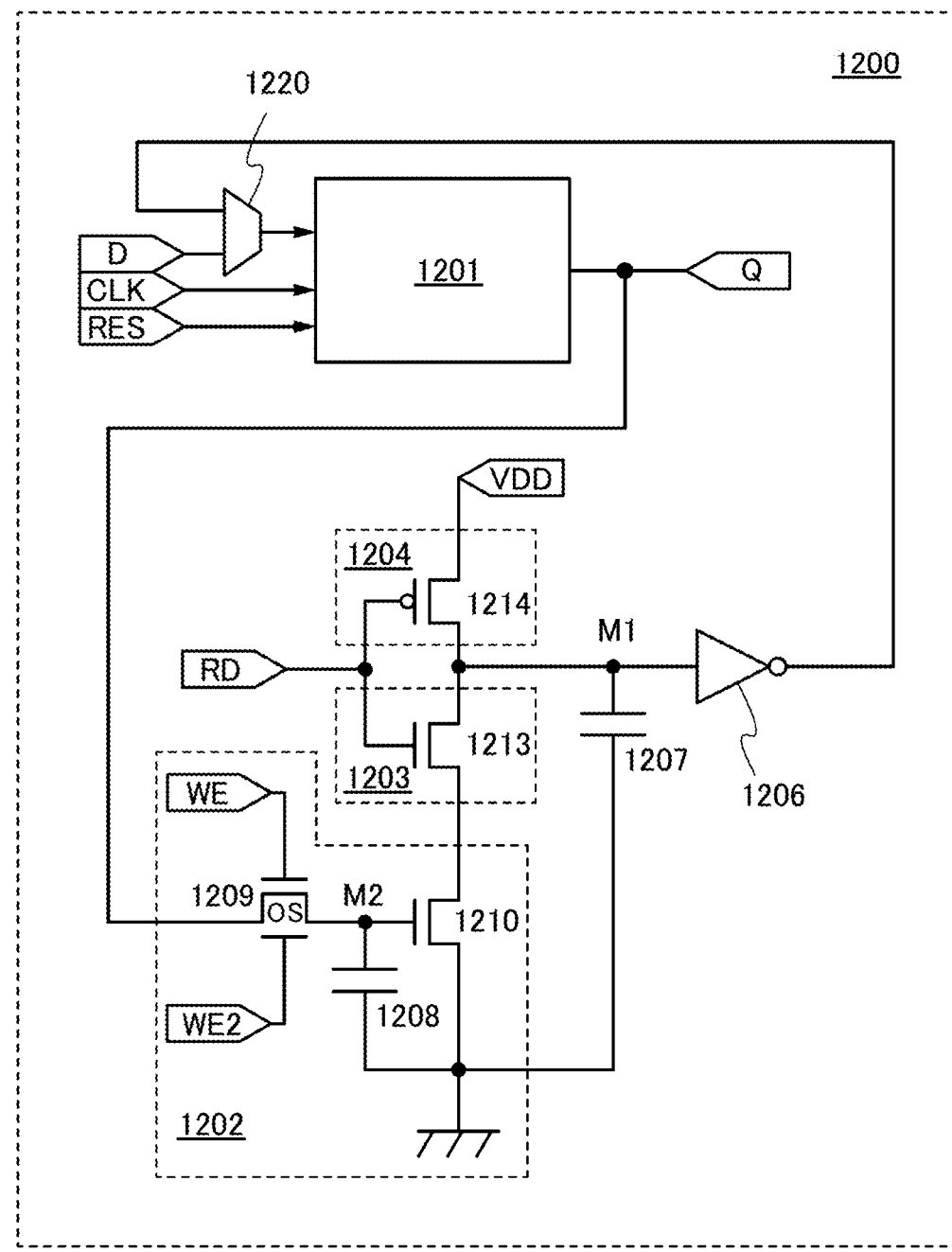
FIG. 43 is a circuit diagram of a memory element.

FIG. 43 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a first gate of the transistor 1209. For example, the first gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

Note that the transistor 1209 in FIG. 43 has a structure with a second gate (second gate electrode: back gate). The control signal WE can be input to the first gate and the control signal WE2 can be input to the second gate. The control signal WE2 is a signal having a constant potential. As the constant potential, for example, a ground potential GND or a potential lower than a source potential of the transistor 1209 is selected. The control signal WE2 is a potential signal for controlling the threshold voltage of the transistor 1209, and a current when a gate voltage of the transistor 1209 is 0 V can be further reduced. The control signal WE2 may be a signal having the same potential as that of the control signal WE. Note that as the transistor 1209, a transistor without a second gate may be used.

A signal corresponding to data held in the circuit 1201 is input to the other of the source and the drain of the transistor 1209. FIG. 43 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 43, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is held, the signal output from the second terminal of the switch 1203 (the other of the source and the drain of the transistor 1213) can be input to the node.

In FIG. 43, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer formed using a semiconductor other than an oxide semiconductor or in the substrate 1190 can be used for the rest of the transistors.

As the circuit 1201 in FIG. 43, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can hold data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is held for a long time also in a period during which the power supply voltage is not supplied to the memory element 1200. The memory element 1200 can accordingly hold the stored content (data) also in a period during which the supply of the power supply voltage is stopped.

Since the above-described memory element performs pre-charge operation with the switch 1203 and the switch 1204, the time required for the circuit 1201 to hold original data again after the supply of the power supply voltage is restarted can be shortened.

In the circuit 1202, a signal held by the capacitor 1208 is input to the gate of the transistor 1210. Therefore, after supply of the power supply voltage to the memory element 1200 is restarted, the signal held by the capacitor 1208 can be converted into the one corresponding to the state (the on state or the off state) of the transistor 1210 to be read from the circuit 1202. Consequently, an original signal can be accurately read even when a potential corresponding to the signal held by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

The structure described in this embodiment can be used as appropriate in combination with any of the structures described in the other embodiments and the example.

(Embodiment 7)

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 44A to 44F illustrate specific examples of these electronic devices.

Figure 44A:
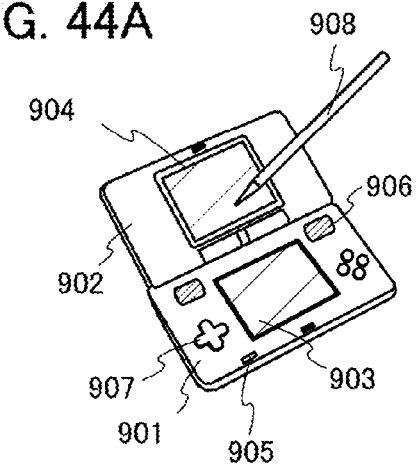
FIGS. 44A to 44F each illustrate an electronic device.

FIG. 44A illustrates a portable game console including a housing 901, a housing 902, a display portion 903, a display portion 904, a microphone 905, a speaker 906, an operation key 907, a stylus 908, and the like. Although the portable game machine in FIG. 44A has the two display portions 903 and 904, the number of display portions included in a portable game machine is not limited to this.

Figure 44B:
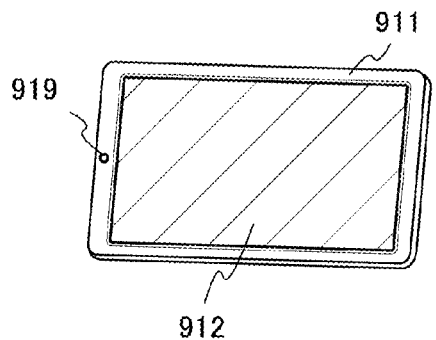

FIG. 44B illustrates a portable data terminal, which includes a first housing 911, a display portion 912, a camera 919, and the like. A touch panel function of the display portion 912 enables input of information.

Figure 44C:
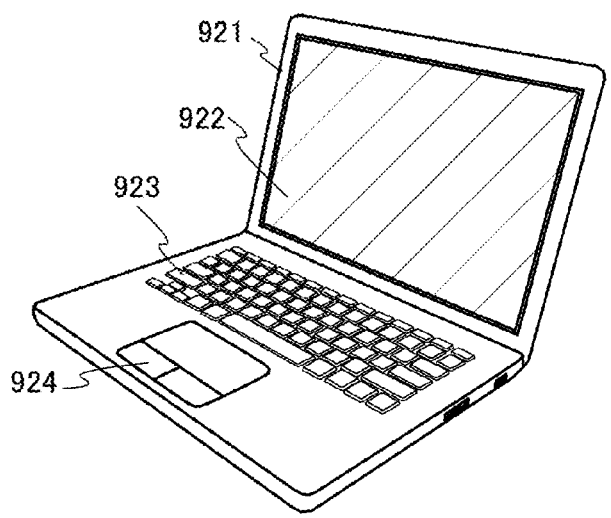

FIG. 44C illustrates a laptop personal computer, which includes a housing 921, a display portion 922, a keyboard 923, a pointing device 924, and the like.

Figure 44D:
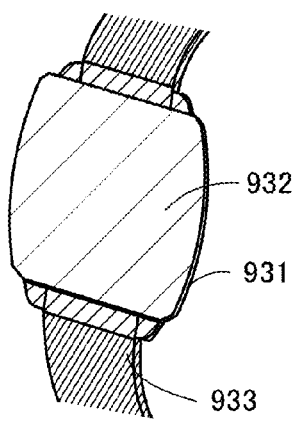

FIG. 44D illustrates a wrist-watch-type information terminal, which includes a housing 931, a display portion 932, a wristband 933, and the like. The display portion 932 may be a touch panel.

Figure 44E:
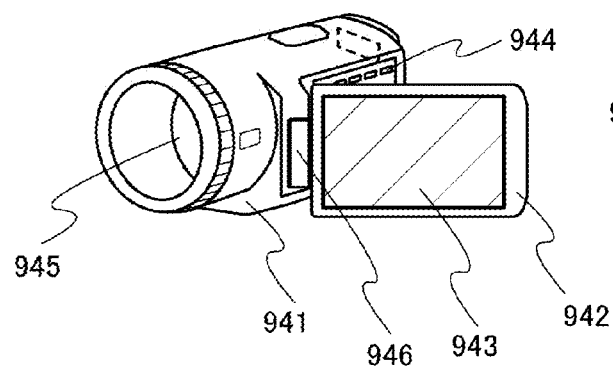

FIG. 44E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 44F:
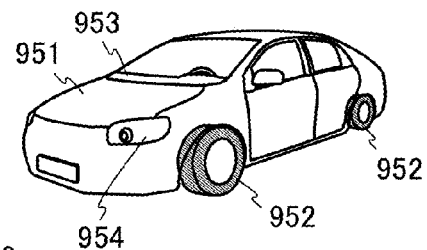

FIG. 44F illustrates an automobile including a car body 951, wheels 952, a dashboard 953, lights 954, and the like.

The structure described in this embodiment can be used as appropriate in combination with any of the structures described in the other embodiments and the example.

EXAMPLE

In this example, fabrication of a sample including an opening for forming the contact plug 63b in FIG. 5A which is described in Embodiment 1 is described.

Figure 8A:
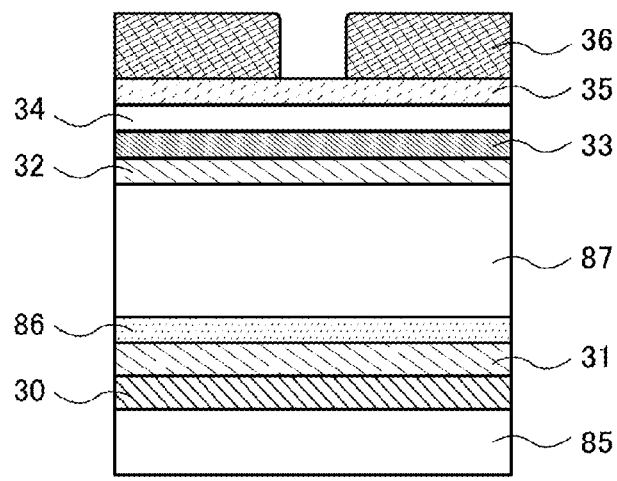
FIGS. 8A to 8C are cross-sectional views illustrating a method for forming a contact plug.
Figure 8B:
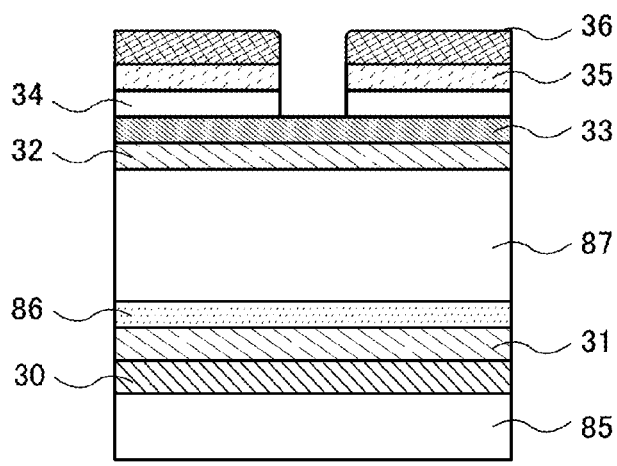
Figure 8C:
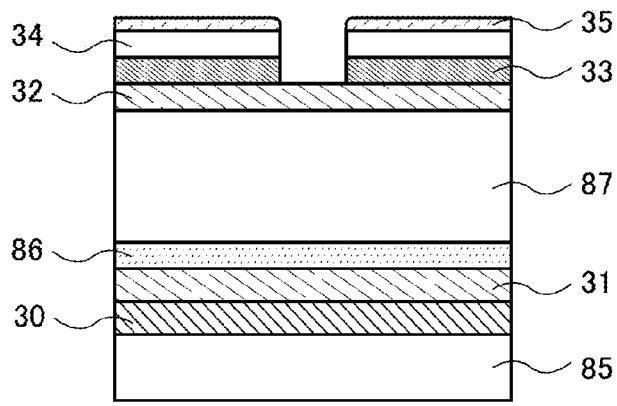
Figure 9A:
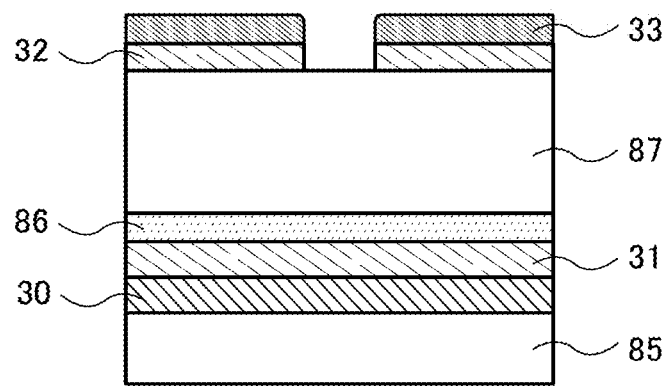
FIGS. 9A to 9C are cross-sectional views illustrating a method for forming a contact plug.
Figure 9B:
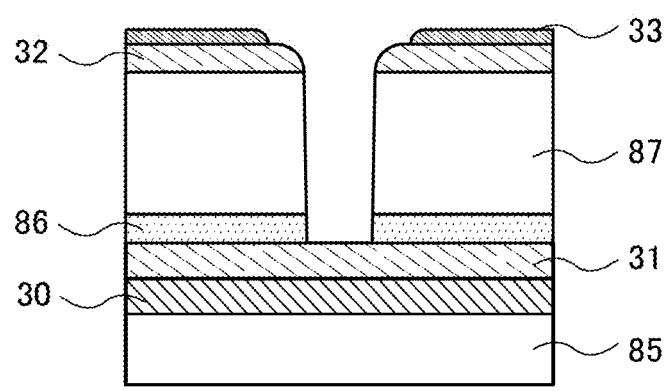
Figure 9C:
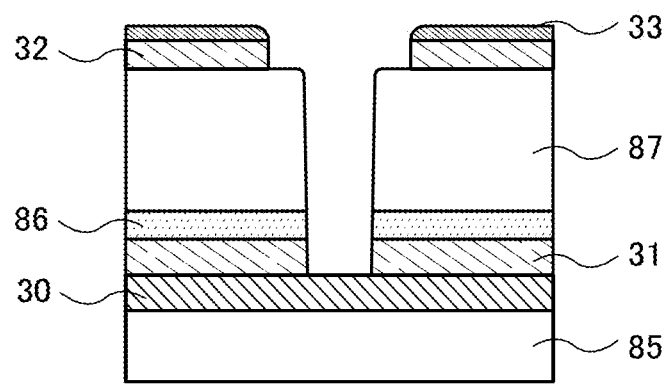
Figure 10A:
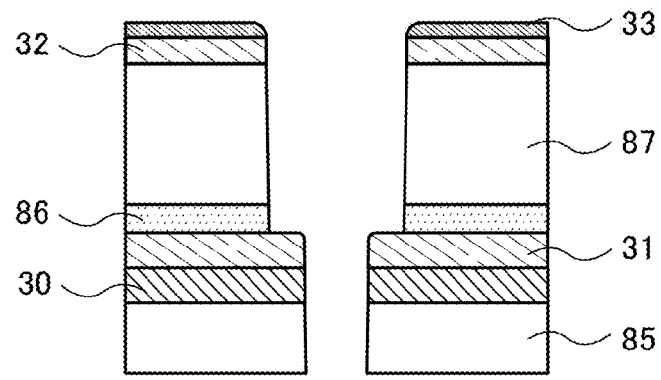
FIGS. 10A to 10C are cross-sectional views illustrating a method for forming a contact plug.
Figure 10B:
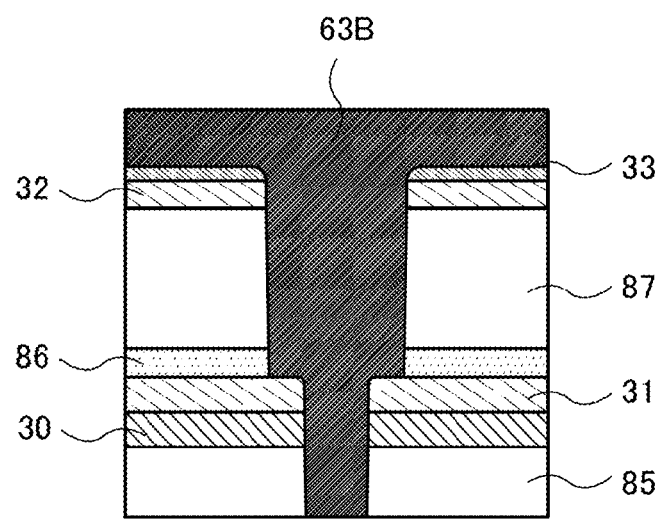
Figure 10C:
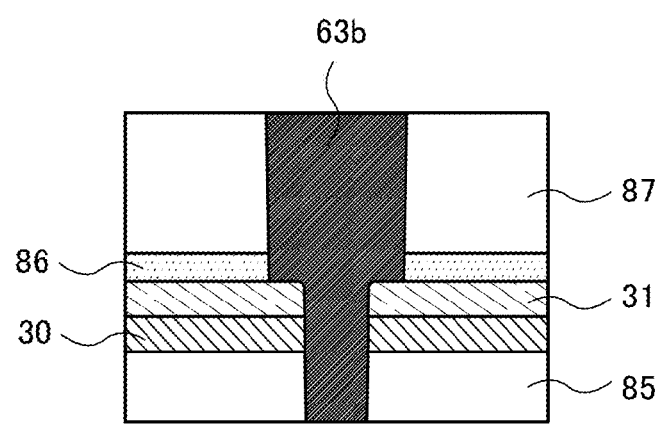

First, under fabrication conditions in Table 1, the stack illustrated in FIG. 8A was formed over a silicon substrate. Note that the reference numbers used in FIGS. 8A to 10C are used in the following description.

TABLE 1

| Name and reference numeral in FIG. 8A | Film | Formation method | Thickness [nm] |
|---|---|---|---|
| Resist mask 36 | EB photoresist | coating method | 100 |
| Organic film 35 | photoresist adherence agent | coating method | 20 |
| Insulating layer 34 | silicon nitride film | plasma CVD method | 100 |
| Metal layer 33 | titanium film | DC sputtering method | 60 |
| Metal layer 32 | tungsten film | DC sputtering method | 30 |
| Insulating layer 87 | silicon oxynitride film | plasma CVD method | 230 |
| Insulating layer 86 | aluminum oxide film | RF sputtering method | 20 |
| Electrode layer 31 | tungsten film | DC sputtering method | 20 |
| Oxide semiconductor layer 30 | In—Ga—Zn oxide film | DC sputtering method | 35 |
| Insulating layer 85 | silicon oxynitride film | plasma CVD method | 100 |

Note that an opening was formed in the resist mask 36 by a photolithography process.

Next, with a capacitively-coupled plasma (CCP) etching apparatus, an etching step was performed using the resist mask 36 as a mask, so that an opening was formed in the organic film 35 and the insulating layer 34.

The etching conditions for the organic film 35 were as follows: the distance between electrodes was 40 mm; the substrate temperature was 20° C.; the RF power (upper electrode) was 1.62 W/cm$^2$ (60 MHz); the RF power (lower electrode) was 0.32 W/cm$^2$ (2.0 MHz); the pressure was 6.5 Pa; and the etching gas was $CF_4$=100%.

The etching conditions for the insulating layer 34 were as follows: the distance between electrodes was 40 mm; the substrate temperature was 20° C.; the RF power (upper electrode) was 0.81 W/cm$^2$ (60 MHz); the RF power (lower electrode) was 5.73 W/cm$^2$ (2.0 MHz); the pressure was 2.6 Pa; and the etching gas flow ratio was $Ar:CF_4:CHF_3$=10:1:3.

Next, with an inductively-coupled plasma (ICP) etching apparatus, an etching step was performed using the resist mask 36, the organic film 35, and the insulating layer 34 as a mask, so that an opening was formed in the metal layer 33.

The etching conditions for the metal layer 33 were as follows: the distance between electrodes was 122 mm; the substrate temperature was 70° C.; the ICP power was 0.47 W/cm$^2$ (13.56 MHz); the bias power was 0.29 W/cm$^2$ (13.56 MHz); the pressure was 1.9 Pa; and the etching gas was $BCl_3$=100%.

Next, with a CCP etching apparatus, an etching step was performed using the organic film 35 and the insulating layer 34 as a mask, so that an opening was formed in the metal layer 32.

The etching conditions for the metal layer 32 were as follows: the distance between electrodes was 115 mm; the substrate temperature was 50° C.; the RF power (upper electrode) was 1.62 W/cm$^2$ (60 MHz); the RF power (lower electrode) was 0.32 W/cm$^2$ (13.56 MHz); the pressure was 0.6 Pa; and the etching gas flow ratio was $CF_4:O_2:Cl_2$=2:2:1.

Next, with a CCP etching apparatus, an etching step was performed using the metal layers 33 and 32 as a mask, so that an opening was formed in the insulating layers 87 and 86.

The etching conditions for the insulating layer 87 were as follows: the distance between electrodes was 25 mm; the substrate temperature was 20° C.; the RF power (upper electrode) was 2.92 W/cm$^2$ (60 MHz); the RF power (lower electrode) was 6.37 W/cm$^2$ (2.0 MHz); the pressure was 3.3 Pa; and the etching gas flow ratio was $Ar:O_2:C_4F_6$=400:15:11.

The etching conditions for the insulating layer 86 were as follows: the distance between electrodes was 25 mm; the substrate temperature was 20° C.; the RF power (upper electrode) was 0.49 W/cm$^2$ (60 MHz); the RF power (lower electrode) was 2.86 W/cm$^2$ (2.0 MHz); the pressure was 3.3 Pa; and the etching gas flow ratio was $Ar:CHF_3$=9:4.

Next, with a CCP etching apparatus, an etching step was performed using the metal layers 33 and 32 as a mask, so that an opening was formed in the electrode layer 31 and part of an upper surface of the insulating layer 87 was exposed.

The etching conditions for the electrode layer 31 were as follows: the distance between electrodes was 115 mm; the substrate temperature was 50° C.; the RF power (upper electrode) was 1.62 W/cm$^2$ (60 MHz); the RF power (lower electrode) was 0.32 W/cm$^2$ (13.56 MHz); the pressure was 0.6 Pa; and the etching gas flow ratio was $CF_4:O_2:Cl_2$=2:2:1.

Next, with a CCP etching apparatus, an etching step was performed using the metal layers 33 and 32 and the electrode layer 31 as a mask, so that the diameter of the opening in the insulating layers 87 and 86 was increased and an opening was formed in the oxide semiconductor layer 30 and the insulating layer 85.

The etching conditions for the insulating layers 87, 86, and 85 and the oxide semiconductor layer 30 were as follows: the distance between electrodes was 25 mm; the substrate temperature was 20° C.; the RF power (upper electrode) was 0.49 W/cm$^2$ (60 MHz); the RF power (lower electrode) was 2.86 W/cm$^2$ (2.0 MHz); the pressure was 3.3 Pa; and the etching gas flow ratio was $Ar:CHF_3$=9:4.

Through the above steps, the sample was fabricated.

Figure 46:
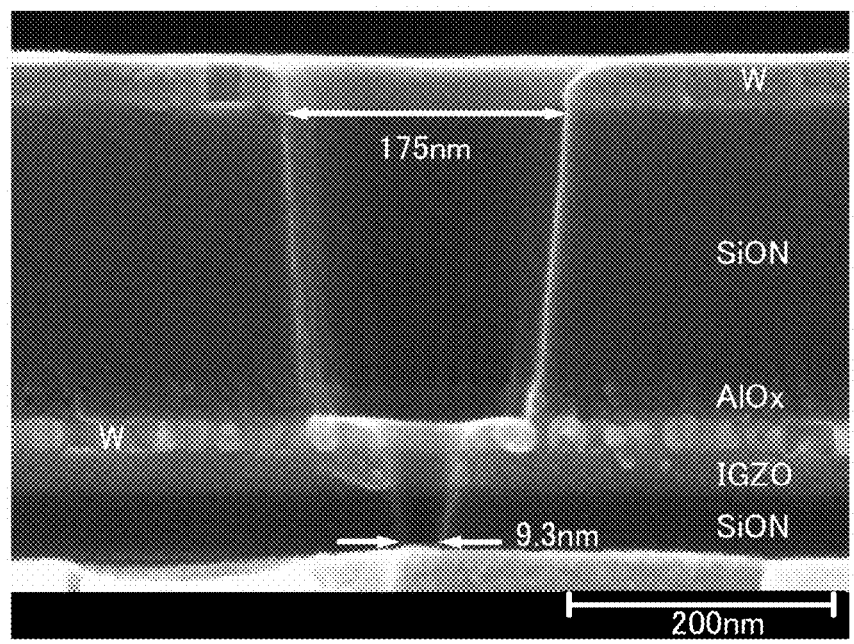
FIG. 46 is a cross-sectional SEM image of an opening for forming a contact plug.

FIG. 46 is a cross-sectional SEM image of an opening in the sample fabricated in the above manner (corresponding to the cross-sectional view in FIG. 5A). The diameter of the opening at an upper end of the insulating layer 87 was 175 nm, and the diameter of the opening at a lower end of the insulating layer 85 was 9.3 nm.

It has been confirmed that as illustrated in FIG. 5A, the diameter of the opening in the insulating layers 86 and 87 over the electrode layer 31 is relatively large and the diameter of the opening in the electrode layer 31 and in a region under the electrode layer 31 is relatively small. Thus, it can be said that in the case where the opening is filled with a conductor to form a contact plug, the contact area between the electrode layer 31 and the contact plug is increased, whereby the contact resistance can be reduced.

The structure described in this example can be used as appropriate in combination with any of the structures described in the other embodiments.

This application is based on Japanese Patent Application serial no. 2014-125329 filed with Japan Patent Office on Jun. 18, 2014, the entire contents of which are hereby incorporated by reference.

What is claimed is:
1. A method for manufacturing a semiconductor device, comprising the steps of:

forming a first conductive layer;
forming a first insulating layer over the first conductive layer;
forming a second conductive layer over the first insulating layer using the same material as the first conductive layer;
forming a third conductive layer over the second conductive layer;
forming a second insulating layer over the third conductive layer;
forming a resist mask over the second insulating layer;
forming a first opening by etching the second insulating layer using the resist mask as a mask;
forming a second opening by processing the first opening and etching the third conductive layer using the second insulating layer as a mask;
forming a third opening by processing the second opening and etching the second conductive layer using the third conductive layer as a mask;
forming a fourth opening by processing the third opening and etching the first insulating layer using the third conductive layer and the second conductive layer as a mask;
forming a fifth opening by processing the fourth opening and etching the first conductive layer using the third conductive layer and the second conductive layer as a mask;
forming a sixth opening by processing the fifth opening and etching the first insulating layer using the third conductive layer, the second conductive layer, and the first conductive layer as a mask; and
forming a contact plug in the sixth opening.

2. The method for manufacturing a semiconductor device according to claim 1, wherein each of the first conductive layer and the second conductive layer comprises tungsten.

3. The method for manufacturing a semiconductor device according to claim 1, wherein the third conductive layer comprises titanium or titanium nitride.

4. The method for manufacturing a semiconductor device according to claim 1, further comprising the step of forming an organic film over the second insulating layer before forming the resist mask.

5. The method for manufacturing a semiconductor device according to claim 1, wherein the resist mask is removed by the step of forming the second opening.

6. The method for manufacturing a semiconductor device according to claim 1, wherein a top surface of the second conductive layer is partly exposed by the step of forming the fourth opening.

7. The method for manufacturing a semiconductor device according to claim 1, wherein a diameter of the fifth opening in the second conductive layer is larger than a diameter of the fifth opening in the first insulating layer.

8. The method for manufacturing a semiconductor device according to claim 1, wherein a top surface of the first conductive layer is exposed by the step of forming the sixth opening.

9. The method for manufacturing a semiconductor device according to claim 1, wherein the contact plug is electrically connected to top and side surfaces of the first conductive layer.

10. A method for manufacturing a semiconductor device, comprising the steps of:
forming an oxide semiconductor layer;
forming a first conductive layer over the oxide semiconductor layer;
forming a first insulating layer over the first conductive layer;
forming a second conductive layer over the first insulating layer using the same material as the first conductive layer;
forming a third conductive layer over the second conductive layer;
forming a second insulating layer over the third conductive layer;
forming a resist mask over the second insulating layer;
forming a first opening by etching the second insulating layer using the resist mask as a mask;
forming a second opening by processing the first opening and etching the third conductive layer using the second insulating layer as a mask;
forming a third opening by processing the second opening and etching the second conductive layer using the third conductive layer as a mask;
forming a fourth opening by processing the third opening and etching the first insulating layer using the third conductive layer and the second conductive layer as a mask;
forming a fifth opening by processing the fourth opening and etching the first conductive layer using the third conductive layer and the second conductive layer as a mask;
forming a sixth opening by processing the fifth opening and etching the oxide semiconductor layer and the first insulating layer using the third conductive layer, the second conductive layer, and the first conductive layer as a mask; and
forming a contact plug in the sixth opening.

11. The method for manufacturing a semiconductor device according to claim 10, wherein the oxide semiconductor layer is formed with a material containing In, Zn, and M (M is Al, Ti, Sn, Ga, Y, Zr, La, Ce, Nd, or Hf).

12. The method for manufacturing a semiconductor device according to claim 10, wherein each of the first conductive layer and the second conductive layer comprises tungsten.

13. The method for manufacturing a semiconductor device according to claim 10, wherein the third conductive layer comprises titanium or titanium nitride.

14. The method for manufacturing a semiconductor device according to claim 10, further comprising the step of forming an organic film over the second insulating layer before forming the resist mask.

15. The method for manufacturing a semiconductor device according to claim 10, wherein the resist mask is removed by the step of forming the second opening.

16. The method for manufacturing a semiconductor device according to claim 10, wherein a top surface of the second conductive layer is partly exposed by the step of forming the fourth opening.

17. The method for manufacturing a semiconductor device according to claim 10, wherein a diameter of the fifth opening in the second conductive layer is larger than a diameter of the fifth opening in the first insulating layer.

18. The method for manufacturing a semiconductor device according to claim 10, wherein a top surface of the first conductive layer is exposed by the step of forming the sixth opening.

19. The method for manufacturing a semiconductor device according to claim 10, wherein the contact plug is electrically connected to upper and side surfaces of the first conductive layer.

20. A method for manufacturing a semiconductor device, comprising the steps of:
   forming a first conductive layer over a first insulating layer;
   forming a second insulating layer over the first conductive layer;
   forming a second conductive layer over the second insulating layer;
   forming a third conductive layer over the second conductive layer;
   forming a first opening in the third conductive layer and the second conductive layer;
   forming a second opening in the third conductive layer, the second conductive layer, and the second insulating layer by processing the first opening;
   forming a third opening in the third conductive layer, the second conductive layer, the second insulating layer, and the first conductive layer by processing the second opening;
   forming a fourth opening in the third conductive layer, the second conductive layer, the second insulating layer, the first conductive layer, and the first insulating layer by processing the third opening; and
   forming a contact plug in the fourth opening.

21. The method for manufacturing a semiconductor device according to claim 20, wherein the second conductive layer is formed of the same material as the first conductive layer.

22. The method for manufacturing a semiconductor device according to claim 20, wherein each of the first conductive layer and the second conductive layer comprises tungsten.

23. The method for manufacturing a semiconductor device according to claim 20, wherein the third conductive layer comprises titanium or titanium nitride.

24. The method for manufacturing a semiconductor device according to claim 20, wherein the step of forming the second opening is performed by etching the second insulating layer using the third conductive layer and the second conductive layer as a mask.

25. The method for manufacturing a semiconductor device according to claim 20, wherein the step of forming the third opening is performed by etching the first conductive layer using the third conductive layer and the second conductive layer as a mask.

26. The method for manufacturing a semiconductor device according to claim 20, wherein the step of forming the fourth opening is performed by etching the first insulating layer and the second insulating layer using the third conductive layer, the second conductive layer, and the first conductive layer as a mask.

27. The method for manufacturing a semiconductor device according to claim 20, wherein the contact plug is electrically connected to top and side surfaces of the first conductive layer.

* * * * *